United States Patent
Iwai et al.

(10) Patent No.: US 8,902,657 B2
(45) Date of Patent: Dec. 2, 2014

(54) SEMICONDUCTOR MEMORY DEVICE AND CONTROLLER

(71) Applicant: Kabushiki Kaisha Toshiba, Tokyo (JP)

(72) Inventors: Hitoshi Iwai, Kamakura (JP); Shirou Fujita, Kamakura (JP); Hiroshi Sukegawa, Tokyo (JP); Toshio Fujisawa, Yokohama (JP); Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/837,814

(22) Filed: Mar. 15, 2013

(65) Prior Publication Data

US 2014/0071756 A1    Mar. 13, 2014

(30) Foreign Application Priority Data

Sep. 7, 2012  (JP) ................................. 2012-197673
Feb. 28, 2013 (JP) ................................. 2013-039874

(51) Int. Cl.
| | | |
|---|---|---|
| *G11C 16/04* | (2006.01) | |
| *G11C 16/10* | (2006.01) | |
| *H01L 27/115* | (2006.01) | |
| *G11C 16/08* | (2006.01) | |
| *G11C 29/00* | (2006.01) | |

(52) U.S. Cl.
CPC .......... *G11C 16/10* (2013.01); *H01L 27/11582* (2013.01); *G11C 16/08* (2013.01); *G11C 29/82* (2013.01); *H01L 27/1157* (2013.01); *G11C 16/0483* (2013.01)

USPC ................ 365/185.11; 365/200; 365/201

(58) Field of Classification Search
CPC .......... G11C 16/04; G11C 2029/5004; G11C 29/006; G11C 29/028; G11C 29/12; G11C 29/50; G11C 7/1006; G11C 16/28; G11C 29/702; G11C 7/1042; G11C 2029/1204; H01L 27/11; G06F 3/0689
USPC ................. 365/185.11, 200, 201, 230.03
See application file for complete search history.

(56) References Cited

U.S. PATENT DOCUMENTS

| | | | |
|---|---|---|---|
| 5,659,550 A * | 8/1997 | Mehrotra et al. | 714/721 |
| 6,262,926 B1 * | 7/2001 | Nakai | 365/200 |
| 7,936,004 B2 | 5/2011 | Kito et al. | |
| 2004/0042331 A1 * | 3/2004 | Ikehashi et al. | 365/232 |
| 2007/0147121 A1 | 6/2007 | Futatsuyama | |
| 2007/0147144 A1 * | 6/2007 | Tokiwa | 365/200 |
| 2010/0085820 A1 | 4/2010 | Nagashima | |
| 2010/0097858 A1 | 4/2010 | Tokiwa et al. | |
| 2011/0113187 A1 * | 5/2011 | Kashiwagi | 711/103 |

* cited by examiner

*Primary Examiner* — David Lam
(74) *Attorney, Agent, or Firm* — Holtz, Holtz, Goodman & Chick PC

(57) ABSTRACT

According to one embodiment, a semiconductor memory device includes a plurality of blocks. The blocks includes a first selection transistor, a second selection transistor, a plurality of memory cell transistors, a first selection gate line and a second selection gate line, and word lines. One of the blocks holds information on a word line, a first selection gate line and/or a second selection gate line including a short-circuiting defect.

20 Claims, 54 Drawing Sheets

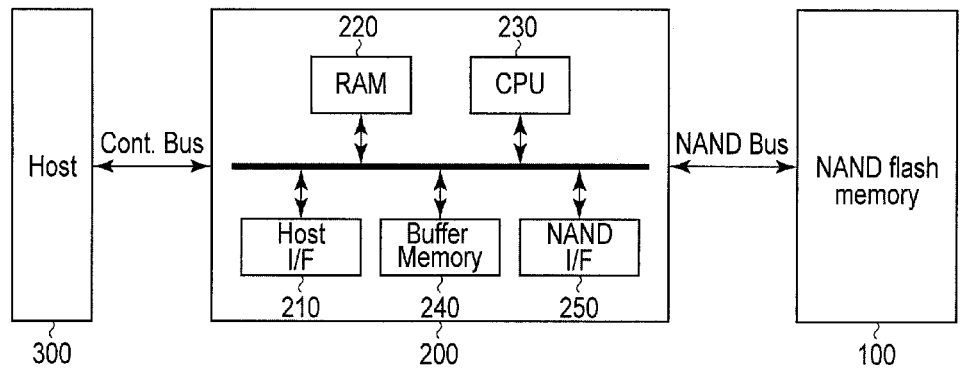
F I G. 1
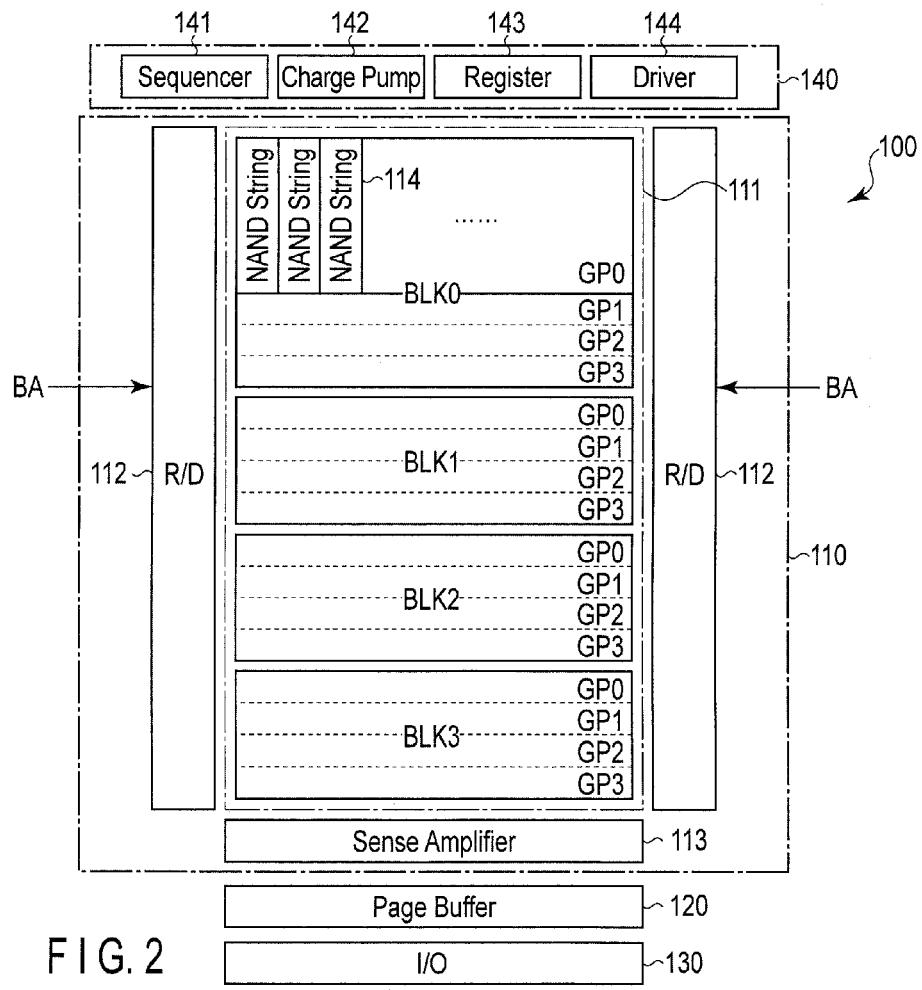
F I G. 2

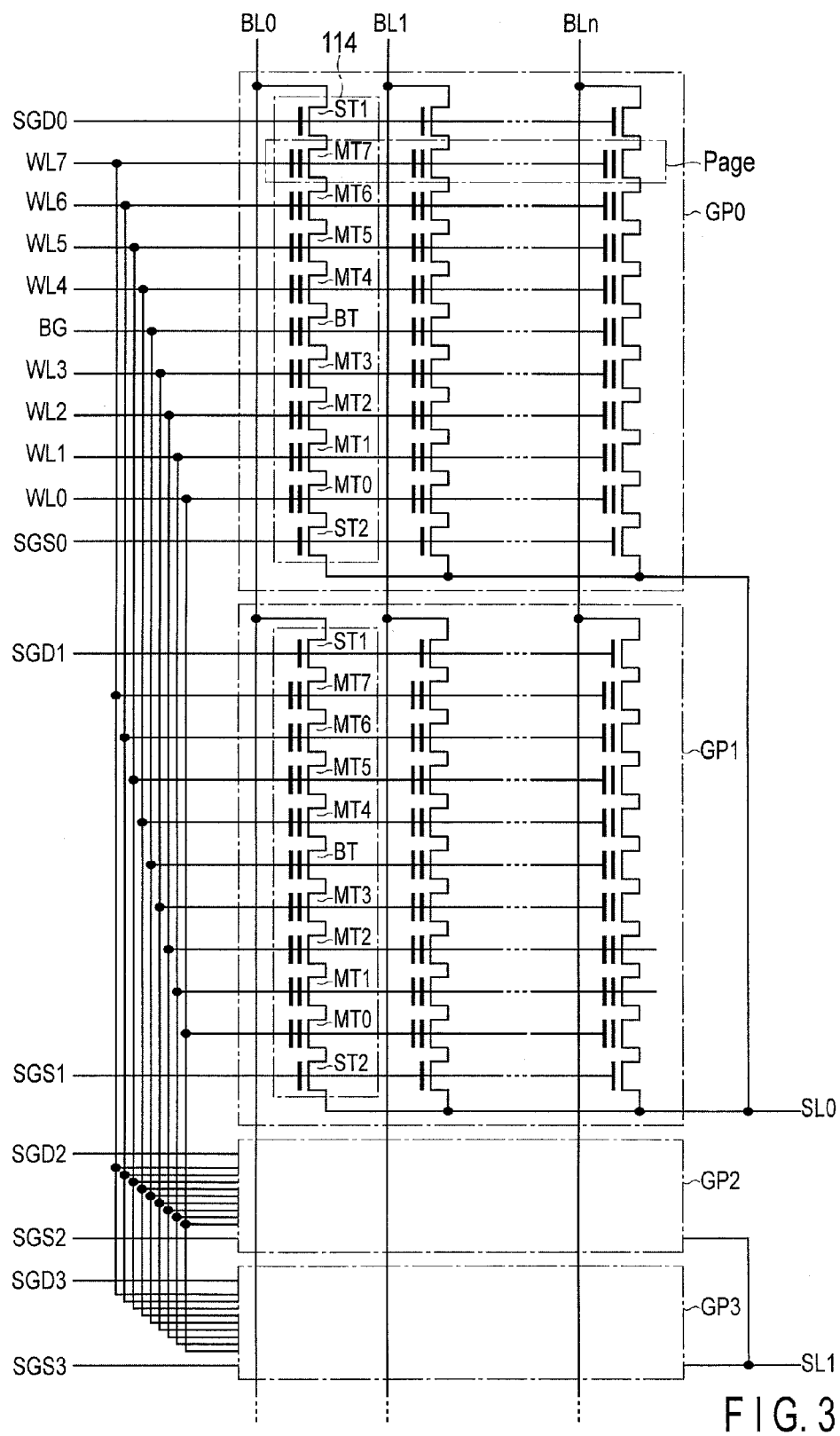
F I G. 3

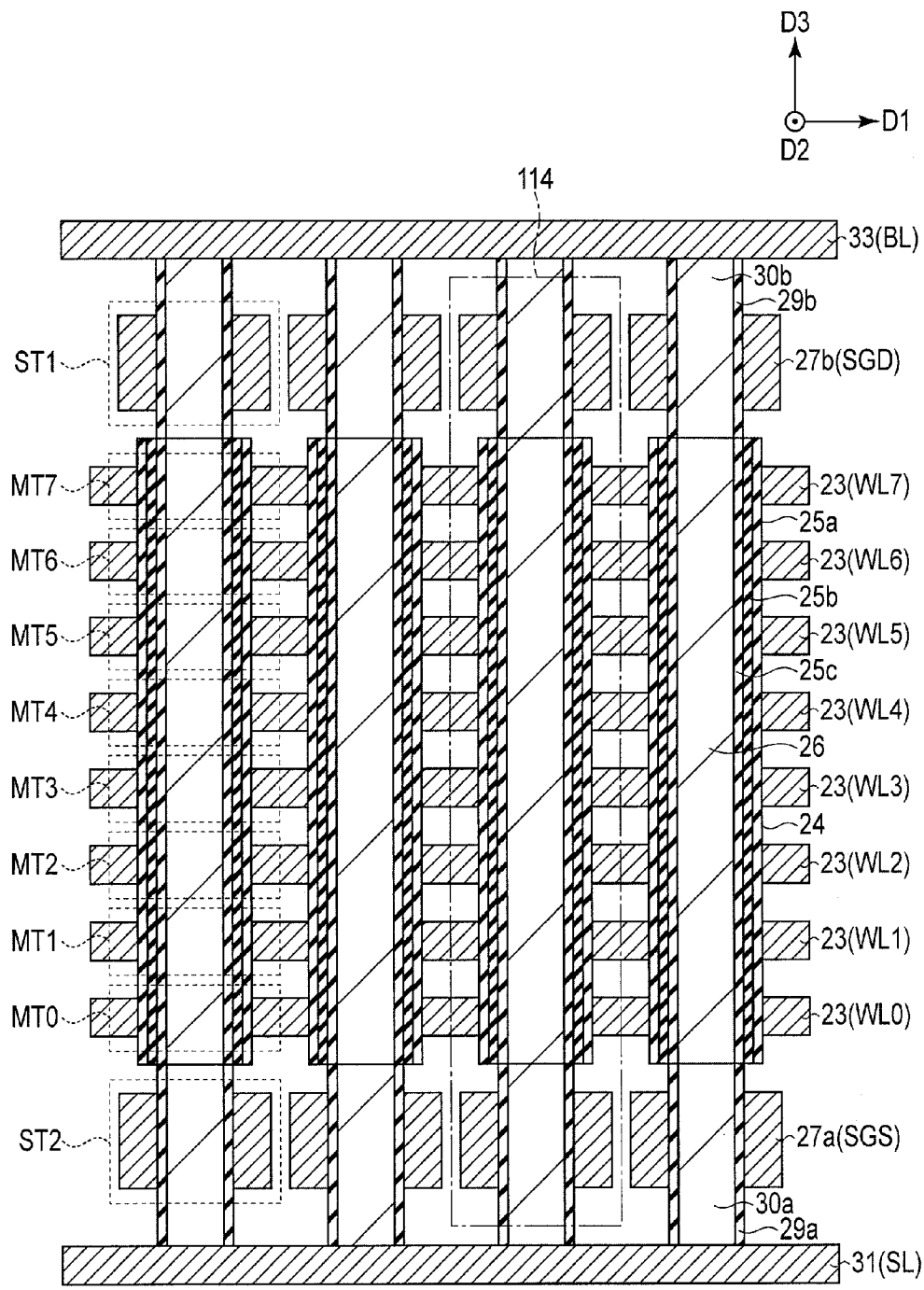
F I G. 6

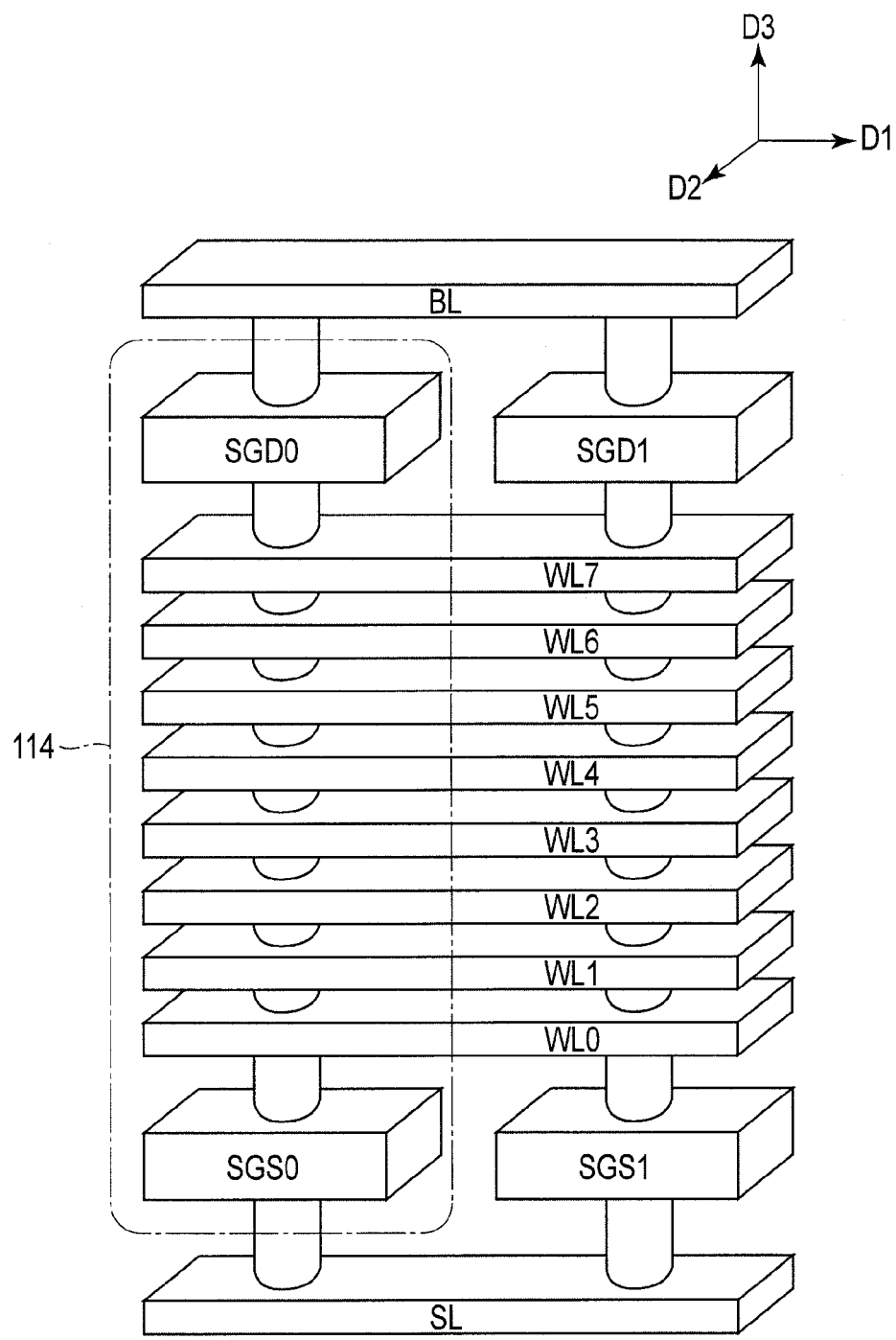
F I G. 7

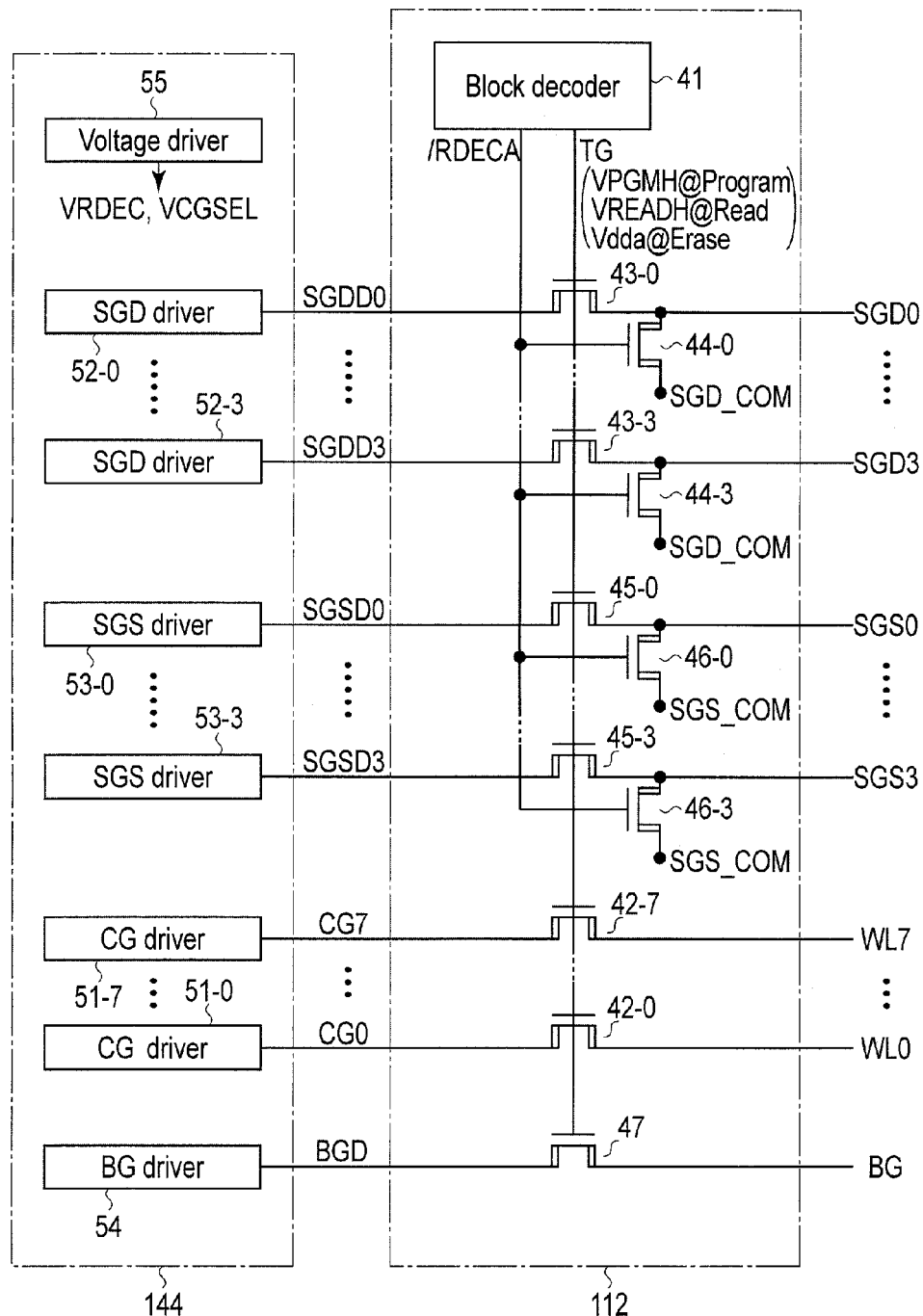
F I G. 8

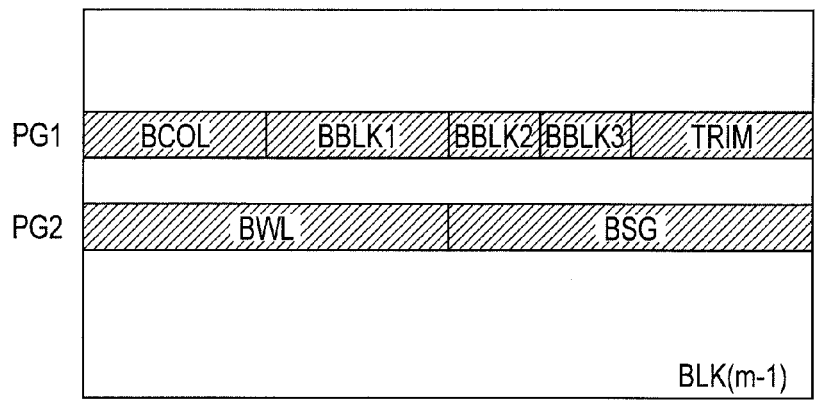
FIG. 11
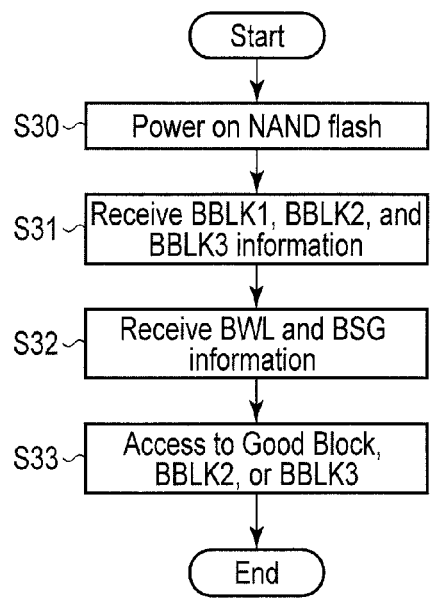
FIG. 12
| Command (composite command) | Access to limited block | Access to bad WL |
|---|---|---|
| Read_(x) | NG | NG |
| Read_LBLKm(x) | OK | NG |
| Program_(x) | NG | NG |
| Program_LBLKm(x) | OK | NG |
FIG. 13

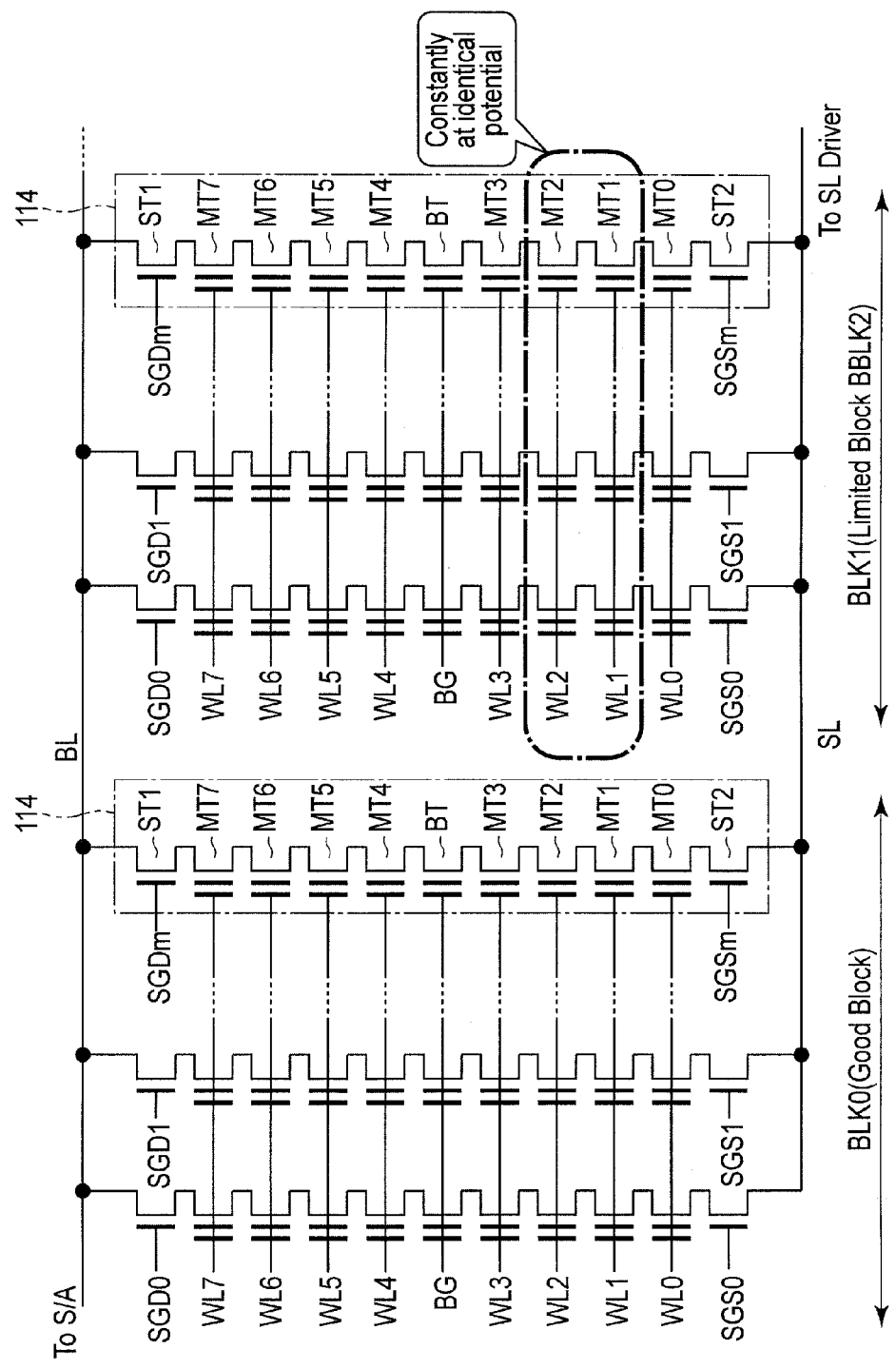
F I G. 16

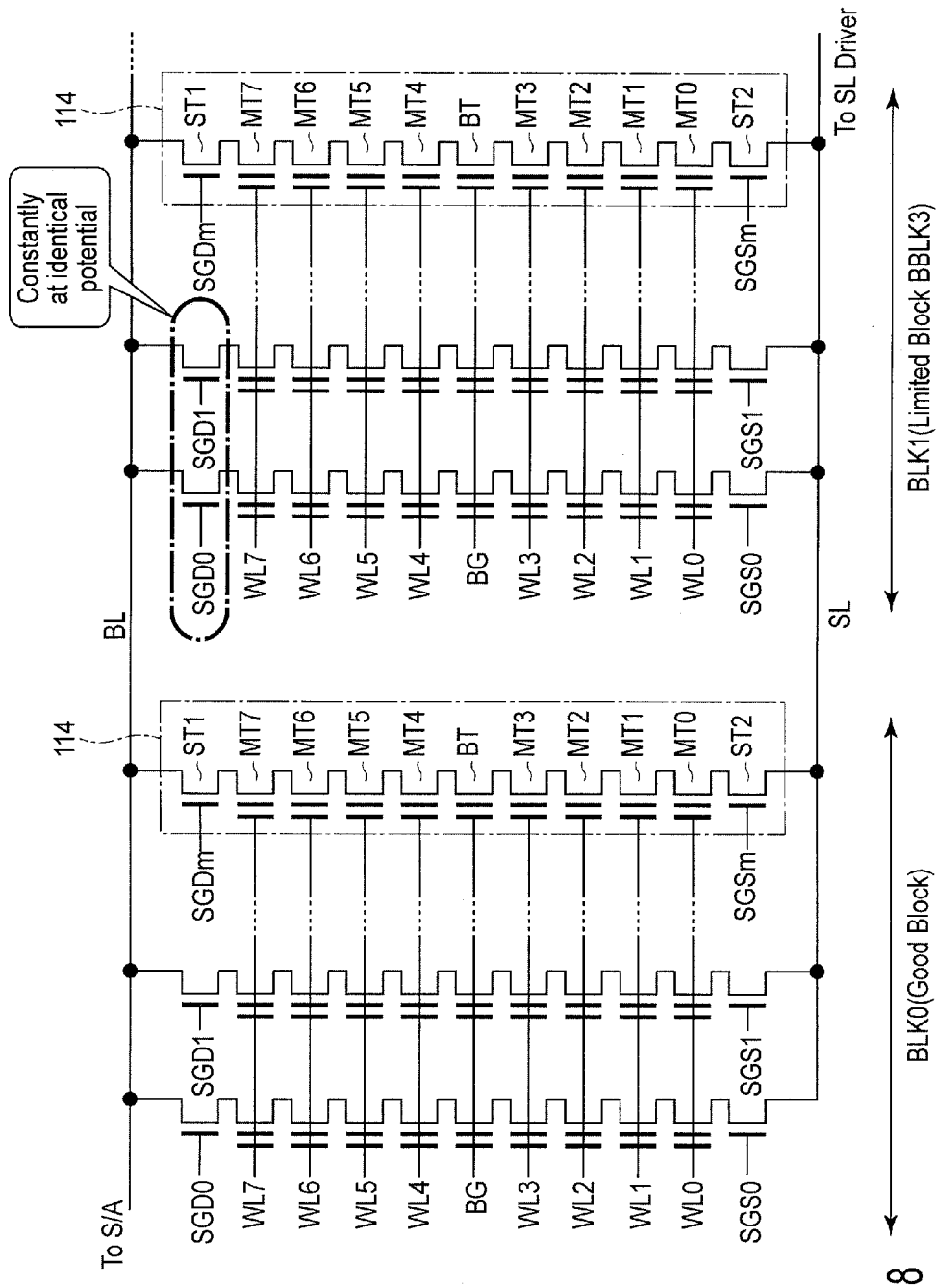
F I G. 18

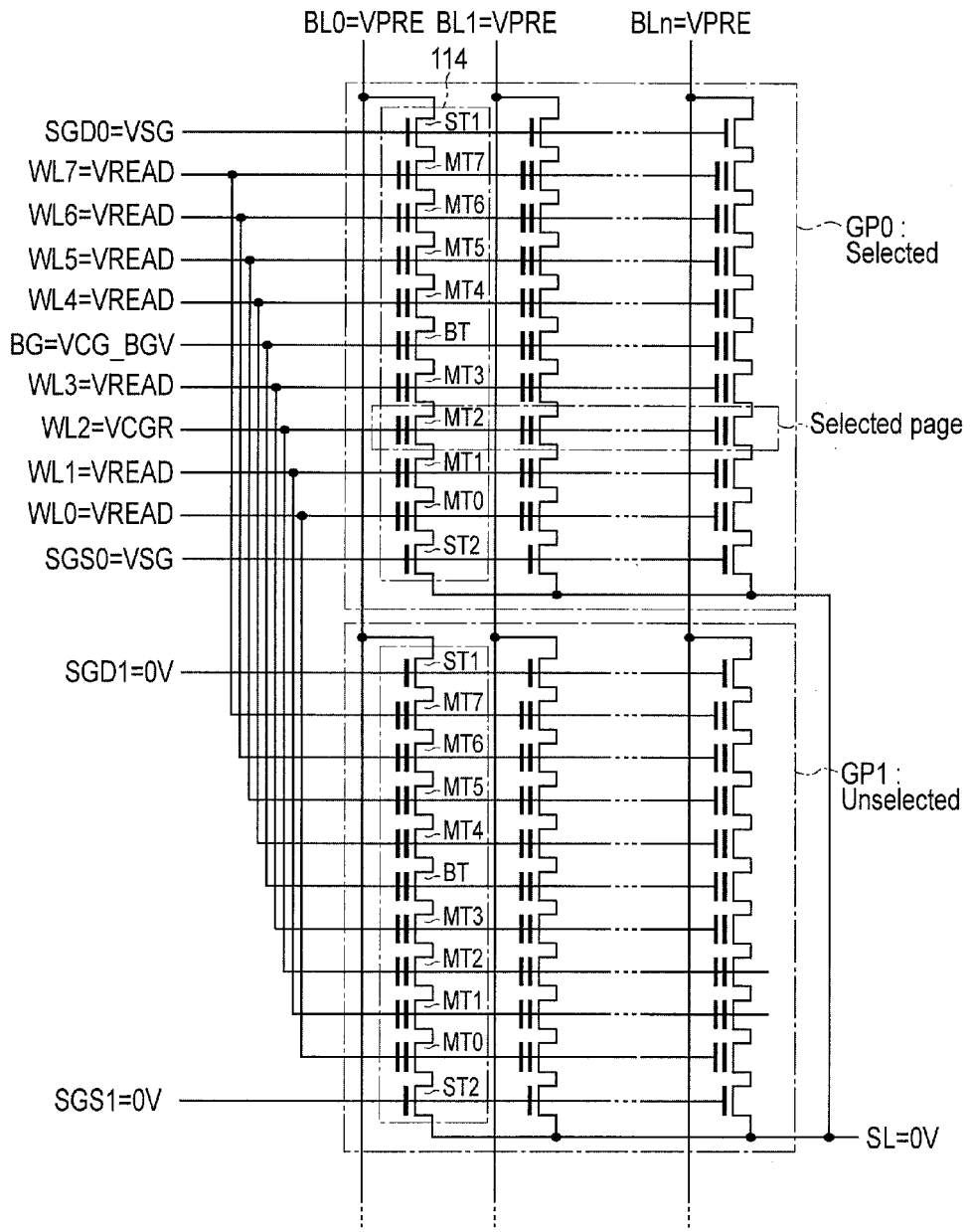
F I G. 19

Normal Read

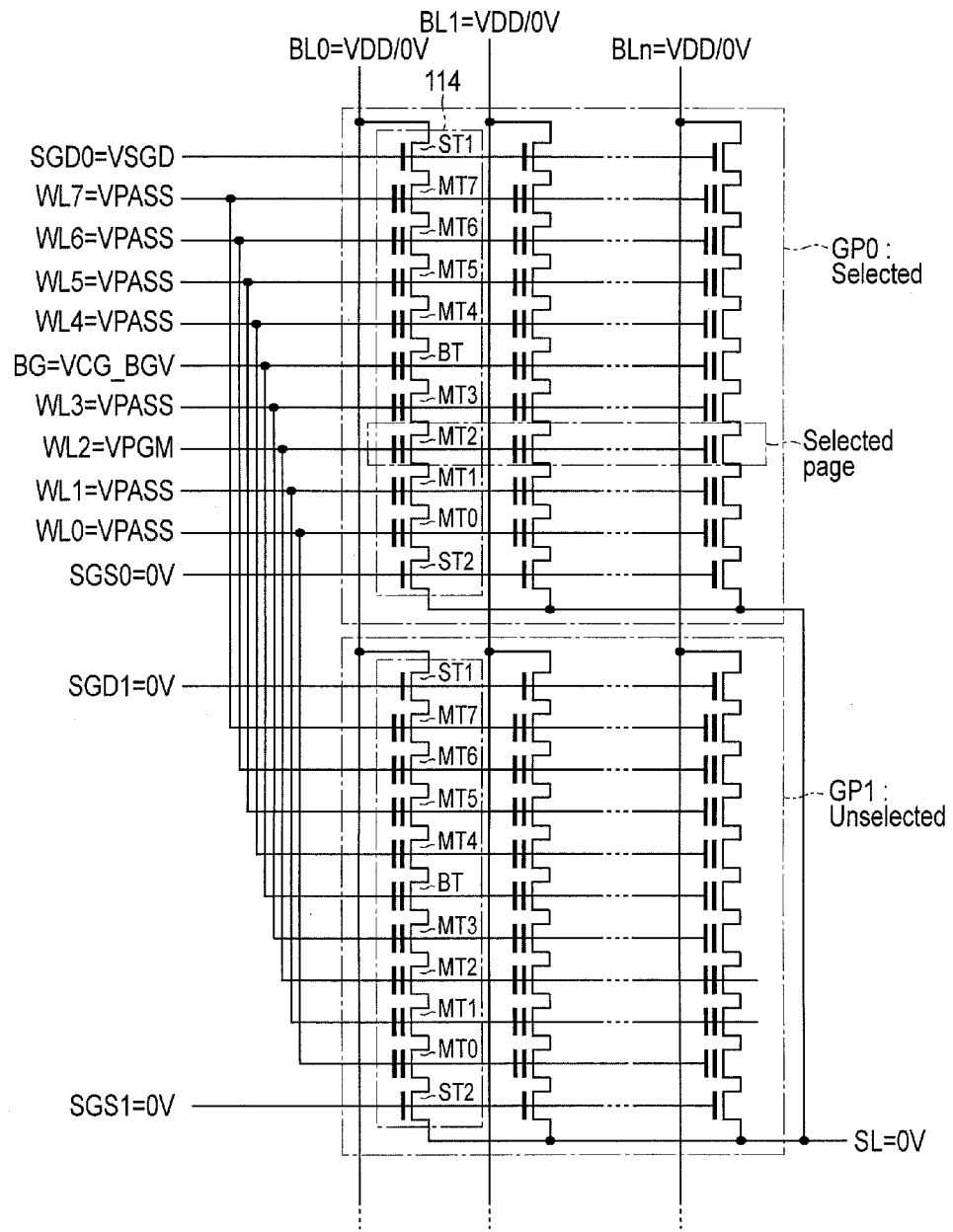
F I G. 24

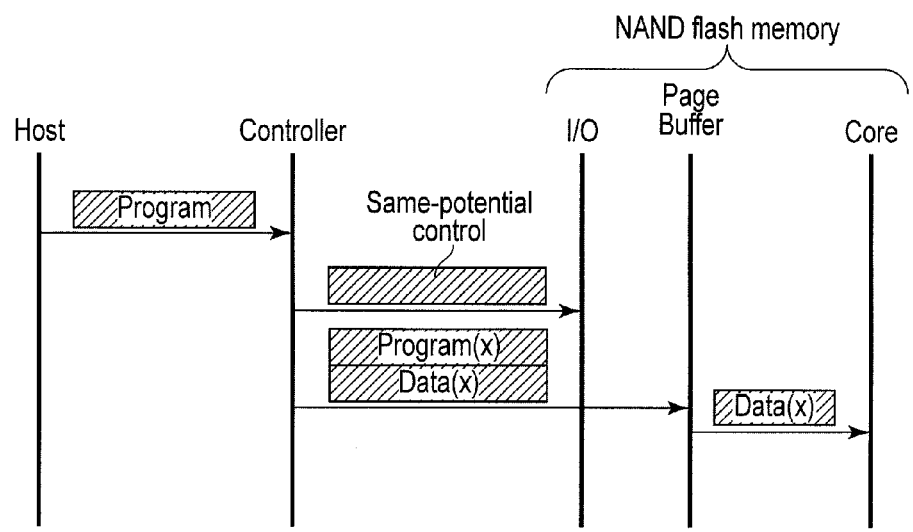
F I G. 27
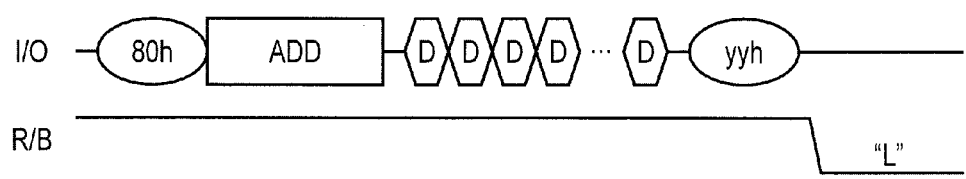
BBLK2 and BBLK3 Program
F I G. 28

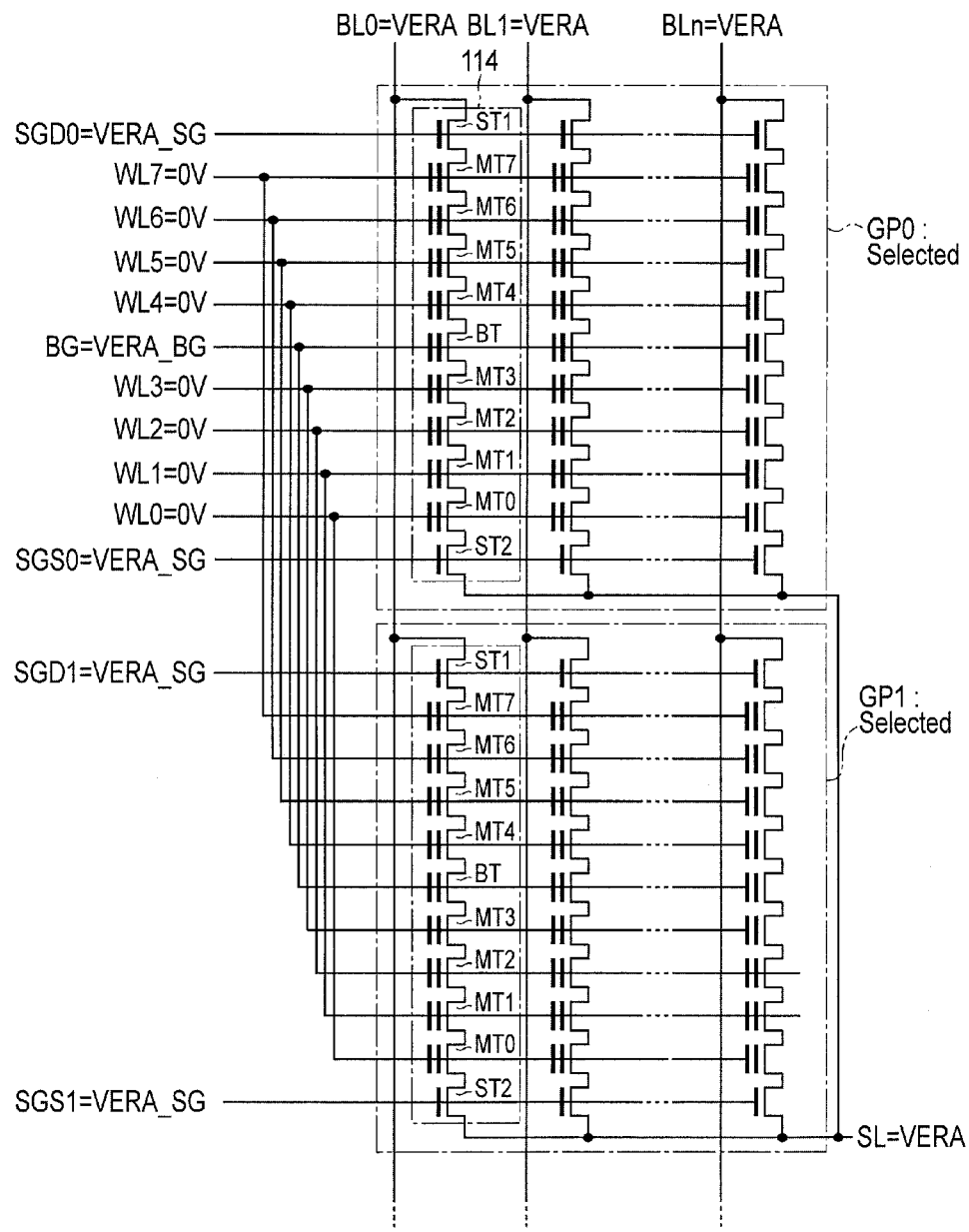
F I G. 29

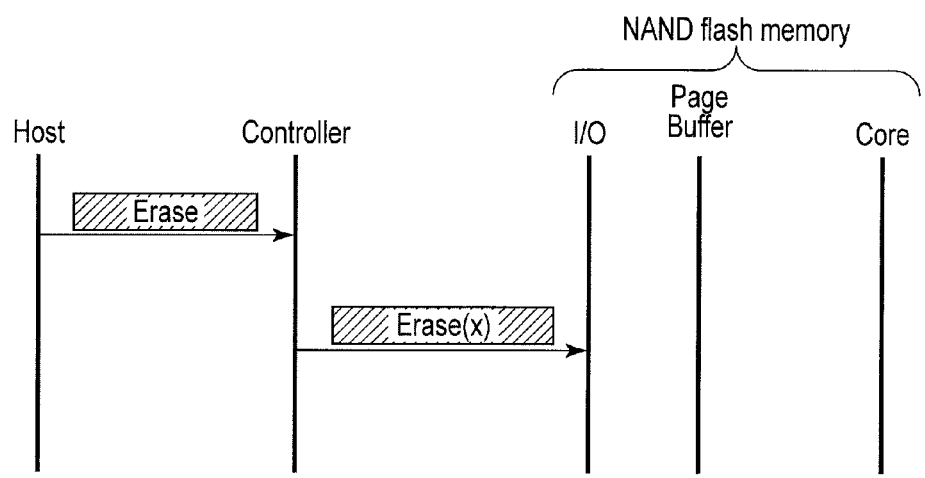
F I G. 30
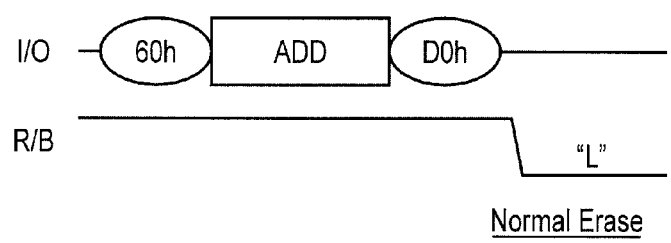
Normal Erase
F I G. 31

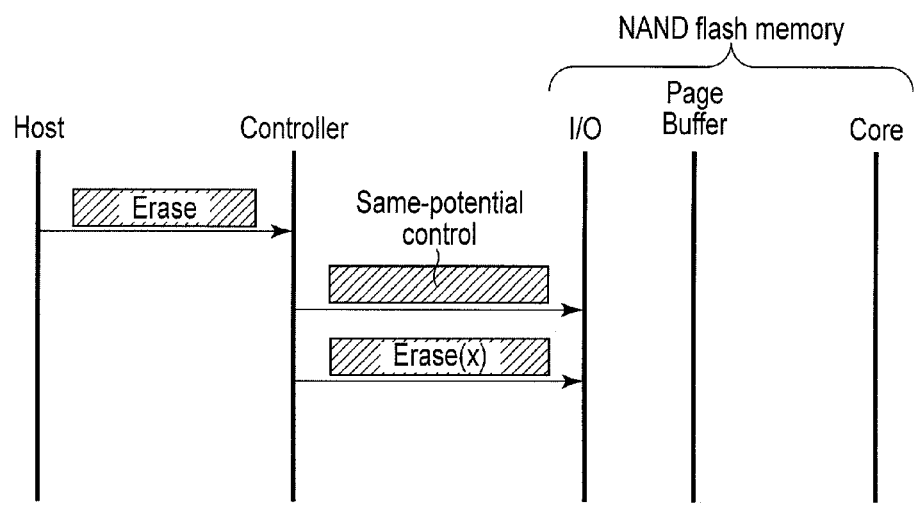
F I G. 32
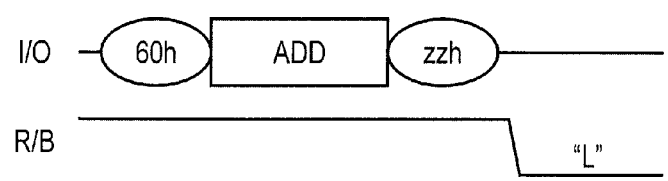
BBLK2 and BBLK3 Erase
F I G. 33

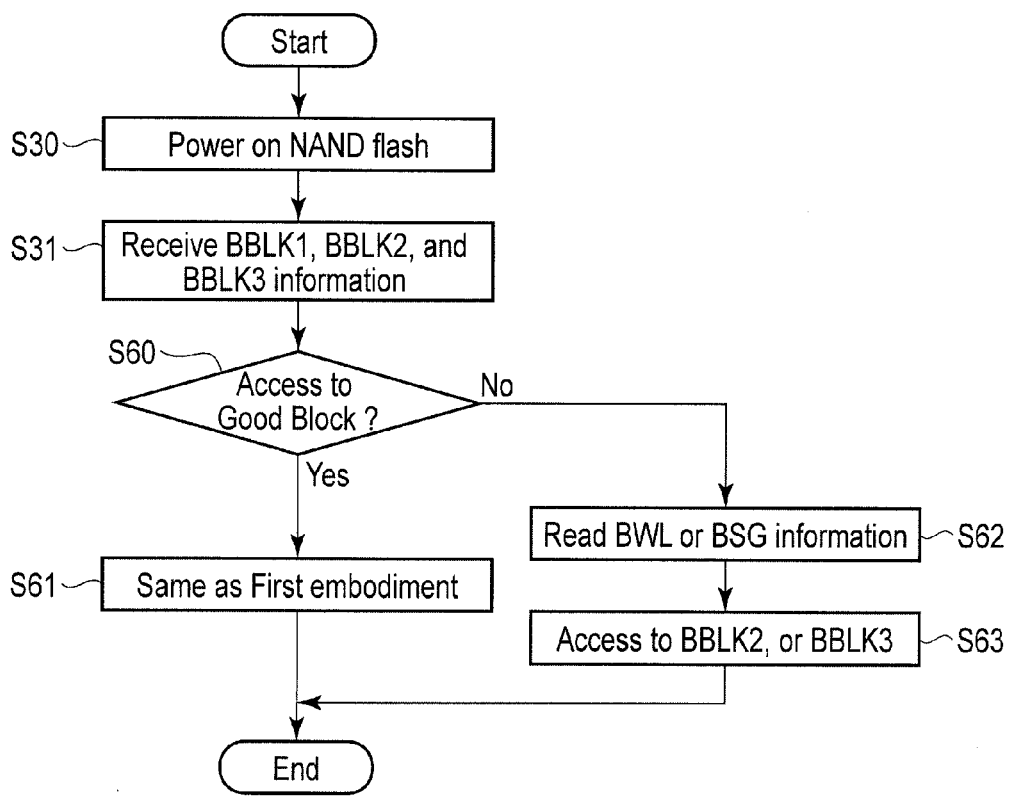
F I G. 34

| Case No. | Physical defect | Defect direction | Appearance | Failure mode | Replacement unit | Remedial method |
|---|---|---|---|---|---|---|
| I | MH-MH short | SG | BL-BL short | Column | Column RD | Column RD, L1_ECC |
| II | MH-MH short | BL | Column fail | Column | Column RD | Column RD, L1_ECC |
| III | Intra-string SGD-SGS short | BL | Block Fail | 1 string | Bad block | Set short-circuited SGD and SGS to identical potential |
| IV | Inter-string SGD-SGD short | BL | Block Fail | 2 string | Bad block | Set short-circuited SGD to identical potential |
| V | Inter-string SGS-SGS short | BL | Block Fail | 2 string | Bad block | Set short-circuited SGS to identical potential |
| VI | WL-WL short | BL | Block Fail | Block | Bad block | Set short-circuited WLs (in identical layer) to identical potential |
| VII | WL-WL short | h | Block Fail | Block | Bad block | Set short-circuited WLs(in vertically adjacent layers) to identical potential |
| VIII | SL(D0)-SGS short | h | Block or cell array | Block or cell array | Block or cell array | Set short-circuited SGS and SL to identical potential |
| IX | C1(D0)-SGD short | h | Column fail | Column | Column RD | Column RD or L1_ECC |
| X | SL(D0)-C1(D0) short | BL | Column fail | Column | Column RD | Column RD or L1_ECC |

FIG. 47

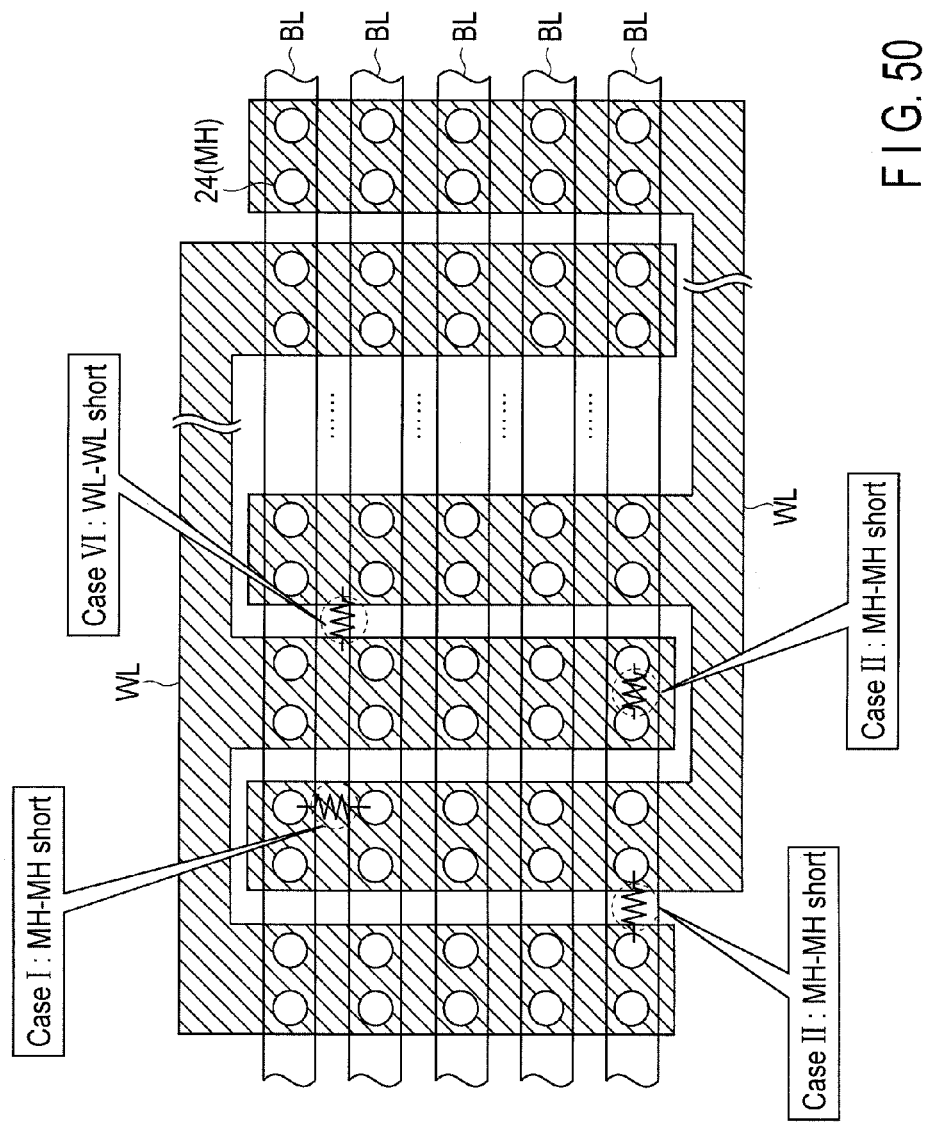
F I G. 50

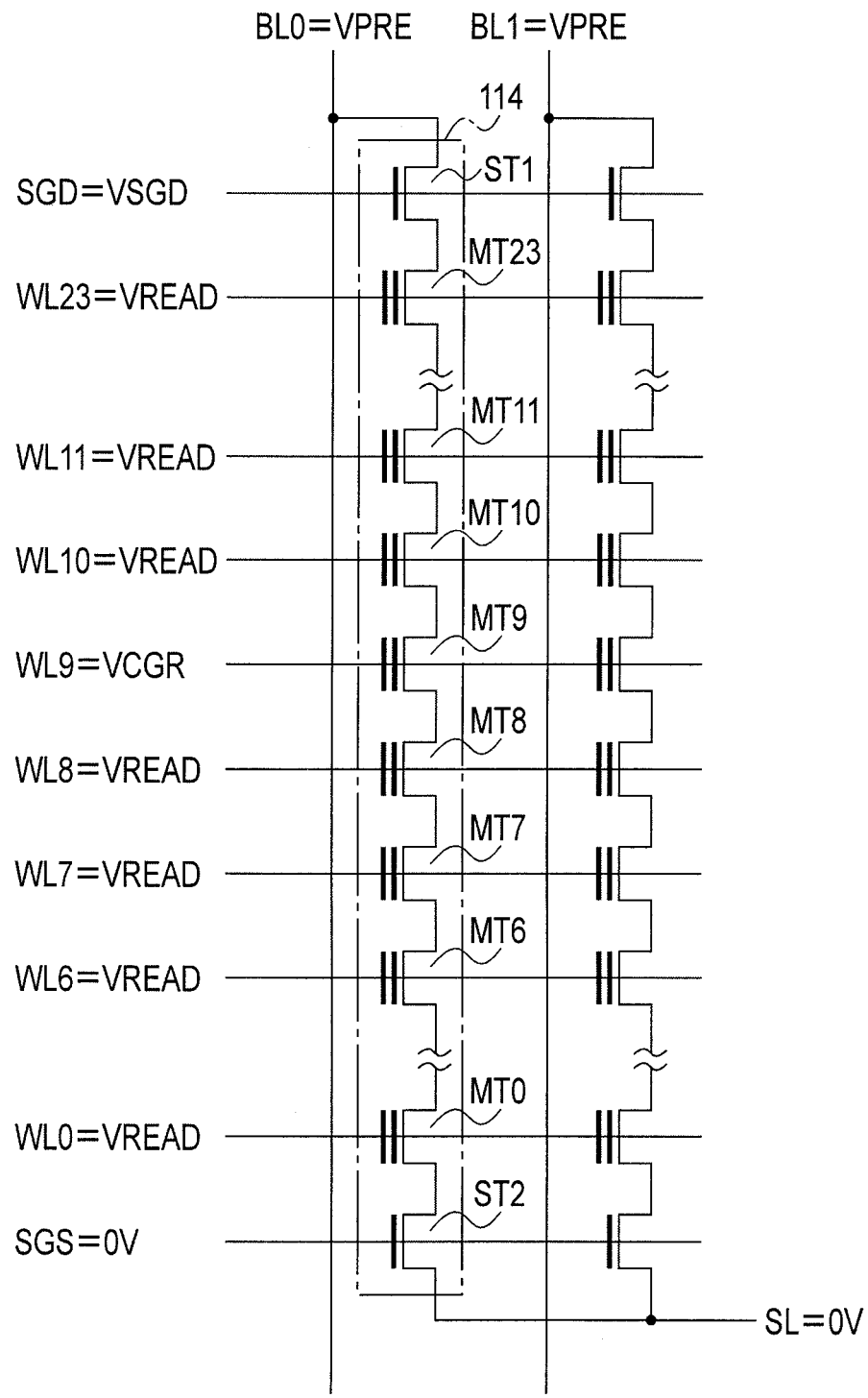
F I G. 55

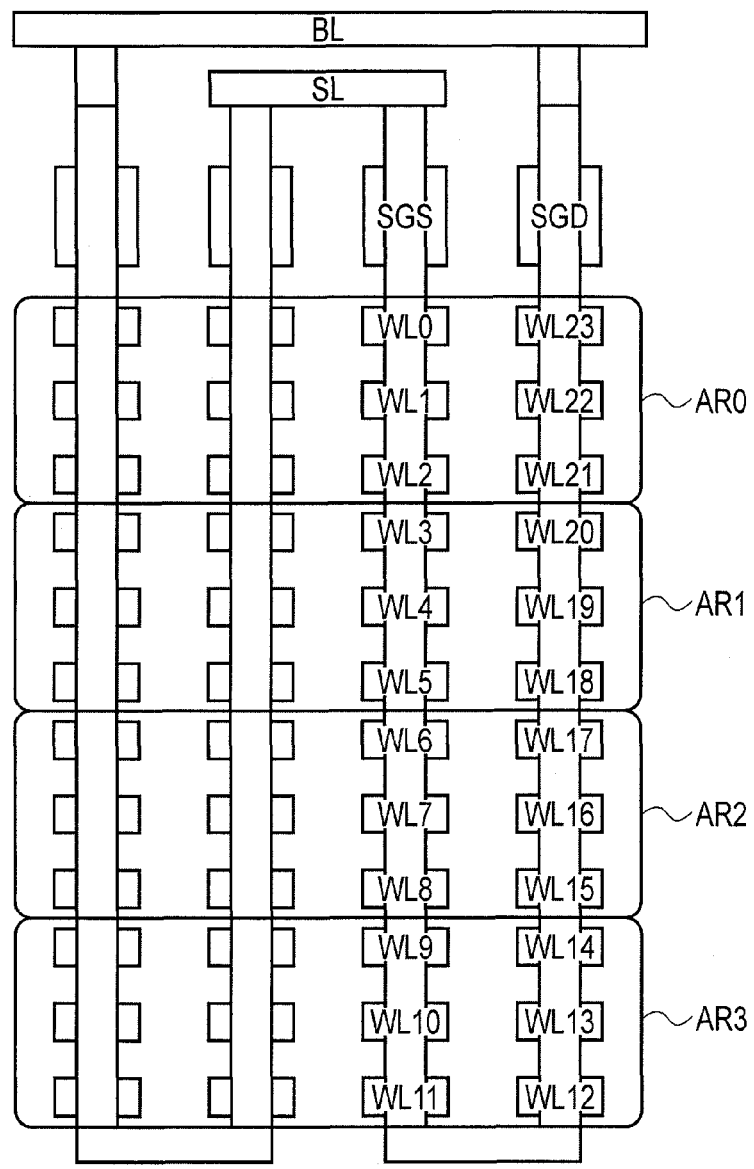
F I G. 56

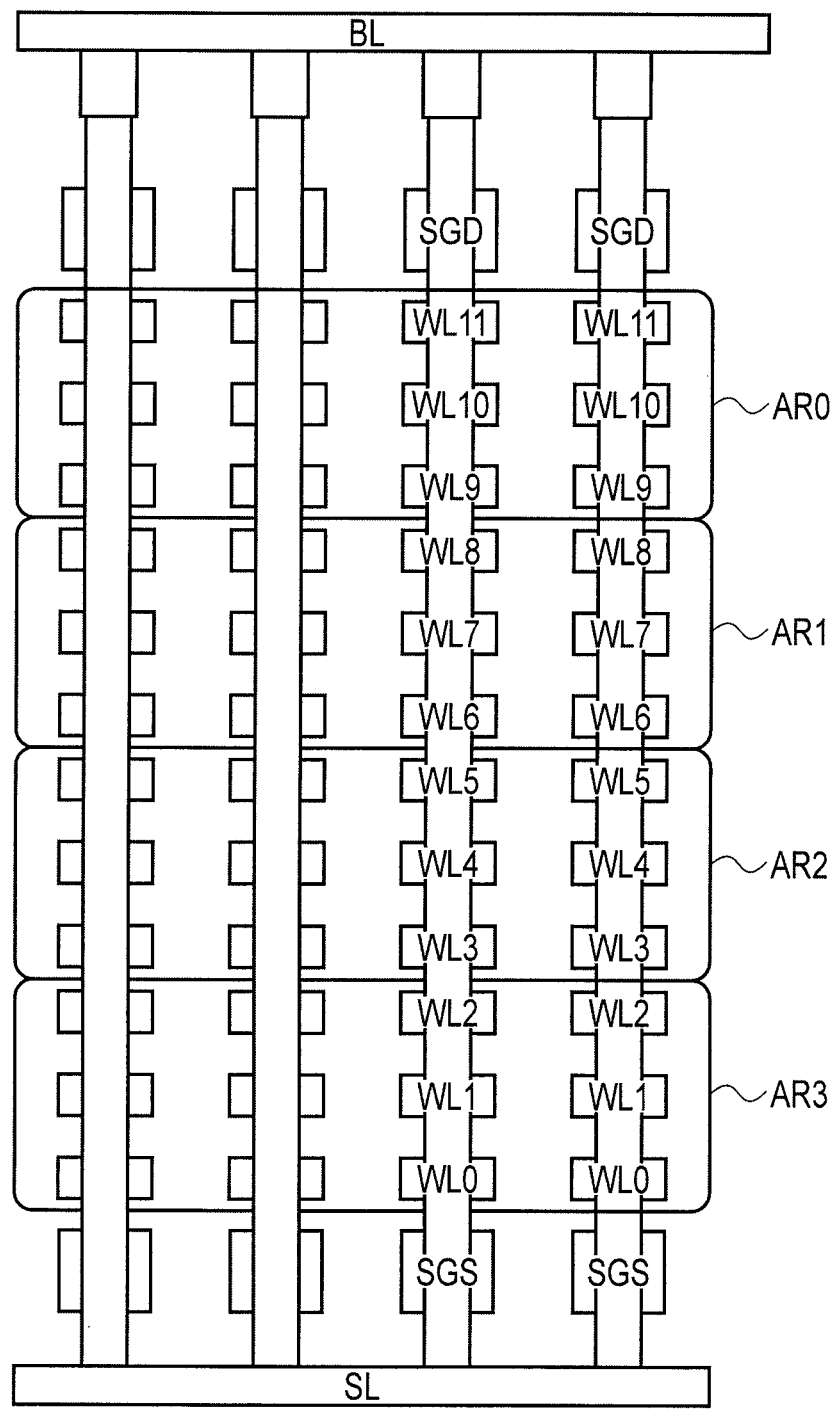
F I G. 57

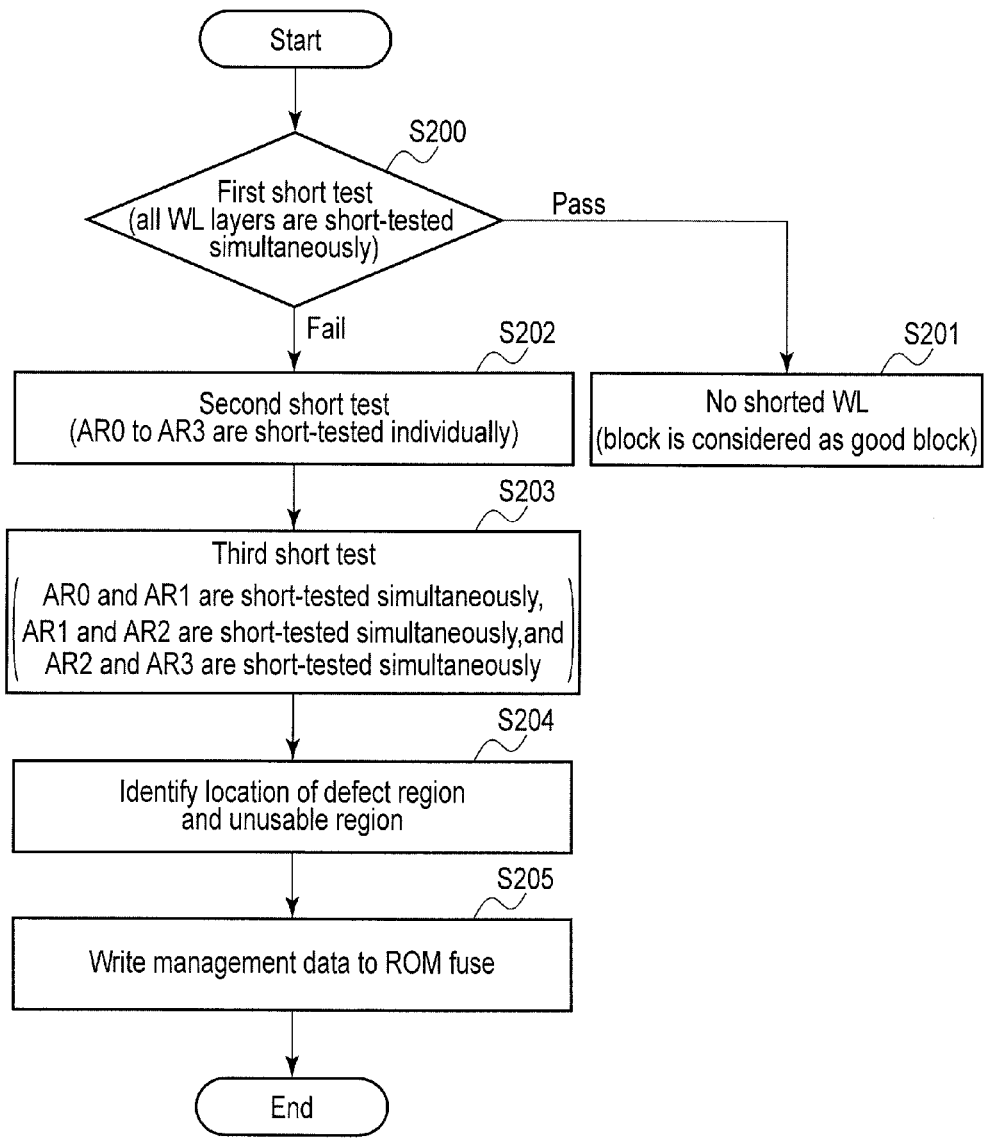
F I G. 58

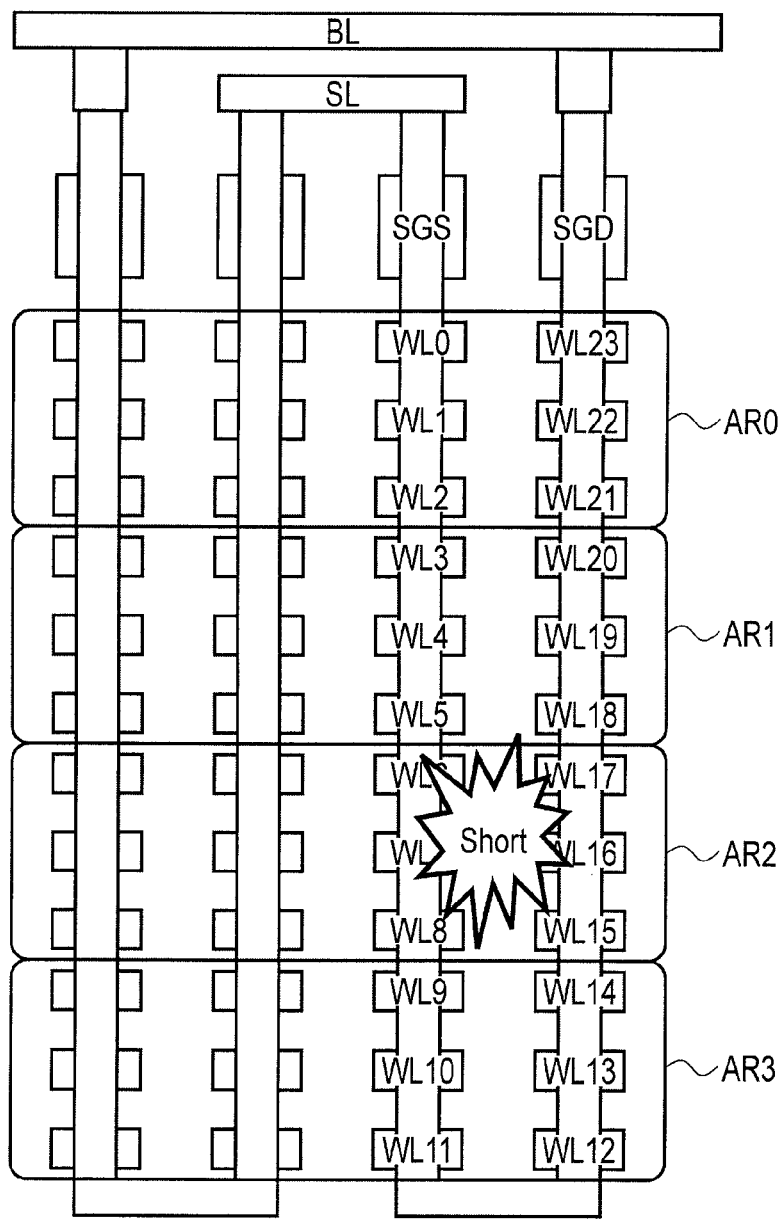
F I G. 59

| AR0 | ○ | ○ | × | ○ | ○ | ○ | × |
|---|---|---|---|---|---|---|---|
| AR1 | ○ | ○ | ○ | ○ | × | ○ | × |
| AR2 | ○ | ○ | ○ | × | ○ | × | ○ |
| AR3 | ○ | × | ○ | ○ | ○ | × | ○ |
| Usable region | All | AR0, AR1 | AR2, AR3 | AR0 | AR3 | AR0 | AR3 |

○ Good region
× Defect region

F I G. 60

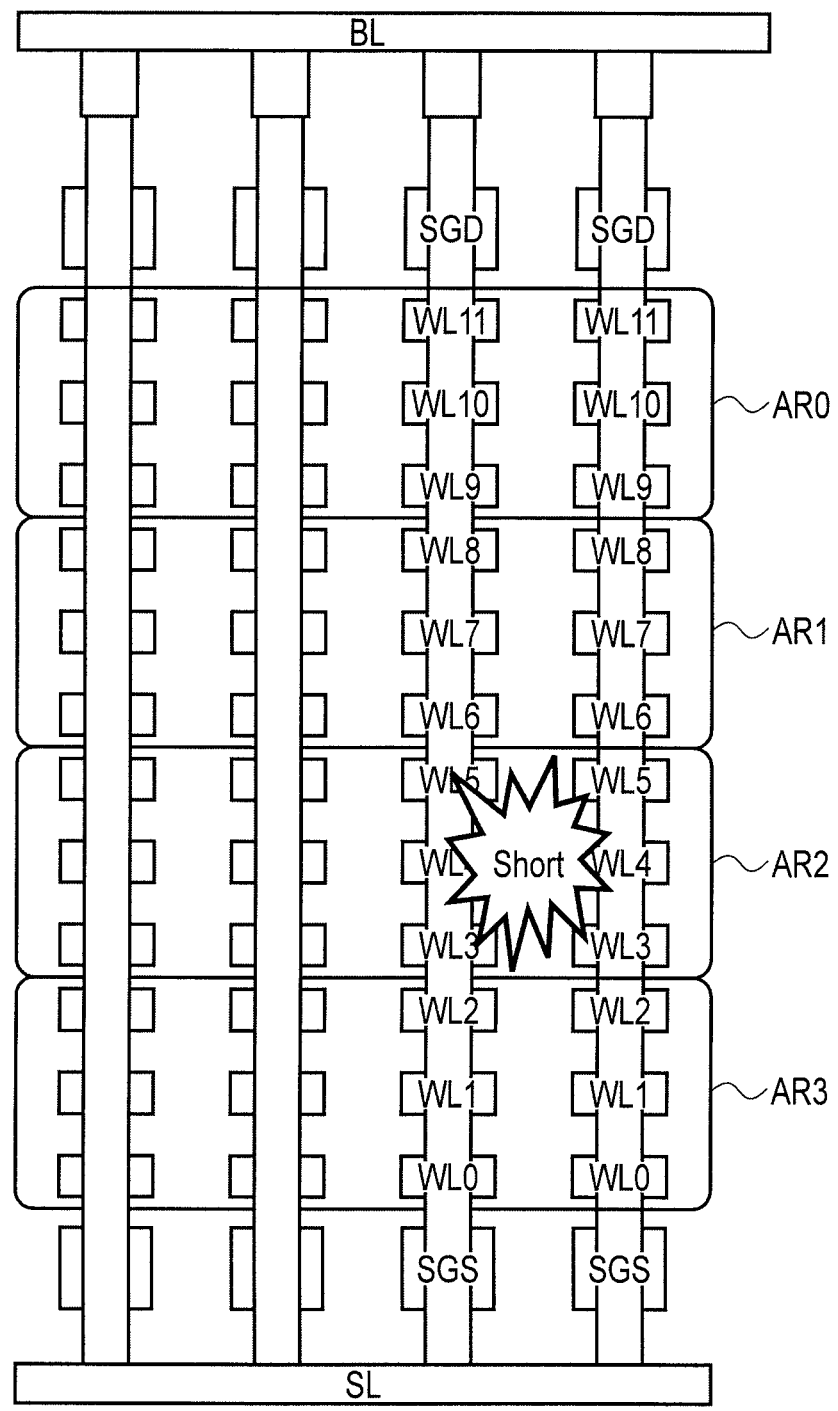
F I G. 61

| AR0 | ○ | ○ | × | ○ | ○ | ○ | × |
|---|---|---|---|---|---|---|---|
| AR1 | ○ | ○ | ○ | ○ | × | ○ | × |
| AR2 | ○ | ○ | ○ | × | ○ | × | ○ |
| AR3 | ○ | × | ○ | ○ | ○ | × | ○ |
| Usable region | All | AR0, AR1 | AR1, AR2, AR3 | AR0, AR3 | AR2, AR3 | AR0 | AR2, AR3 |

○ Good region
× Defect region

FIG. 62

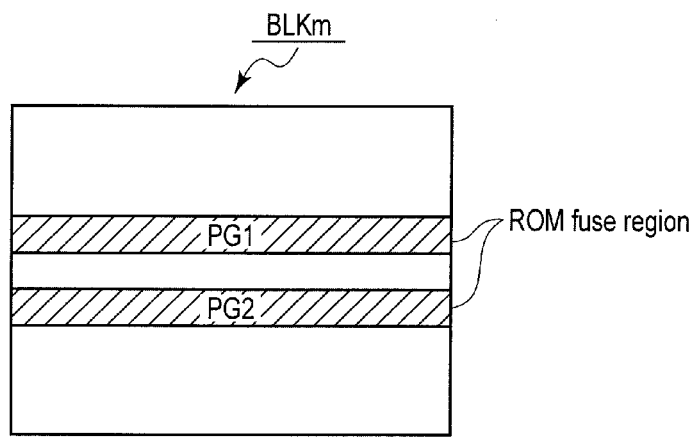
F I G. 63
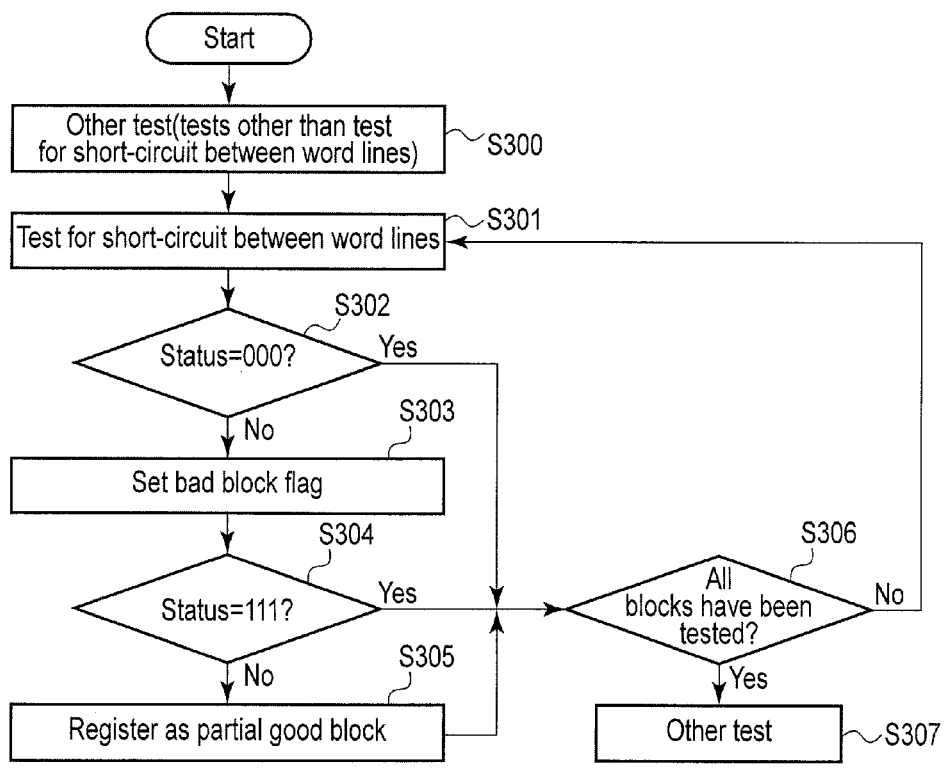
F I G. 64

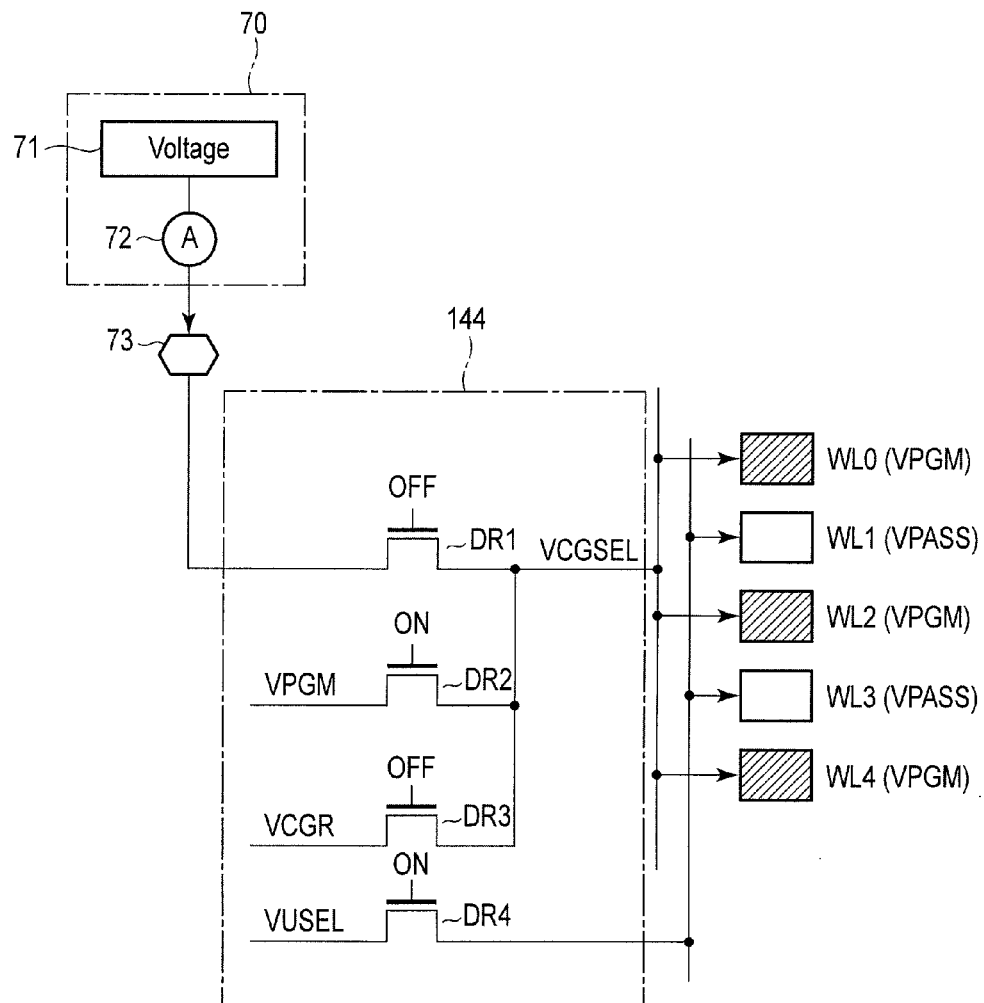
F I G. 66

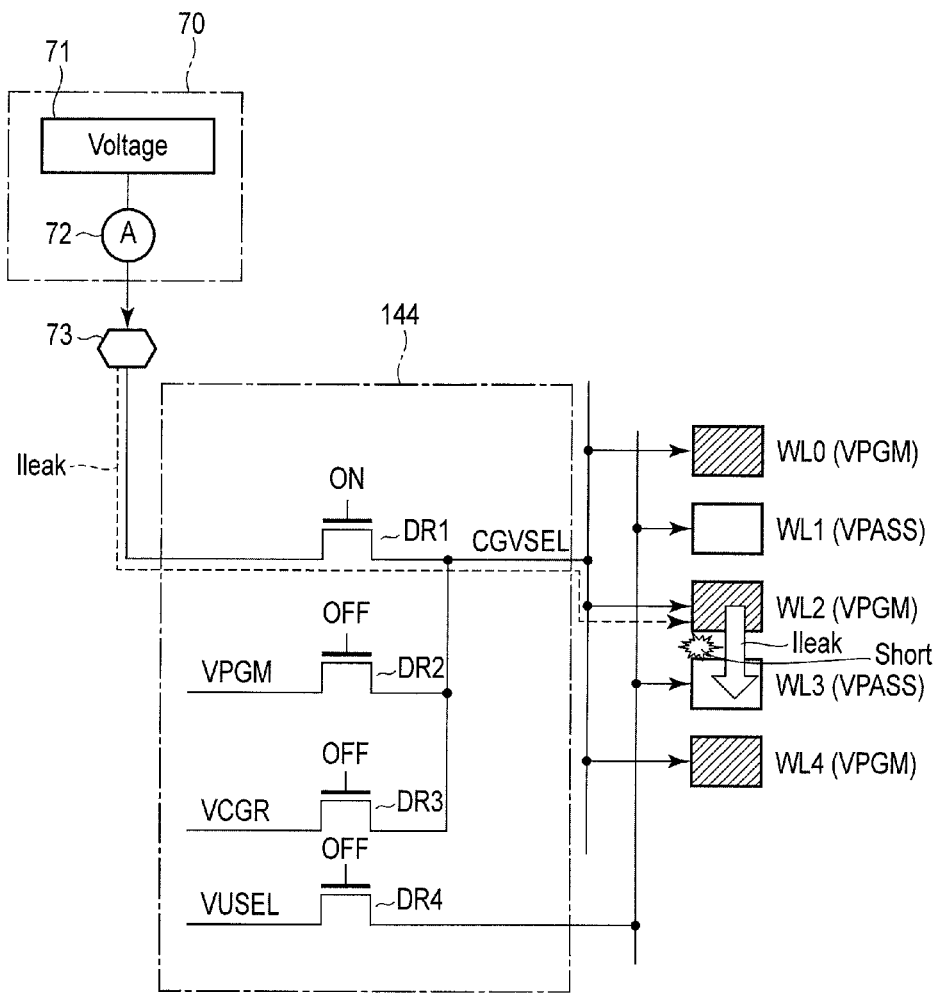
F I G. 67

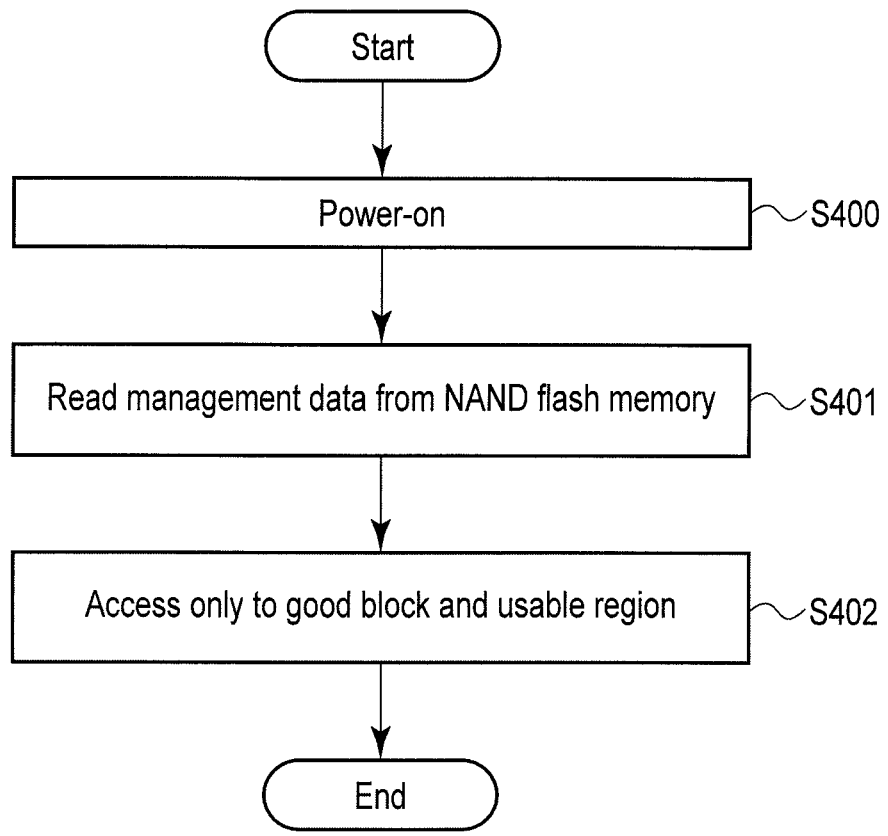
F I G. 69

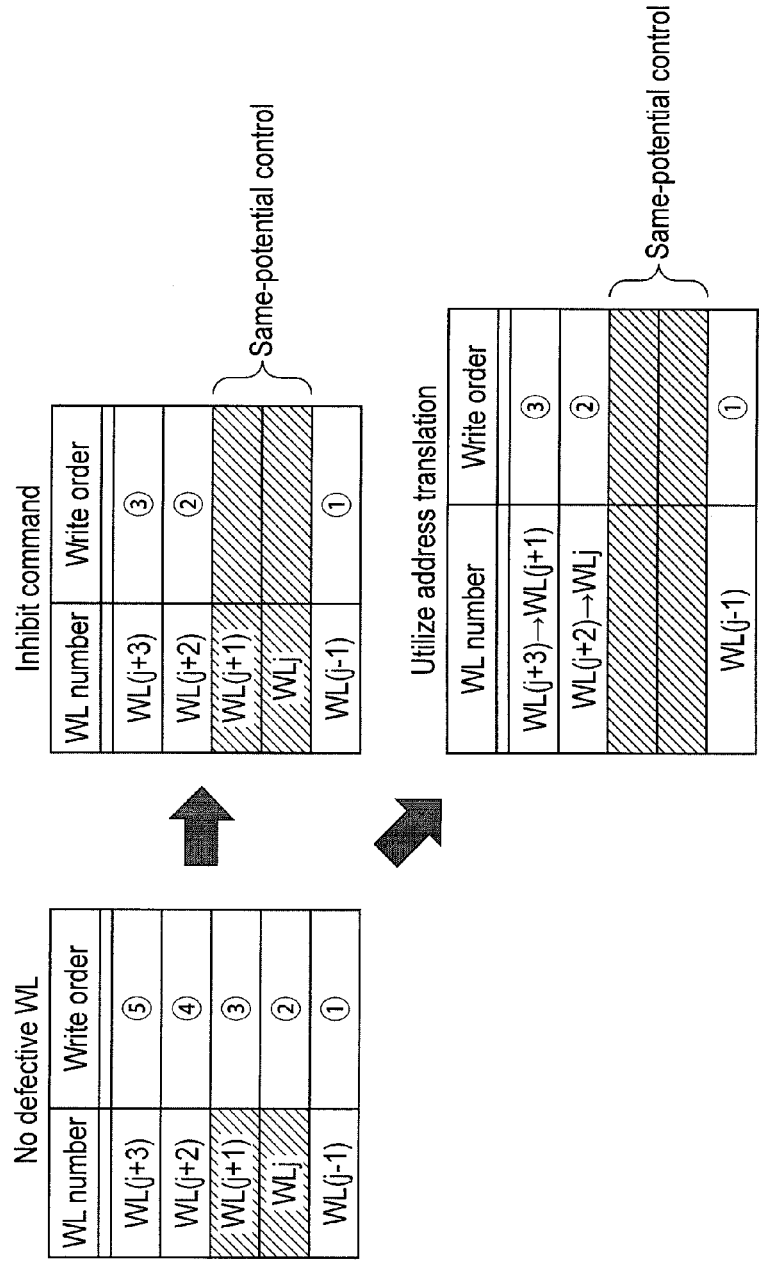
F I G. 70

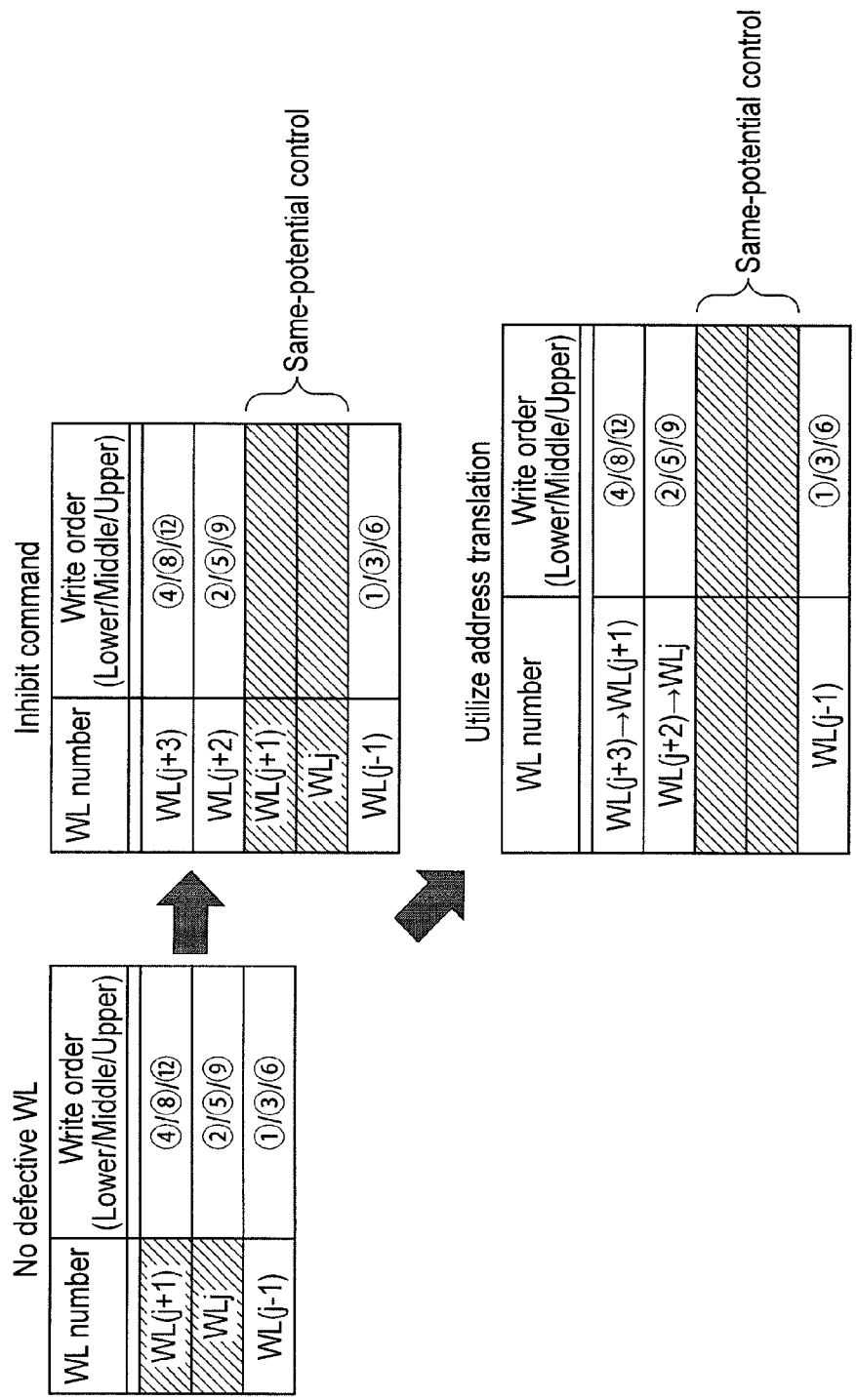
F I G. 71

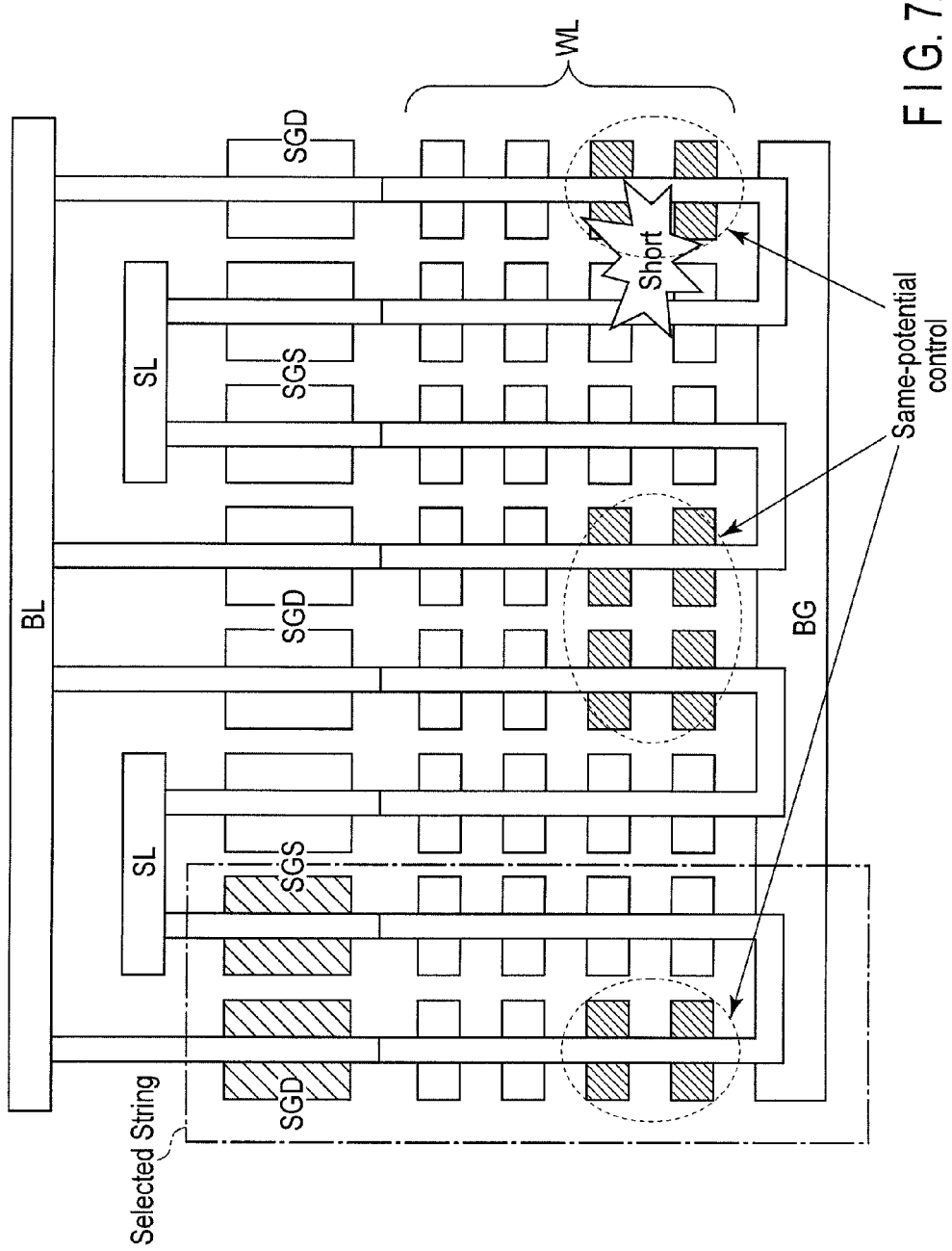
F I G. 72

SEMICONDUCTOR MEMORY DEVICE AND CONTROLLER

CROSS-REFERENCE TO RELATED APPLICATIONS

This application is based upon and claims the benefit of priority from Japanese Patent Applications No. 2012-197673, filed Sep. 7, 2012; and No. 2013-039874, filed Feb. 28, 2013, the entire contents of all of which are incorporated herein by reference.

FIELD

Embodiments described herein relate generally to a semiconductor memory device and a controller.

BACKGROUND

A NAND flash memory is known in which memory cells are three-dimensionally arranged.

BRIEF DESCRIPTION OF THE DRAWINGS

FIG. 1 is a block diagram of a memory system according to a first embodiment;

FIG. 2 is a block diagram of a semiconductor memory device according to the first embodiment;

FIG. 3 and FIG. 4 are a circuit diagram and a perspective of a memory cell array according to the first embodiment;

FIG. 5 and FIG. 6 are cross-sectional views of the memory cell array according to the first embodiment;

FIG. 7 is a perspective view of the memory cell array;

FIG. 8 is a block diagram of a row decoder and a driver circuit according to the first embodiment;

FIG. 11 is a schematic diagram of blocks according to the first embodiment;

FIG. 12 is a flowchart of the operation of a controller according to the first embodiment;

FIG. 13 is a diagram showing commands according to the first embodiment;

FIG. 16, FIG. 17, and FIG. 18 are circuit diagrams of the memory cell array according to the first embodiment;

FIG. 19 is a circuit diagram of a memory cell array according to a second embodiment;

FIG. 24 is a circuit diagram of the memory cell array according to the second embodiment;

FIG. 27 is a sequence diagram showing processing carried out by the memory system according to the second embodiment;

FIG. 28 is a command sequence diagram of the semiconductor memory device according to the second embodiment;

FIG. 29 is a circuit diagram of the memory cell array according to the second embodiment;

FIG. 30 is a sequence diagram showing processing carried out by the memory system according to the second embodiment;

FIG. 31 is a command sequence diagram of the semiconductor memory device according to the second embodiment;

FIG. 32 is a sequence diagram showing processing carried out by the memory system according to the second embodiment;

FIG. 33 is a command sequence diagram of the semiconductor memory device according to the second embodiment;

FIG. 34 and FIG. 35 are flowcharts of the operation of a controller according to a third embodiment;

FIG. 47 is a graph showing the relations between defects and remedial methods according to a sixth embodiment;

FIG. 50 is a plan view of word lines according to the sixth embodiment;

FIG. 55 is a diagram illustrating voltage relations in a reading operation according to the seventh embodiment;

FIG. 56 and FIG. 57 are diagrams illustrating examples of units used to divide a block into a plurality of regions according to the seventh embodiment;

FIG. 58 is a flowchart of a test method according to the seventh embodiment;

FIG. 59 is a cross-sectional view showing an example of a short-circuiting defect according to the seventh embodiment;

FIG. 60 is a diagram illustrating the relation between defect regions and usable regions according to the seventh embodiment;

FIG. 61 is a cross-sectional view showing an example of a short-circuiting defect according to the seventh embodiment;

FIG. 62 is a diagram illustrating the relation between defect regions and usable regions according to the seventh embodiment;

FIG. 63 is a schematic diagram of a block with a ROM fuse region according to the seventh embodiment;

FIG. 64 is a flow chart showing a general flow of a test method;

FIG. 66 and FIG. 67 is a circuit diagram illustrating an operation for detecting a leak current;

FIG. 69 is a flowchart showing a control operation performed by a controller according to an eighth embodiment;

FIG. 70 and FIG. 71 are diagrams of a memory cell array according to a modification of the first to eighth embodiments;

FIG. 72 is a cross-sectional view of a memory cell array according to the first to eighth embodiments.

DETAILED DESCRIPTION

Figure 4:
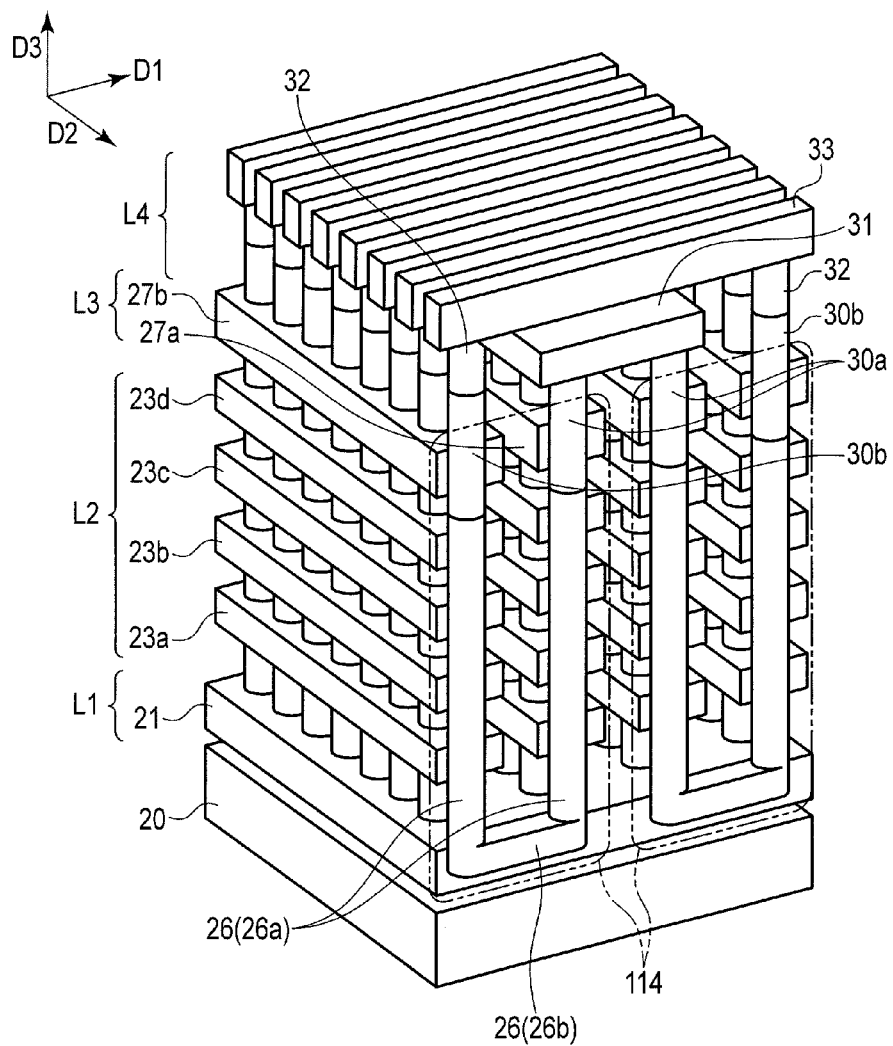

In general, according to one embodiment, a semiconductor memory device includes a memory cell array; and a controller. The memory cell array stores data in a non-volatile manner. The controller controls access to the memory cell array. The memory cell array includes a plurality of blocks. Each of the blocks includes a first selection transistor, a second selection transistor, a plurality of memory cell transistors, a first selection gate line, a second selection gate line, and word lines. The memory cell transistors each includes a charge accumulation layer and a control gate and are stacked above a semiconductor substrate and are connected in series between the first selection transistor and the second selection transistor. The first selection gate line and the second selection gate lines are connected to gates of the first selection transistor and the selection transistor, respectively. The word lines are connected to gates of the respective memory cell transistors. One of the blocks holds information on a word line, a first selection gate line and/or a second selection gate line including a short-circuiting defect.

1. First Embodiment

A semiconductor memory device and a controller for the semiconductor memory device according to a first embodiment will be described. The semiconductor memory device will be described below taking, as an example, a three-dimensional stack NAND flash memory in which memory cells are stacked above a semiconductor substrate.

1.1 Configuration 1.1.1 Memory System Configuration

First, a configuration of a memory system including the semiconductor memory device according to the present embodiment will be described with reference to FIG. 1. FIG. 1 is a block diagram of the memory system according to the present embodiment.

As shown in FIG. 1, the memory system includes a NAND flash memory 100, a controller 200, and a host apparatus 300.

The NAND flash memory 100 includes a plurality of memory cells to store data in a non-volatile manner. A detailed configuration of the NAND flash memory 100 will be described below.

The controller 200 instructs the NAND flash memory 100 to perform a read operation, a write operation, an erase operation, or the like in response to an instruction from the host apparatus 300. The controller 200 also manages a memory space in the NAND flash memory 100. The controller 200 and the NAND flash memory 100 may, for example, form the same semiconductor device. Examples of such a semiconductor device include a memory card such as an SD™ card and an SSD (Solid State Drive).

The controller 200 includes a host interface circuit 210, an embedded memory (RAM) 220, a processor (CPU) 230, a buffer memory 240, and a NAND interface circuit 250.

The host interface circuit 210 is connected to the host apparatus 300 via a controller bus to communicate with the host apparatus 300. The host interface circuit 210 transfers instructions and data received from the host apparatus 300 to the CPU 230 and the buffer memory 240. The host interface circuit 210 also transfers data in the buffer memory 240 to the host apparatus 300 in response to an instruction from the CPU 230.

The NAND interface circuit 250 is connected to the NAND flash memory 100 via a NAND bus to communicate with the NAND flash memory 100. The NAND interface circuit 250 transfers an instruction received from the CPU 230 to the NAND flash memory 100, and during write, write data in the buffer memory 240 to the NAND flash memory 100. The NAND interface circuit 250 further transfers, during read, data read from the NAND flash memory 100 to the buffer memory 240.

The CPU 230 controls the operation of the controller 200 as a whole. For example, upon receiving a read instruction from the host apparatus 300, the CPU 230 issues, in response to the read instruction, a read instruction based on the NAND interface. This also applies to write and erasure. The CPU 230 also executes various types of processing such as wear leveling to manage the NAND flash memory 1. The CPU 230 further executes various calculations. The CPU 230 executes, for example, a data encryption process, a randomize process, and an error correction (ECC: Error Checking and Correcting) process.

The embedded memory 220 is, for example, a semiconductor memory such as a DRAM and is used as a work area for the CPU 230. The embedded memory 220 holds firmware configured to manage the NAND flash memory 100, various management tables, and the like.

1.1.2 Semiconductor Memory Device Configuration

Now, a configuration of the semiconductor memory device 100 will be described.

1.1.2.1 General Configuration of the Semiconductor Memory Device

FIG. 2 is a block diagram of the NAND flash memory 100 according to the present embodiment. As shown in FIG. 2, the NAND flash memory 100 includes a core unit 110, a page buffer 120, an input/output unit 130, and a peripheral circuit 140.

The core unit 110 includes a memory cell array 111, a row decoder 112, and a sense amplifier 113.

The memory cell array 111 includes a plurality of (in the example in FIG. 2, four) blocks BLK (BLK0 to BLK3) each of which is a set of non-volatile memory cells. The block BLK is a data erase unit, and the data in the same block BLK is erased at a time. Each of the blocks BLK includes a plurality of (in the present example, four) string groups GP (GP0 to GP3) each of which is a set of NAND strings 114 including memory cells connected together in series. Of course, the number of blocks in the memory cell array 111 and the number of string groups in one block BLK are optional.

The row decoder 112 decodes a block address BA to select the corresponding block BLK.

During data reading, the sense amplifier 113 senses and amplifies data read from a memory cell. During data writing, the sense amplifier 113 transfers write data to a memory cell. Data is read from and written to the memory cell array 111 in units of a plurality of memory cells. This unit corresponds to a page.

The page buffer 120 holds data in units of pages. During data reading, the page buffer 120 temporarily holds data transferred by the sense amplifier 113 in units of pages, and serially transfers the data to the input/output unit 130. On the other hand, during data writing, the page buffer 120 temporarily holds data serially transferred by the input/output unit 130, and transfers the data to the sense amplifier 113 in units of pages.

The input/output unit 130 transmits and receives various commands and data to and from the controller 200 via the NAND bus.

The peripheral circuit 140 includes a sequencer 141, a charge pump 142, a register 143, and a driver 144.

The driver 144 supplies voltages required for data writing, data reading, and data erasing to the row decoder 112, the sense amplifier 113, and a source line driver (not shown in the drawings). The voltages are applied to memory cells (word lines, selection gate lines, back gate lines, bit lines, and source lines described below) by the row decoder 112, the sense amplifier 113, and the source line driver.

The charge pump 142 steps up an externally provided power supply voltage to supply the required voltage to the driver 144.

The register 143 holds various signals. For example, the register 143 holds the status of a data writing operation or a data erasing operation to notify the controller whether or not the operation has completed normally.

The sequencer 141 controls the operation of the NAND flash memory 100 as a whole.

1.1.2.2 Memory Cell Array 111

Now, a detailed configuration of the memory cell array 111 will be described. FIG. 3 is a circuit diagram of the block BLK0. The blocks BLK1 to BLK3 have a similar configuration.

As shown in FIG. 3, the block BLK0 includes, for example, four string groups GP. Furthermore, each of the string groups GP includes n (n is a natural number) NAND strings 114.

Each of the NAND strings 114 includes, for example, eight memory cell transistors MT (MT0 to MT7), selection transistors ST1 and ST2, and a back gate transistor BT. Each of the memory cell transistors MT includes a stacked gate including a control gate and a charge accumulation layer to hold data in a non-volatile manner. The number of memory cell transistors MT is not limited to 8 but may be 16, 32, 64, 128, or the like; the number of memory cell transistors MT is not limited. Like the memory cell transistor MT, the back gate transistor BT includes a stacked gate including a control gate and a charge accumulation layer. However, the back gate transistor BT is not configured to hold data and functions as a simple current path during data writing, data reading, and data erasing. The memory cell transistors MT and the back gate transistor BT are arranged between the selection transistor ST1 and the selection transistor ST2 so that current paths in the memory cell transistors MT and the back gate transistor BT are connected together in series. The back gate transistor BT is provided between the memory cell transistor MT3 and the memory cell transistor MT4. The current path in the memory cell transistor MT7 located at one end of the group of series connected transistors is connected to one end of the current path in the selection transistor ST1. The current path in the memory cell transistor MT0 located at the other end of the group of series connected transistors is connected to one end of the current path in the selection transistor ST2.

Respective gate of the selection transistor ST1 in each of the string group GP0 to GP3 is connected to the selection gate lines SGD0 to SGD3. Respective gate of the selection transistor ST2 in each of the string group GP0 to GP3 is connected to the selection gate lines SGS0 to SGS3. In contrast, the control gates of the memory cell transistors MT0 to MT7 in the same block BLK0 are connected in common to the word lines WL0 to WL7. The control gates of the back gate transistors BT are connected in common to a back gate lines BG (for the blocks BLK0 to BLK3, back gate lines BG0 to BG3).

That is, the word lines WL0 to WL7 and the back gate lines BG common to the plurality of string groups GP0 to GP3 are provided for connection within the same block BLK0. In contrast, the selection gate lines SGD and SGS are provided independently in each of the string groups GP0 to GP3 even within the same block BLK0.

Furthermore, in those of the NAND strings 114 arranged in a matrix in the memory cell array 111 which are positioned on the same row, the other ends of the current paths in the selection transistors ST1 are connected to one of the bit lines BL (BL0 to BLn; n is a natural number). That is, the common bit line BL connects the NAND strings 114 together across the plurality of blocks BLK. Furthermore, the other ends of the current paths in the selection transistors ST2 are connected to the common source line SL. The source line SL connects in common the NAND strings 114 across the plurality of blocks.

As described above, the data in the memory cell transistors MT within the same block BLK is erased at a time. In contrast, data read and data write are carried out at a time on a plurality of memory cell transistors MT connected to one of the word lines WL in one of the string groups GP in one of the blocks BLK. This unit for data read and data write is referred to as a "page".

Figure 5:
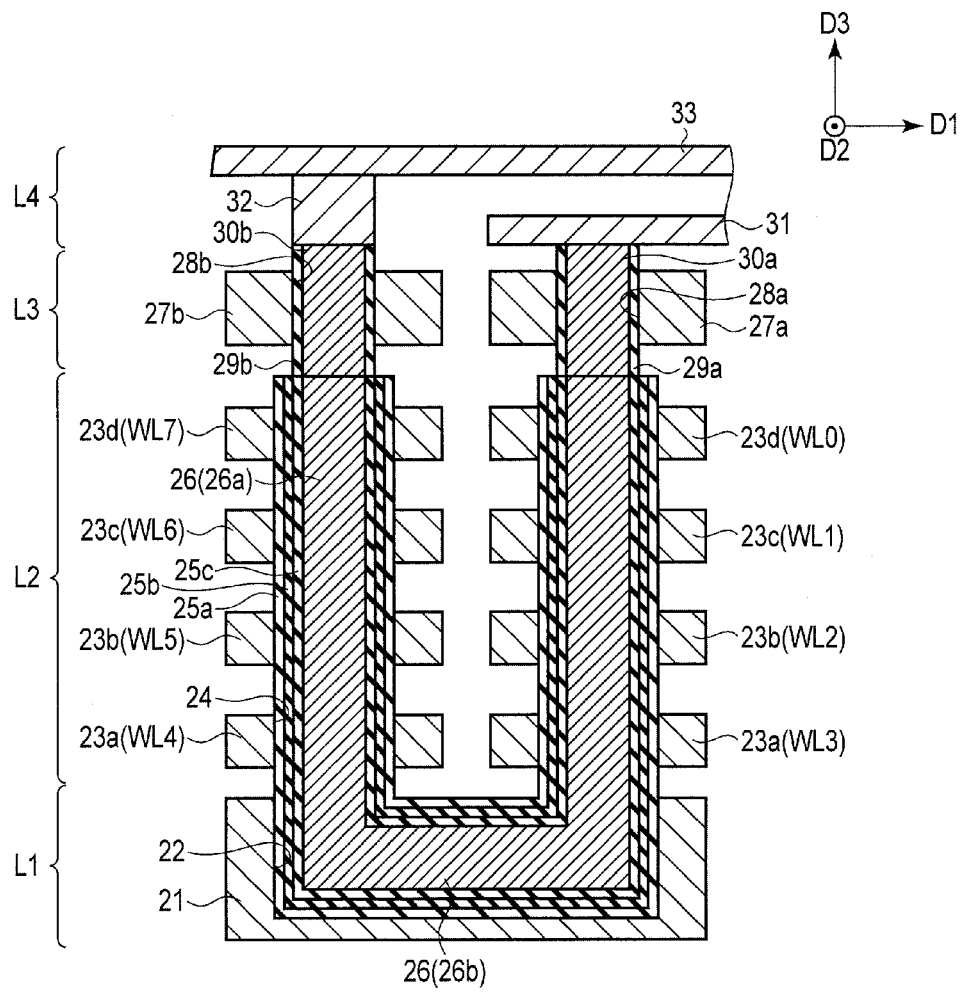

Now, the three dimensional stack structure of the memory cell array 111 will be described with reference to FIG. 4 and FIG. 5. FIG. 4 and FIG. 5 are a perspective view and a cross-sectional view of the memory cell array 111.

As shown in FIG. 4 and FIG. 5, the memory cell array 111 is provided above a semiconductor substrate 20. The memory cell array 111 includes a back gate transistor layer L1, a memory cell transistor layer L2, a selection transistor layer L3, and an interconnect layer L4.

The back gate transistor layer L1 functions as the back gate transistor BT. The memory cell transistor layer L2 functions as the memory cell transistors MT0 to MT7 (NAND string 114). The selection transistor layer L3 functions as selection transistors ST1 and ST2. The interconnect layer L4 functions as the source lines SL and the bit lines BL.

The back gate transistor layer L1 includes a back gate conductive layer 21. The back gate conductive layer 21 is formed so as to extend two-dimensionally in a first direction D1 and a second direction D2 (that is, the first direction and the second direction are orthogonal to a third direction D3 in which memory cells are stacked). The back gate conductive layer 21 is separated into pieces corresponding to the respective blocks BLK. The back gate conductive layer 21 is formed of, for example, polycrystalline silicon. The back gate conductive layer 21 functions as a back gate line BG.

As shown in FIG. 5, the backgate conductive layer 21 has a backgate hole 22. The backgate hole 22 is made to scoop out the backgate conductive layer 21. The backgate hole 22 is made into an almost rectangular shape having a longitudinal direction in the first direction when viewed from the upper surface.

The memory cell transistor layer L2 is formed on the backgate conductive layer L1. The memory cell transistor layer L2 includes word line conductive layers 23a to 23d. The word line conductive layers 23a to 23d are stacked with interlayer dielectric layers (not shown) being sandwiched between them. The word line conductive layers 23a to 23d are formed into strips extending in the row direction at a predetermined pitch in the column direction. The word line conductive layers 23a to 23d are made of, e.g., polysilicon. The word line conductive layer 23a functions as the control gates (word lines WL3 and WL4) of the memory cell transistors MT3 and MT4, the word line conductive layer 23b functions as the control gates (word lines WL2 and WL5) of the memory cell transistors MT2 and MT5, the word line conductive layer 23c functions as the control gates (word lines WL1 and WL6) of the memory cell transistors MT1 and MT6, and the word line conductive layer 23d functions as the control gates (word lines WL0 and WL7) of the memory cell transistors MT0 and MT7.

As shown in FIG. 5, the memory cell transistor layer L2 has memory holes 24. The memory holes 24 are made to extend through the word line conductive layers 23a to 23d. The memory holes 24 are made to align with the end portion of the backgate hole 22 in the first direction.

As shown in FIG. 5, the backgate transistor layer L1 and memory cell transistor layer L2 further include a block insulating layer 25a, charge accumulation layer 25b, tunnel insulating layer 25c, and semiconductor layer 26. The semiconductor layer 26 functions as the body (the back gate of each transistor) of the NAND string 16.

As shown in FIG. 5, the block insulating layer 25a is formed with a predetermined thickness on sidewalls facing the backgate hole 22 and memory holes 24. The charge accumulation layer 25b is formed with a predetermined thickness on the side surfaces of the block insulating layer 25a. The tunnel insulating layer 25c is formed with a predetermined thickness on the side surfaces of the charge accumulation layer 25b. The semiconductor layer 26 is formed in contact with the side surfaces of the tunnel insulating layer 25c. The semiconductor layer 26 is formed to fill the backgate hole 22 and memory holes 24.

The semiconductor layer 26 is formed into a U-shape when viewed in the second direction. That is, the semiconductor layer 26 includes a pair of pillar portions 26a extending in a direction perpendicular to the surface of the semiconductor substrate 20, and a connecting portion 26b connecting the lower ends of the pair of pillar portions 26a.

The block insulating layer 25a and tunnel insulating layer 25c are made of, e.g., silicon oxide ($SiO_2$). The charge accumulation layer 25b is made of, e.g., silicon nitride (SiN). The semiconductor layer 26 is made of polysilicon. The block insulating layer 25a, charge accumulation layer 25b, tunnel insulating layer 25c, and semiconductor layer 26 form MONOS transistors that function as the memory cell transistors MT.

In the arrangement of the backgate transistor layer L1, the tunnel insulating layer 25c is formed to surround the connecting portions 26b. The backgate conductive layer 21 is formed to surround the connecting portions 26b.

Also, in the arrangement of the memory cell transistor layer L2, the tunnel insulating layer 25c is formed to surround the pillar portions 26a. The charge accumulation layer 25b is formed to surround the tunnel insulating layer 25c. The block insulating layer 25a is formed to surround the charge accumulation layer 25b. The word line conductive layers 23a to 23d are formed to surround the block insulating layers 25a to 25c and pillar portions 26a.

As shown in FIGS. 4 and 5, the selection transistor layer L3 includes conductive layers 27a and 27b. The conductive layers 27a and 27b are formed into strips extending in the second direction so as to have a predetermined pitch in the first direction. A pair of conductive layers 27a and a pair of conductive layers 27b are alternately arranged in the first direction. The conductive layer 27a is formed in an upper layer of one pillar portion 26a, and the conductive layer 27b is formed in an upper layer of the other pillar portion 26a.

The conductive layers 27a and 27b are made of polysilicon. The conductive layer 27a functions as the gate (selection gate line SGS) of the selection transistor ST2. The conductive layer 27b functions as the gate (selection gate line SGD) of the selection transistor ST1.

As shown in FIG. 5, the selection transistor layer L3 has holes 28a and 28b. The holes 28a and 28b respectively extend through the conductive layers 27a and 27b. Also, the holes 28a and 28b align with the memory holes 24.

As shown in FIG. 5, the selection transistor layer L3 includes gate insulating layers 29a and 29b, and semiconductor layers 30a and 30b. The gate insulating layers 29a and 29b are respectively formed on sidewalls facing the holes 28a and 28b. The semiconductor layers 30a and 30b are formed into pillars extending in the direction perpendicular to the surface of the semiconductor substrate 20, so as to come in contact with the gate insulating layers 29a and 29b, respectively.

The gate insulating layers 29a and 29b are made of, e.g., silicon oxide ($SiO_2$). The semiconductor layers 30a and 30b are made of, e.g., polysilicon.

In the arrangement of the selection transistor layer L3, the gate insulating layer 29a is formed to surround the pillar semiconductor layer 30a. The conductive layer 27a is formed to surround the gate insulating layer 29a and semiconductor layer 30a. The gate insulating layer 29b is formed to surround the pillar semiconductor layer 30b. The conductive layer 27b is formed to surround the gate insulating layer 29b and semiconductor layer 30b.

As shown in FIG. 4 and FIG. 5, the interconnect layer L4 is formed on the selection transistor layer L3. The interconnect layer L4 includes a source line layer 31, a plug layer 32, and a bit line layer 33.

The source line layer 31 is shaped like a plate extending in the second direction. The source line layer 31 is formed in contact with top surfaces of the pair of semiconductor layers 27a adjacent to the source line layer 31 in the first direction. The plug layer 32 is formed in contact with a top surface of the semiconductor layer 27b so as to extend perpendicularly to the front surface of the semiconductor substrate 20. The bit line layers 33 are formed like stripes arranged at a predetermined pitch in the second direction and extending in the first direction. The bit line layer 33 is formed in contact with a top surface of the plug layer 32. The source line layer 31, the plug layer 32, and the bit line layer 33 are formed of, for example, metal such as tungsten (W). The source line layer 31 functions as the source line SL described with reference to FIG. 3. The bit line layer 33 functions as the bit line BL described with reference to FIG. 3.

FIG. 6 and FIG. 7 show another example of the memory cell array 111. FIG. 6 is a cross-sectional view of the memory cell array 111 taken along a line extending along the bit line direction. FIG. 7 is a perspective view of the memory cell array 111.

As shown in FIG. 6 and FIG. 7, the semiconductor memory device 26 may be shaped like a column rather than being U-shaped as shown in FIG. 4 and FIG. 5. In this case, as shown in FIG. 6 and FIG. 7, the source line layer 31 is formed above the semiconductor substrate. A plurality of columnar semiconductor layers 30 are formed on the source line layer 31. The selection transistor ST2, the memory cell transistors MT0 to MT7, and the selection transistor ST1 are formed in this order from the bottom around the semiconductor layer 30. Moreover, the bit layer 33 is formed. The present configuration eliminates the need for the back gate transistor BT.

1.1.2.3 Row Decoder 12

Now, a configuration of the row decoder 112 will be described with reference to FIG. 8. FIG. 8 is a block diagram of the row decoder 112 and the driver 144. For the row decoder 112, only components associated with any one of the blocks BLK are shown. That is, the row decoder 112 shown in FIG. 8 is provided in each of the blocks BLK. The row decoder 112 selects or unselects the associated block BLK.

As shown in FIG. 8, the row decoder 112 includes a block decoder 41 and a high-withstand-voltage n-channel enhanced (E type) MOS transistors 42 to 46 (42-0 to 42-7, 43-0 to 43-3, 44-0 to 44-3, 45-0 to 45-3, 46-0 to 46-3) and 47.

<Block Decoder 41>

First, the block decoder 41 will be described. During data writing, data reading, and data erasing, the block decoder 41 decodes a block address BA to output signals TG and /RDECA. When the block address BA matches the corresponding block BLK, the signal TG is set to an "H" level. The voltage of the signal TG at the "H" level is set to VPGMH for writing, to VREADH for reading, and to Vdda for erasing. Furthermore, the signal /RDECA is set to an "L" level (for example, 0 V).

On the other hand, when the block address BA fails to match the block BLK, the signal TG is set to the "L" level (for example, 0 V), and the signal /RDECA is set to the "H" level.

VPGMH is a voltage designed to transfer a high voltage VPGM applied to a selected word line during data writing. VPGMH is higher than VPGM. VREADH is a voltage designed to transfer a voltage VREAD applied to unselected word lines during reading. VREADH is higher than VREAD. Vdda is a voltage designed to transfer a voltage Vdd (for example, 0 V). Vdda is higher than Vdd.

<Transistor 42>

Now, the transistor 42 will be described. The transistor 42 is configured to transfer voltages to the word lines WL in the selected block BLK. One end of a current path in each of the transistors 42-0 to 42-7 is connected to a corresponding one of the word lines WL0 to WL7 in the corresponding block BLK. The other end of the current path is connected to a corresponding one of CG0 to CG7. Gates of the transistors 42-0 to 42-7 are all connected to a common signal line TG.

Thus, for example, a row decoder 112-0 corresponding to the selected block BLK0 turns on the transistors 42-0 to 42-7 and connects the word lines WL0 to WL7 to the signal lines CG0 to CG7, respectively. On the other hand, row decoders 112-1 to 112-3 turn off the transistors 42-0 to 42-7 and separates the word lines WL to WL7 from the signal lines CG0 to CG7.

The transistors 42 are used for all the string groups GP in the same block BLK.

<Transistors 43 and 44>

Now, the transistors 43 and 44 will be described. The transistors 43 and 44 are configured to transfer voltages to the selection gate line SGD. One end of the current path in each of the transistors 43-0 to 43-3 is connected to a corresponding one of the selection gate lines SGD0 to SGD3 in the corresponding block BLK. The other end of the current path is connected to a corresponding one of signal lines SGDD0 to SGDD3. Gates of the transistors 43-0 to 43-3 are all connected to the common signal line TG. Furthermore, one end of the current path in each of the transistors 44-0 to 44-3 is connected to a corresponding one of the selection gate lines SGD0 to SGD3 in the corresponding block BLK. The other end of the current path is connected to a node SGD_COM. A gate of each of the transistors 44-0 to 44-3 is supplied with the signal /RDECA. The node SGD_COM has a voltage such as 0 V or a negative voltage VBB which turns off the selection transistor ST1.

Thus, the row decoder 112-0 corresponding to the selected block BLK0 turns on the transistors 43-0 to 43-3, while turning off the transistors 44-0-44-3. Hence, the selection gate lines SGD0 to SGD3 in the selected block BLK0 are connected to the signal lines SGDD0 to SGDD3, respectively.

On the other hand, the row decoders 112-1 to 112-3 corresponding to the unselected block BLK1 to BLK3 turns off the transistors 43-1 to 43-3, while turning on the transistors 44-1 to 44-3. Hence, the selection gate lines SGD0 to SGD3 in the unselected blocks BLK1 to BLK3 are connected to the node SGD_COM.

<Transistors 45 and 46>

The transistors 45 and 46 are configured to transfer voltages to the selection gate line SGS. The connections and operations of the transistors 45 and 46 are equivalent to the connections and operations of the transistors 43 and 44 for which the selection gate line SGD is replaced with the selection gate line SGS.

That is, the row decoder 112-0 corresponding to the selected block BLK0 turns on the transistors 45-0 to 45-3, while turning off the transistors 46-0 to 46-3. On the other hand, the row decoders 112-1 to 112-3 corresponding to the unselected blocks BLK1 to BLK3 turn off the transistors 43-1 to 43-3, while turning on the transistors 44-1 to 44-3.

<Transistor 47>

Now, the transistor 47 will be described. The transistor 47 is designed to transfer voltages to the back gate line BG. One end of the current path in the transistor 47 is connected to the back gate line BG in the corresponding block BLK. The other end of the current path is connected to a signal BGD. A gate of the transistor 47 is connected to the signal line TG similarly to the other transistors.

Thus, the row decoder 112 corresponding to the selected block BLK0 turns on the transistor 47. The row decoders 112-1 to 112-3 corresponding to the unselected blocks BLK1 to BLK3 turn off the transistors 47.

Of course, if the memory cell array 111 has the configuration shown in FIG. 6 and FIG. 7, the transistor 47 is not needed.

1.1.2.4 Driver 144

Now, a configuration of the driver 144, particularly a configuration of the row decoder 112 configured to transfer voltages, will be described with further reference to FIG. 8. The driver 144 transfers voltages required for data writing, data reading, and data erasing to each of the signal lines CG0 to CG7, SGDD0 to SGDD3, SGSD0 to SGSD3, and BGD.

As shown in FIG. 8, the driver 144 includes a CG driver 51 (51-0 to 51-7), an SGD driver 52 (52-0 to 52-3), an SGS driver 53 (53-0 to 53-3), a BG driver 54, and a voltage driver 55.

The voltage driver 55 receives a voltage from the charge pump 142 and transfers the required voltages to the block decoder 41 and the CG driver 51 as voltages VRDEC and VCGSEL. The CG drivers 51-0 to 51-7 transfers the required voltages to the signal lines CG0 to CG7 (word lines WL0 to WL7) according to a page address. The SGD drivers 52-0 to 52-3 transfers the required voltages to the signal lines SGDD0 to SGDD3 (selection gate lines SGD0 to SGD3). The SGD drivers 53-0 to 53-3 transfers the required voltages to the signal lines SGSD0 to SGSD3 (selection gate lines SGS0 to SGS3). The BG driver 54 transfers the required voltage to the signal line BGD.

1.2 Method for Testing the NAND Flash Memory 100

1.2.1 Test Method

Now, a method for testing the NAND flash memory 100 configured as described above will be described. According to the present method, if a defective block is present in the memory cell array 111, the defective block is managed according to the degree of the defect.

Figure 9:
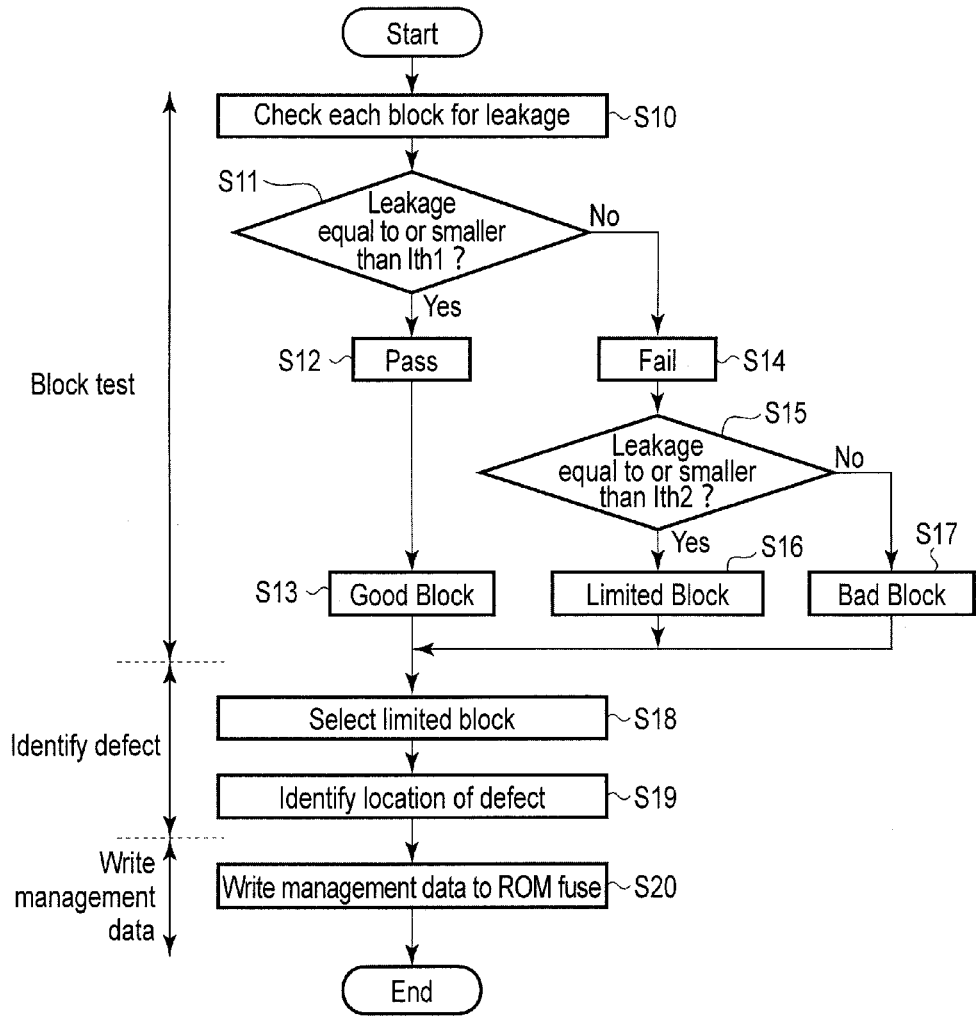
FIG. 9 is a flowchart of a test method according to the first embodiment.

FIG. 9 is a flowchart of the test method executed on the NAND flash memory 100 before shipment. The NAND flash memory 100 is tested by a tester. The tests are executed roughly in the following order: a block test, identification of a location of defect, and writing management data.

As shown in FIG. 9, the tester carries out a leakage check on each of the blocks BLK in the memory cell array 111 (step S10).

If the leakage check results in a leakage amount of equal to or smaller than Ith1 (step S11, YES), the block BLK passes the test (step S12). Thus, the tester records the block BLK as a good block (step S13).

If the leakage check results in a leakage amount of greater than Ith1 (step S11, NO), the block BLK fails the test (step S14). If the block BLK fails the test and the leakage amount is further greater than Ith2 (step S15, NO), the tester records the block BLK as a bad block (step S17). The block BLK recorded as a bad block is inhibited from being used.

In step S15, if the leakage amount is equal to or smaller than Ith2 (step S15, YES), that is, the leakage amount is greater than Ith1 and equal to or smaller than Ith2, the tester records the block BLK as a limited block (step S16). That is, the degree (significance) of the defect can be estimated based on the leakage amount (for example, the amount of leakage current). This enables determination of whether the block needs to be treated as a bad block because of the presence of somewhat large amount of physical defects or the block may be considered to be a limited block because the defects are present in a part of the block but is not so critical (not so large in amount) as to make the block considered to be bad block. This processing can be carried out utilizing, for example, a function provided in the NAND flash memory to check each of the blocks for leakage.

Processing in steps S10 to S17 described below is executed on all the blocks BLK in the memory cell array 111. Subsequently, the tester identifies locations of defects.

That is, the tester first selects limited blocks (step S18). The tester then identifies the locations of defects of the limited blocks (step S19). The defects assumed according to the present embodiment are occurred by short-circuiting, for example, the word lines WL, the selection gate lines SGD, and the selection gate lines SGS. Other examples of defects will be described in the sixth embodiment.

The above-described processing in steps S18 and S19 is executed on all the blocks BLK recorded as limited blocks. Of course, if no limited block is present in the memory cell array 111, the processing in step S18 and S19 is omitted.

Subsequently, the tester writes management data to the memory cell array 111 (step S20). The management data includes the block addresses of the bad block and the limited block obtained as a result of the block test and information on the locations of defects obtained in step S19. The management data is written to a ROM fuse for the memory cell array 111.

1.2.2 Management Data

Figure 10:
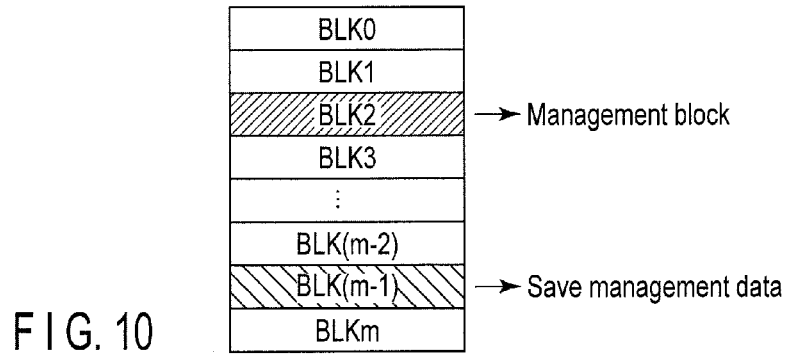
FIG. 10 is a schematic diagram of the memory cell array according to the first embodiment.

Now, the management data obtained in FIG. 9 will be described. FIG. 10 is a schematic diagram of the memory cell array 111. As shown in FIG. 10, for example, it is assumed that the block BLK2 is recorded as a limited block. Then, management data including information on the limited block is written to, for example, the block BLK (m−1) (m is a natural number of at least two).

FIG. 11 is a schematic diagram of the block BLK (m−1). As shown in FIG. 11, two pages PG in the block BLK (m−1) are used as ROM fuse areas. The management data includes the following:

(a) Bad column information BOOL
(b) Bad block information BBLK1
(c) Limited block information BBLK2
(d) Limited block information BBLK3
(e) Trimming information TRIM
(f) Bad word line information BWL
(g) Bad select gate information (BSG).

BCOL is information on bad columns (bad bit lines BL), for example, the block addresses of the bad columns. BBLK1 is information on bad blocks, for example, the block addresses of the bad blocks. BBLK2 is information on limited blocks including short-circuited word lines WL, for example, the block addresses of limited blocks. BBLK3 is information on limited blocks including the short-circuited selection gate lines SGD and SGS, for example, the block addresses of limited blocks. The trimming information relates to the circuit operation of the NAND flash memory 100. BWL is information on the short-circuited word lines WL, for example, word line addresses (page addresses). BSG is information on the short-circuited selection gate lines SGD and SGS, for example, selection gate line addresses (string addresses).

In the example in FIG. 11, the information BCOL, BBLK1, BBLKL2, BBLK3, and TRIM is held in a certain page PG1 and the information BWL and BSG is held in another page PG2.

1.3 Operation of the Memory System

Now, the operation of the controller 200 and NAND flash memory 100 in the memory system configured as described above.

1.3.1 Operation of the Controller 200

First, the operation of controller 200 will be described with reference to FIG. 12. FIG. 12 is a flowchart showing a general flow of a control operation performed on the NAND flash memory 100 by the controller 200.

As shown in FIG. 12, the controller 200 first powers on the NAND flash memory 100 (step S30). Then, the controller 200 receives the information stored in the ROM fuse (management data), from the NAND flash memory 100 (step S31). The information received in this step is held in the page PG1 in FIG. 11 and includes the bad block information BBLK1 and the limited block information BBLK2 and BBLK3.

The controller 200 continues to receive the remaining part of the management data from the NAND flash memory 100 (step S32). The information received in this step includes bad word line information BWL and bad selection gate line information BSG.

Steps S31 and S32 may be carried out in response to a request from the controller 200 or may be voluntarily carried out by the NAND flash memory 100 without reception of a request from the controller 200 (POR: Power on Read).

The controller 200 stores the received information in, for example, the RAM 220. Then, in response to a request from the host apparatus 300, the controller 200 accesses the NAND flash memory 100 (step S33). Based on the information BBLK1 to BBLK3 in the RAM 220, the controller 200 accesses good blocks and limited blocks and avoids accessing bad blocks.

FIG. 13 shows examples of instructions from the controller 200 for reading accesses and writing accesses to the NAND flash memory 100.

A command "Read(x)" is an instruction to read data from an address x in a good block and cannot access any limited block.

A command "ReadLBLKm(x)" is an instruction to read data from an address x in a limited block. The command "ReadLBLKm(x)" includes an instruction to control at least two short-circuited interconnects to the same potential. However, the command "ReadLBLKm(x)" cannot access any bad word line itself in a limited block.

A command "Program(x)" is an instruction to write data to an address x in a good block. The command "Program(x)" cannot access any limited block.

A command "ProgramLBLKm(x)" is an instruction to write data to an address x in a limited block. The command "ProgramLBLKm(x)" includes an instruction to control at least two short-circuited interconnects to the same potential. However, the command "ProgramLBLKm(x)" cannot access any bad word line in a limited block.

1.3.2 Operation of the NAND Flash Memory 100

Figure 14:
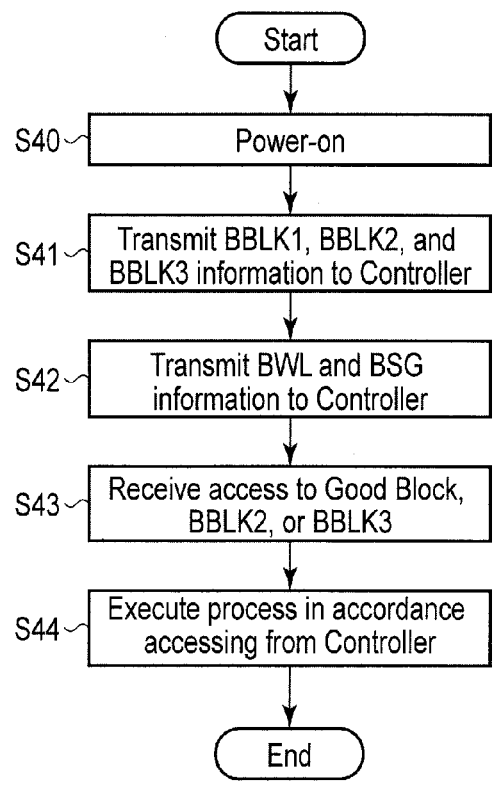
FIG. 14 and FIG. 15 are flowcharts of the operation of the semiconductor memory device according to the first embodiment.

Now, the operation of the NAND flash memory 100 will be described with reference to FIG. 14. FIG. 14 is a flowchart generally showing the flow of the operation of the NAND flash memory 100.

As shown in FIG. 14, when activated by being powered on by the controller 200 (step S40), the NAND flash memory 100 reads data from the ROM fuse. More specifically, the NAND flash memory 100 reads data from the page PG1 in FIG. 11 and transfers the read data to the controller 200 (step S41). In step S41, the information BBLK1 to BBLK3 is transferred to the controller 200.

The NAND flash memory 100 continues to read data from the page PG2 in FIG. 11 and transfers the read data to the controller 200 (step S42). In step S42, the information BWL and BSG is transferred to the controller 200.

The processing in steps S41 and S42 is carried out immediately after the activation. Subsequently, upon receiving an instruction to access a good block or a limited block (step S43), the NAND flash memory 100 carries out processing in accordance with the received instruction (step S44).

Figure 15:
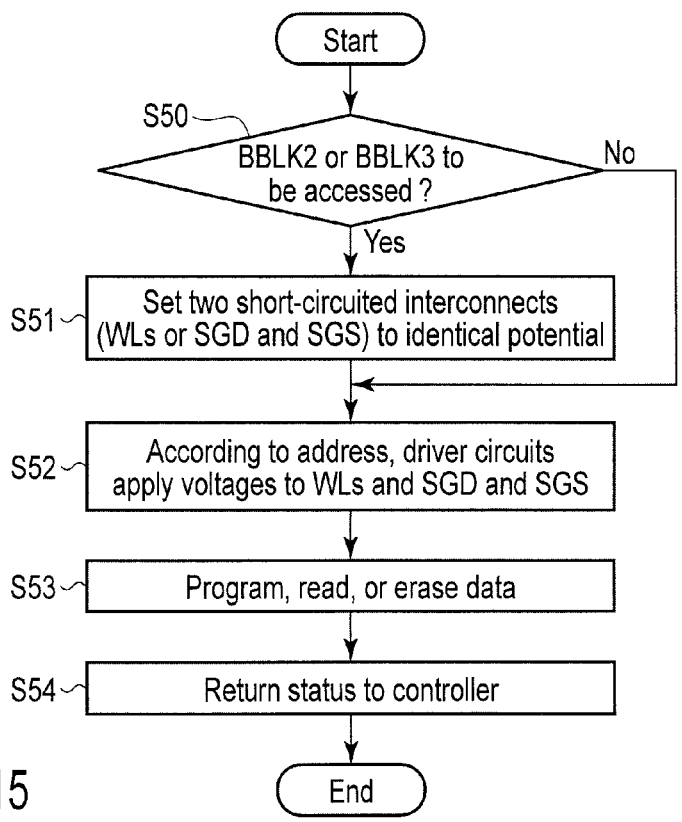

FIG. 15 is a flowchart showing step S44 in detail. As shown in FIG. 15, if a good block is to be accessed (step S50, NO), the NAND flash memory 100 performs normal control. That is, according to the page address, the drivers 52 to 54 apply predetermined voltages to the selected word line, the unselected word lines, and the selection gate line (step S52). As a result, the data is programmed, read, or erased (step S53). The NAND flash memory 100 returns the status of the processing (pass or fail) to the controller 200 (step S54).

If a limited block (BBLK2 or BBLK3) is to be accessed (step S50, YES), the NAND flash memory 100 sets the two short-circuited interconnects to the same potential (step S51). For example, if a limited block includes two short-circuited word lines, the NAND flash memory 100 sets the shot-circuited word lines to the same potential. This also applies to the selection gate lines SGD and SGS. The NAND flash memory 100 performs normal control on the other interconnects (step S52).

Figure 17:
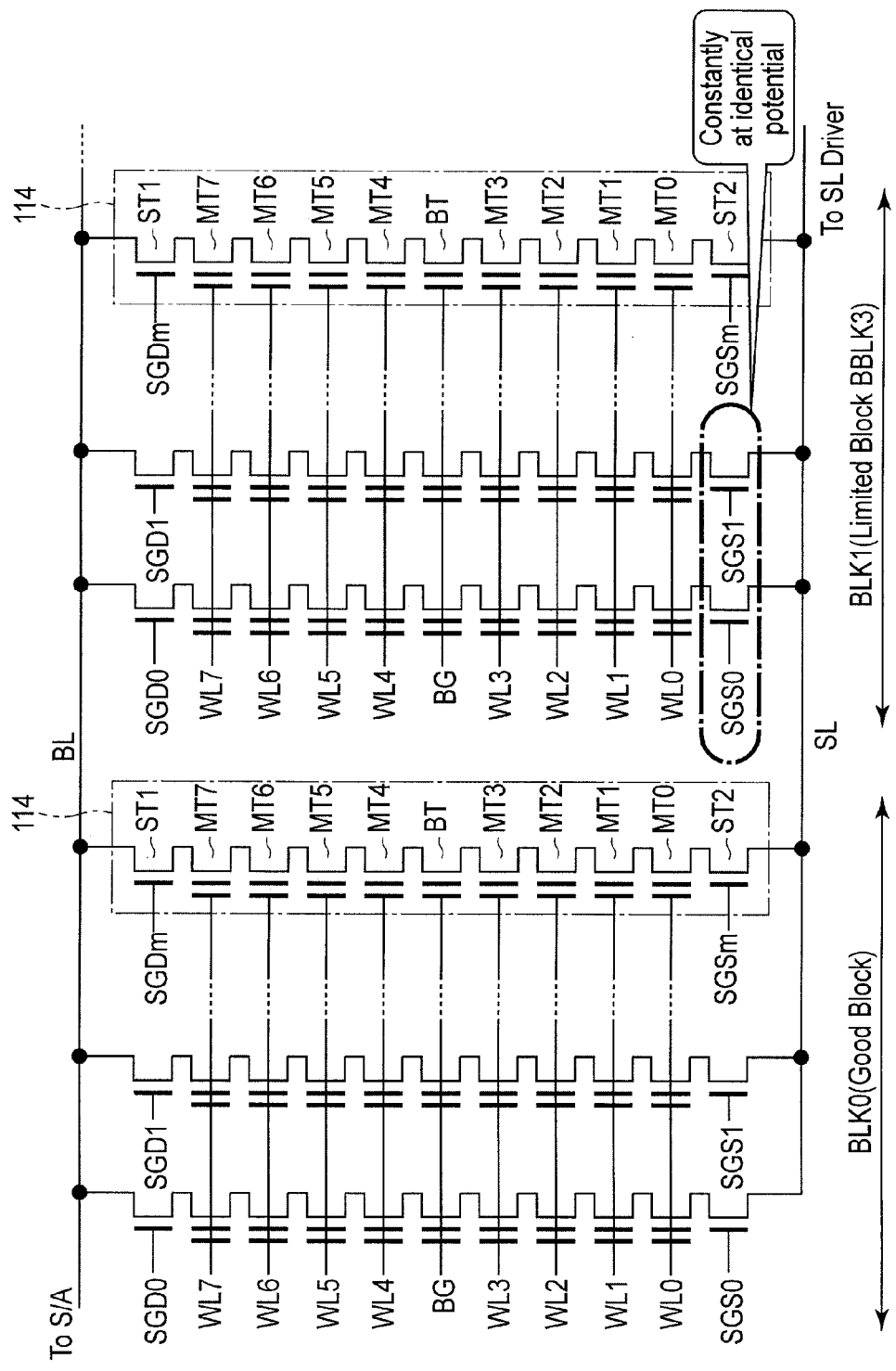

This operation is shown in FIG. 16 to FIG. 18. FIG. 16 to FIG. 18 are circuit diagrams of a good block BLK0 and a limited block BLK1.

FIG. 16 shows that the two word lines WL1 and WL2 in the limited block BLK1 are short-circuited. In this case, the two word lines WL1 and WL2 are constantly at the same potential. That is, when the limited block BLK1 is selected, the CG drivers 51-1 and 51-2, described with reference to FIG. 8, constantly output the same potential. Such control is not performed on the good block BLK0.

FIG. 17 shows that the two selection gate lines SGS0 and SGS1 in the limited block BLK1 are short-circuited. In this case, the two selection gate lines SGS0 and SGS1 are constantly at the same potential. That is, when the limited block BLK1 is selected, the SGS drivers 53-0 and 53-1, described with reference to FIG. 8, constantly output the same potential.

FIG. 18 shows that the two selection gate lines SGD0 and SGD1 in the limited block BLK1 are short-circuited. In this case, the two selection gate lines SGD0 and SGD1 are constantly at the same potential. That is, when the limited block BLK1 is selected, the SGD drivers 52-0 and 52-1, described with reference to FIG. 8, constantly output the same potential.

1.4 Effects According to the Present Embodiment

As described with reference to FIG. 4 to FIG. 7, in the three-dimensional stack NAND flash memory, the bit line BL and the source line SL are connected together by the memory hole 24. The selection gate lines SGD and SGS are present in order to select each memory hole 24. Moreover, a plurality of word lines WL are formed.

As described above, a plurality of selection gate lines SGD and SGS are provided independently in each of the layers, whereas a plurality of word lines WL in each of the layers are connected each other (see FIG. 3, FIG. 6, and FIG. 7). The reason is that if the word lines WL are provided independently for the respective string groups GP, the number of word lines (the number of CG lines) increases consistently with the number of stacks of the word lines WL, making withdrawal of the CG lines and arrangement of the decoders difficult.

Therefore, the word lines WL are shared between the plurality of strings to suppress an increase in the area of a chip. On the other hand, the shared word lines WL increase the block size. As is apparent from FIG. 3, one string group GP corresponds to one block in a planar NAND flash memory in which memory cells are two-dimensionally formed. That is, the size of one block in the three-dimensional stack NAND flash memory is equivalent to the size of several blocks in the planar NAND flash memory.

The size of the erase unit increases consistently with the block size. As a result, performance may be degraded or the size of defect replacement units may increase, thus reducing manufacturing yield. Possible defects include short-circuiting between the word lines adjacent to each other in vertical direction to the surface of the substrate, short-circuiting between the adjacent selection gate lines SGS, and short-circuiting between the adjacent selection gate lines SGD. The conventional art treats all these defects as block defects. That is, the conventional art treats the defects as bad blocks and inhibits all the memory cells in the bad blocks from being used. This may increase the number of bad blocks to reduce the manufacturing yield.

In contrast, the present embodiment performs appropriate voltage control on blocks including short-circuiting defects. This restrains the short-circuiting defect from affecting the operation to avoid considering the blocks to be bad block.

That is, in addition to the conventional bad block information BBLK1, the information BBLK2 and BBLK3 on blocks including short-circuiting is provided in the ROM fuse. More specifically, during tests, the blocks are checked for leakage, and the following blocks are recorded as limited blocks: those of the blocks which have a leakage amount exceeding the range within which the blocks are considered to be good but falling within a predetermined range.

The controller 200 accesses the NAND flash memory 100 based on the information BBLK1 to BBLK3. Then, based on the information BWL and/or BSG, the controller 200 controls the NAND flash memory 100 so that for those of the blocks including short-circuiting defects, at least two short-circuited interconnects are set to the same potential. Setting the interconnects to the same potential can restrain the short-circuiting defect from affecting the operation.

Thus, the present embodiment can avoid considering the block to be bad block based only on the presence of a short-circuiting defect. Therefore, the present embodiment can improve the manufacturing yield of the NAND flash memory.

2. Second Embodiment

Now, a semiconductor memory device and a controller for the semiconductor memory device according to a second embodiment will be described. The present embodiment will more specifically describe the operation described in the first embodiment. Only differences from the first embodiment will be described below.

2.1 Reading Operation

First, a read operation will be described.

2.1.1 Bias Relations During Reading

Bias relations during reading operation will be described with reference to FIG. 19. FIG. 19 is a circuit diagram of one block BLK. FIG. 19 shows that the block BLK includes the two string groups GP0 and GP1 and that data is to be read from the word line WL2 in the string group GP0.

As shown in FIG. 19, the sense amplifier 113 precharges the bit line BL to a voltage VPRE. Furthermore, the driver 144 applies a voltage VCGR to the selected word line WL2. VCGR is a voltage corresponding to the desired level for reading. Additionally, a voltage VREAD is applied to the unselected word lines WL0, WL1, and WL3 to WL7. VREAD is a high voltage which turns on the memory cell transistor MT regardless of data held in the memory cell transistor layer MT. A voltage VCG_BGV is applied to the back gate line BG. VCG_BGV is a voltage which turns on the back gate transistor BT. These voltages are provided to each of the string groups GP0 and GP1.

Moreover, the driver 144 applies a voltage VSG (for example, 5 V) to the selection gate lines SGD0 and SGS0. VSG is a voltage which turns on the transistors ST1 and ST2. Furthermore, for example, 0 V is applied to the selection gate lines SGD1 and SGS1.

As a result, in the selected string group GP0, the selection transistors ST1 and ST2 are turned on. Thus, when the memory cell transistor MT in the read target page is turned, a current flows from the corresponding bit line BL to the corresponding source line SL. On the other hand, when the memory cell transistor MT is turned off, the flow of a current is prevented.

On the other hand, in the unselected string group GP1, the selection transistors ST1 and ST2 are turned off. Hence, no data is read from the unselected string group GP1.

FIG. 19 is only illustrative, and for example, a positive voltage VSRC (for example, 2.5 V) may be applied to the source line SL. In this case, the potentials of the bit line BL, the word lines WL, the back gate line BG, and the selection gate lines SGD and SGS are set by adding VSRC to the above-described voltages.

2.1.2 Access to a Good Block

Figure 20:
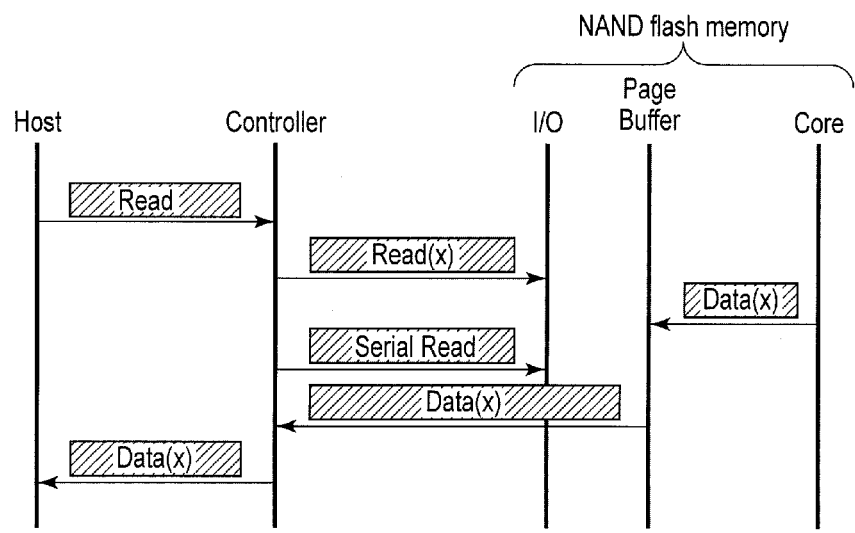
FIG. 20 is a sequence diagram showing processing carried out by a memory system according to the second embodiment.

Now, a read access to a good block will be described with reference to FIG. 20. FIG. 20 is a flowchart showing the flow of instructions between the host apparatus 300 and the controller 200 and the NAND flash memory (input/output unit 130, page buffer 120, and core unit 110) when data is read from a good block.

As shown in FIG. 20, upon receiving a read access from the host apparatus 300, the controller 200 issues a read command "Read(x)". In response, the NAND flash memory 100 reads data out into the page buffer 120 in units of pages under the control of the sequencer 141.

Subsequently, the controller 200 serially reads data from the page buffer 120. That is, the data is sequentially read by toggling a clock signal (signal /RE). Thereafter, the controller 200 transfers the read data to the host apparatus 300.

Figure 21:
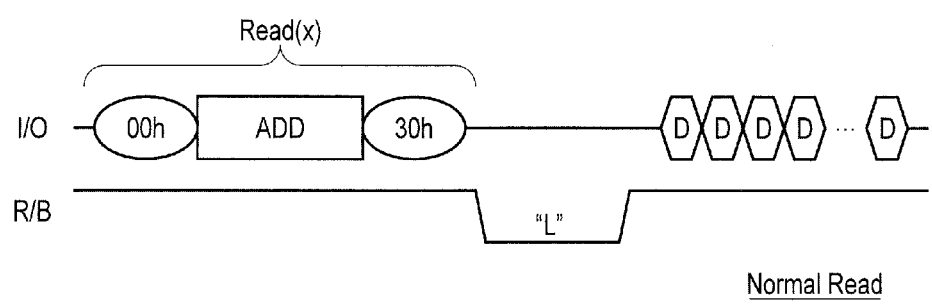
FIG. 21 is a command sequence diagram of a semiconductor memory device according to the second embodiment.

FIG. 21 is a timing chart showing the state of a command sequence on the NAND bus and a ready/busy signal when data is read from a good block. The ready/busy signal (R/B signal) is indicative of the state of the NAND flash memory 100. For R/B="H", the NAND flash memory 100 is ready and can accept commands. In contrast, for R/B="L", the NAND flash memory 100 is busy and does not accept any commands.

As shown in FIG. 21, the controller 200 first issues a command "00h" specified by the NAND interface. "00h" is a first read command. Input of "00h" allows the NAND flash memory 100 to recognize the start of a read operation. The controller 200 continues to issue an address ADD. The controller 200 thereafter issues "30h". "30h" is a second read command. Reception of the second read command allows the NAND flash memory 100 to start a read operation and to be placed into a busy state. Subsequently, data D read from the page corresponding to the address ADD is transferred serially from the page buffer 120 to the controller 200.

That is, "Read(x)" described with reference to FIG. 20 corresponds to the command sequence from the command "00h" to the command "30h".

2.1.3 Access to a Limited Block

Figure 22:
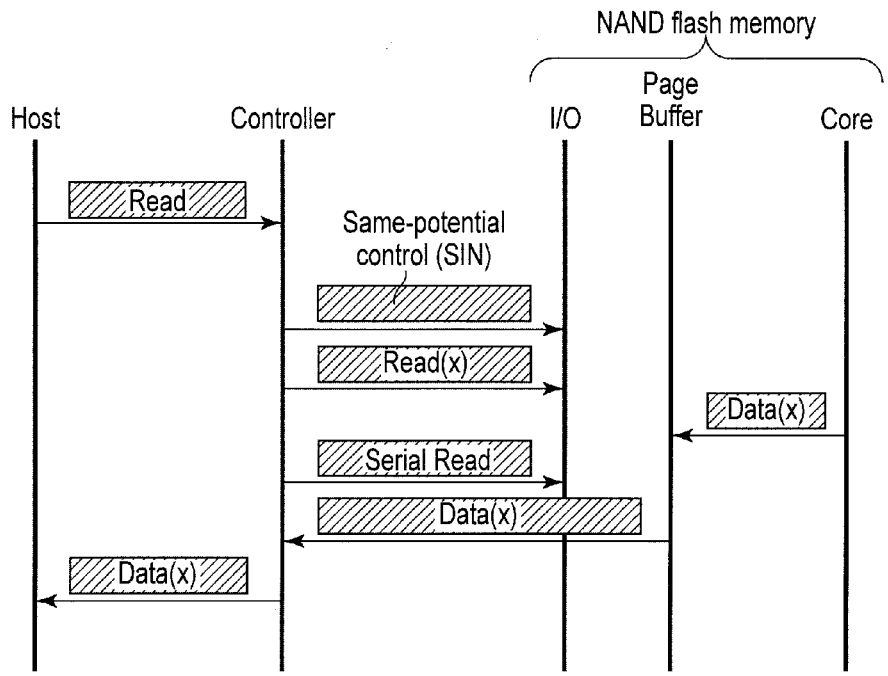
FIG. 22 is a sequence diagram showing processing carried out by the memory system according to the second embodiment.

Now, a read access to a limited block will be described with reference to FIG. 22. FIG. 22 is a flowchart showing the flow of instructions between the host apparatus 300 and the controller 200 and the NAND flash memory (input/output unit 130, page buffer 120, and core unit 110) when data is read from a limited block.

FIG. 22 is different from FIG. 20 described in conjunction with a good block in that a same-potential control instruction is issued, together with the command "Read(x)", to the NAND flash memory 100 by the controller 200. That is, "Read_LBLKm(x)" described with reference to FIG. 13 corresponds to a combination of "Read(x)" with the same-potential control instruction. A description "SIN" in FIG. 22 means replacement of SIN codes, which will be described in a fourth embodiment.

Figure 23:
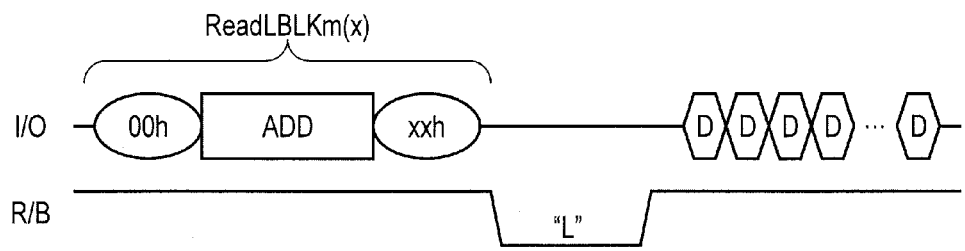
FIG. 23 is a command sequence diagram of the semiconductor memory device according to the second embodiment.

FIG. 23 is a timing chart showing the state of the command sequence on the NAND bus and the ready/busy signal when data is read from a limited block.

As shown in FIG. 23, the controller 200 first issues the command "00h" specified by the NAND interface, and then issues an address ADD. Subsequently, the controller 200 issues a new command "xxh". "xxh" is a second read command which replaces "30h" and includes, for example, the meaning of the same-potential control instruction. Upon receiving "xxh", the NAND flash memory 100 performs a read operation while controlling short-circuited interconnects to the same potential. Subsequently, the data D is serially transferred to the controller 200. Information on the short-circuited interconnects can be communicated to the NAND flash memory by various methods. An example of such a method will also be described in the fourth embodiment.

2.2 Writing Operation

Now, a writing operation will be described.

2.2.1 Bias Relations During Writing

Bias relations during writing operation will be described with reference to FIG. 24. FIG. 24 is a circuit diagram of one block BLK. FIG. 24 shows that the block BLK includes the two string groups GP0 and GP1 and that data is to be written to the word line WL2 in the string group GP0.

As shown in FIG. 24, the sense amplifier 113 provides the voltage VDD or 0 V to the bit line BL depending on program data. A column to which the data is to be written (in which charge is injected into the charge accumulation layer to increase a threshold) is provided with 0 V. VDD is provided to columns to which the data is not to be written. Furthermore, the selected word line WL2 is provided with the program voltage VPGM (for example, 20 V; the voltage depends on the write level). VPGM is a high voltage designed to inject charge into the charge accumulation layer. A voltage VPASS (10 V<VPASS<VPGM) is applied to the unselected word lines WL0, WL1, and WL3 to WL7. VPASS is a high voltage which turns on the memory cell transistor MT regardless of the data held in the memory cell transistor MT. The voltage VCG_BGV is applied to the back gate line BG. VCG_BGV turns on the back gate transistor BT. These voltages are all provided to each of the string groups GP0 and GP1.

Moreover, the driver 144 applies the voltage VSGD to the selection gate line SGD0. VSGD is a voltage which turns on the selection transistor ST1 with 0 V applied to the bit line BL (that is, a drain) and which cuts off the selection transistor ST1 with VDD applied thereto. The selection gate line SGS0 is provided with 0 V to turn off the selection transistor ST2. The selection gate lines SGD1 and SGS1 are also provided with 0 V.

As a result, in the string groups GP0 and GP1, channels are formed in the memory cell transistors MT0 to MT7. In the selected string group GP0, the selection transistor ST1 is turned on in the NAND string 114 with 0 V applied to the bit line BL. Thus, 0 V is transferred to the channel of the memory cell transistor MT2 and injected into the charge accumulation layer. On the other hand, in the NAND string 114 with VDD applied to the bit line BL, the selection transistor ST1 is cut off. As a result, the potential in the NAND string 114 is placed into a floating state and increases as a result of capacitive coupling with the word line WL. This prevents charge from being injected into the charge accumulation layer of the memory cell transistor MT2, precluding data writing.

In the unselected string group GP1, the selection transistors ST1 and ST2 are turned off. Thus, no data is written to the unselected string group GP2.

2.2.2 Access to Good Block

Figure 25:
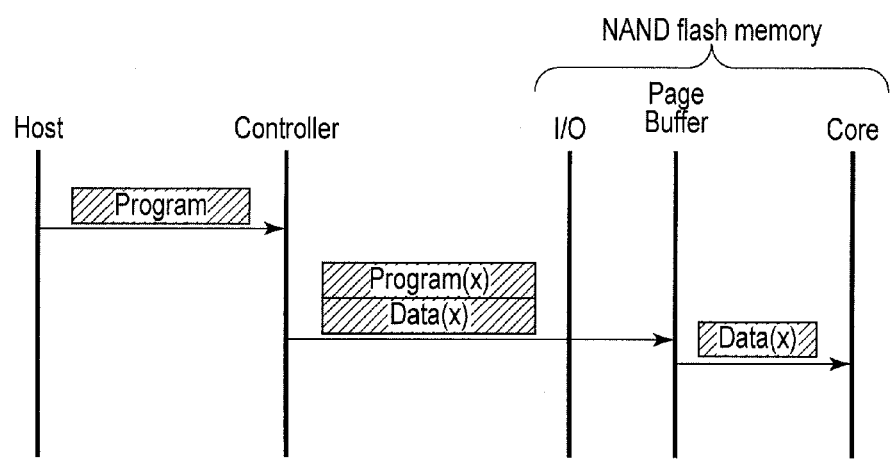
FIG. 25 is a sequence diagram showing processing carried out by the memory system according to the second embodiment.

Now, a writing access to a good block will be described with reference to FIG. 25. FIG. 25 is a flowchart showing the flow of instructions between the host apparatus 300 and the controller 200 and the NAND flash memory (input/output unit 130, page buffer 120, and core unit 110) when data is written into a good block.

As shown in FIG. 25, upon receiving a writing access from the host apparatus 300, the controller 200 issues a write command "Program(x)" and transfers program data to the page buffer 120. In response, the NAND flash memory 100 writes data in the page buffer 120 to the memory cell array 111 in units of pages under the control of the sequencer 141.

Figure 26:
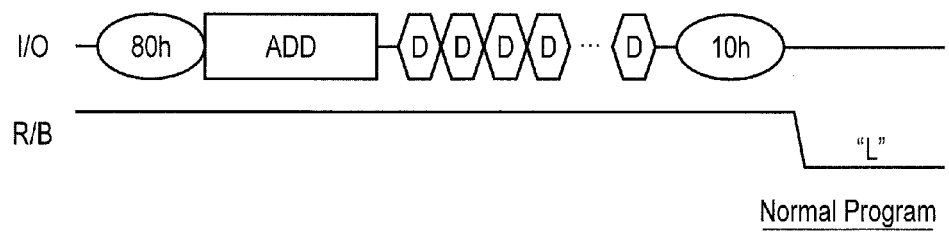
FIG. 26 is a command sequence diagram of the semiconductor memory device according to the second embodiment.

FIG. 26 is a timing chart showing the state of the command sequence on the NAND bus and the ready/busy signal when data is written into a good block.

As shown in FIG. 26, the controller 200 first issues a command "80h" specified by the NAND interface. "80h" is a first write command. Input of "80h" allows the NAND flash memory 100 to recognize the start of a writing operation. The controller 200 continues to issue an address ADD. The controller 200 further serially transfers program data D. The controller 200 finally issues "10h". "10h" is a second write command. Reception of the second write command allows the NAND flash memory 100 to start a writing operation and to be placed into the busy state. Subsequently, the data D in the page buffer 120 is written, in units of pages, to the page corresponding to the address ADD.

That is, "Program(x)" and "Data(x)" shown in FIG. 25 correspond to the command sequence from the command "80h" to the command "10h" in FIG. 26.

2.2.3 Access to a Limited Block

Now, a writing access to a limited block will be described with reference to FIG. 27. FIG. 27 is a flowchart showing the flow of instructions between the host apparatus 300 and the controller 200 and the NAND flash memory (input/output unit 130, page buffer 120, and core unit 110) when data is written to a limited block.

FIG. 27 is different from FIG. 25 described in conjunction with a good block in that the same-potential control instruction is issued, together with the command "Program(x)", to the NAND flash memory 100 by the controller 200. That is, "Program_LBLKm(x)" described with reference to FIG. 13 corresponds to a combination of "Program(x)" with the same-potential control instruction.

FIG. 28 is a timing chart showing the state of the command sequence on the NAND bus and the ready/busy signal when data is written into a limited block.

As shown in FIG. 28, the controller 200 issues, in the sequence described with reference to FIG. 26, a new command "yyh" instead of "10h". "yyh" is a second write command which replaces "10h" and includes, for example, the meaning of the same-potential control instruction. Upon receiving "yyh", the NAND flash memory 100 performs a write operation while controlling short-circuited wires to the same potential.

2.3 Erasing Operation

Now, an erasing operation will be described.

2.3.1 Bias Relations During Erasing

Bias relations during erasing operation will be described with reference to FIG. 29. FIG. 29 is a circuit diagram of one block BLK. FIG. 29 shows that data is erased, at a time, from the two string groups GP0 and GP1 included in the block BLK.

As shown in FIG. 29, the driver 144 applies an erase voltage VERA (for example, 20 V) to the bit line BL and the source line SL. Furthermore, VERA_SG (for example, 12 V) is applied to the selection gate lines SGD0, SGD1, SGS0, and SGS1. This results in GIDL (Gate Induced Drain Leakage) at a selection gate end. The GIDL generates a pair of a hole and an electron, and the hole enters the pillar 26, which has a lower voltage. Thus, the potential of the pillar 26 rises to the erase voltage VERA.

Then, 0 V is applied to all the word lines WL to retrieve the hole into the charge accumulation layer. Thus, the data is erased.

The erasing may be achieved in units of string groups GP. In this case, VERA may be applied to the selection gate lines SGD and SGS in the unselected string group, or the selection gate lines SGD and SGS may be placed into the floating state.

2.3.2 Access to a Good Block

Now, an erasing access to a good block will be described with reference to FIG. 30. FIG. 30 is a flowchart showing the flow of instructions between the host apparatus 300 and the controller 200 and the NAND flash memory (input/output unit 130, page buffer 120, and core unit 110) when data is erased from a good block.

As shown in FIG. 30, the controller 200 receives an erasing access from the host apparatus 300 and then issues an erase command "Erase(x)". In response, the NAND flash memory 100 performs an erasing operation under the control of the sequencer 141.

FIG. 31 is a timing chart showing the state of the command sequence on the NAND bus and the ready/busy signal when data is erased from a good block.

As shown in FIG. 31, the controller 200 first issues a command "60h" specified by the NAND interface. "60h" is a first erase command. Input of "60h" allows the NAND flash memory 100 to recognize the start of an erasing operation. The controller 200 continues to issue an address ADD. The controller 200 finally issues "D0h". "D0h" is a second erase command. Reception of the second erase command allows the NAND flash memory 100 to start an erasing operation and to be placed into the busy state. The NAND flash memory 100 erases the data in the block BLK (or the string group GP) corresponding to the address ADD, at a time.

2.3.3 Access to a Limited Block

Now, an erase access to a limited block will be described with reference to FIG. 32. FIG. 32 is a flowchart showing the flow of instructions between the host apparatus 300 and the controller 200 and the NAND flash memory (input/output unit 130, page buffer 120, and core unit 110) when data is erased from a limited block.

FIG. 32 is different from FIG. 30 described in conjunction with a good block in that the same-potential control instruction is issued, together with the command "Erase(x)", to the NAND flash memory 100 by the controller 200.

FIG. 33 is a timing chart showing the state of the command sequence on the NAND bus and the ready/busy signal when data is erased from a limited block.

As shown in FIG. 33, the controller 200 issues, in the sequence described with reference to FIG. 31, a new command "zzh" instead of "D0h". "zzh" is a second erase command which replaces "D0h" and includes, for example, the meaning of the same-potential control instruction. Upon receiving "zzh", the NAND flash memory 100 performs a erasing operation while controlling short-circuited wires to the same potential.

2.4 Effects According to the Present Embodiment

The first embodiment can be implemented by, for example, the method described in the present embodiment.

3. Third Embodiment

Now, a semiconductor memory device and a controller for the semiconductor memory device according to the third embodiment will be described. The present embodiment corresponds to the first and second embodiment in which the bad word line information BWL and the bad selection gate line information BSG are read during a data access to the NAND flash memory 100 rather than at the time of power-on. Only differences from the first and second embodiments will be described.

3.1 Operation

The operation of the memory system according to the present embodiment will be described. The test operation according to the present embodiment is similar to the test operation shown in FIG. 9 to FIG. 11, described in the first embodiment, and will thus not be described.

3.1.1 General Operation of the Controller

First, a general operation of the controller will be described with reference to FIG. 34. FIG. 34 is a flowchart of the operation of the controller 200 and corresponds to FIG. 12 described in the first embodiment.

As shown in FIG. 34, the controller 200 receives the data in the page PG1 in FIG. 11 which has been read by POR (Power On Read) immediately after the NAND flash memory 100 is powered on. That is, the controller 200 receives the bad block information BBLK1 and the limited block information BBLK2 and BBLK3. POR is a reading operation voluntarily performed by the NAND flash memory 100 when the NAND flash memory 100 is powered on.

The present embodiment is different from the first embodiment in that POR does not read from the page PG2.

Thereafter, if the host apparatus makes an access request to the controller 200, the controller 200 determines whether a good block or a limited block is to be accessed (step S60). If a good block is to be accessed (step S60, YES), the controller 200 performs a normal operation (step S61). The normal operation is similar to the procedure described in the first embodiment.

On the other hand, if a limited block is to be accessed (step S60, NO), the controller 200 reads the bad word line information BWL and bad selection gate line information BSG corresponding to the limited block (step S62). The controller 200 then accesses the limited block as is the case with the first embodiment (step S63).

3.1.2 Reading Operation

Figure 35:
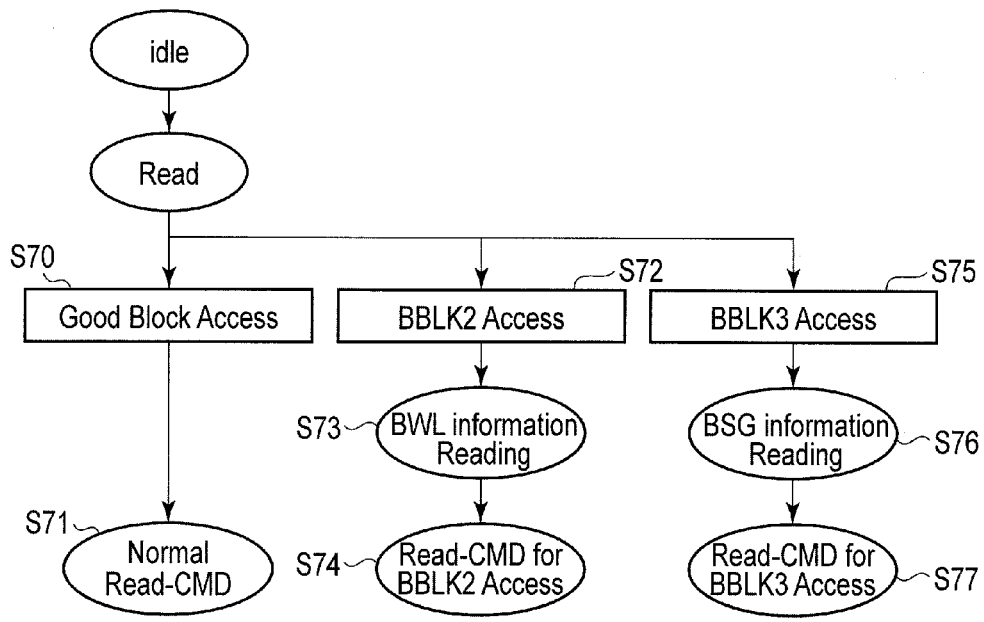

Now, a reading operation performed on a limited block will be described with reference to FIG. 35. FIG. 35 is a flowchart showing an operation performed by the controller 200 in an idle state upon receiving a read access from the host apparatus 300.

As shown in FIG. 35, if a good block is to be accessed (step S70), the controller 200 issues a normal read command. This operation is similar to the operation shown in FIG. 20 and FIG. 21, described in the second embodiment.

If the limited block BBLK2 containing a word line short-circuiting defect is to be accessed (step S72), the controller 200 reads BWL information (step S73). Subsequently, the controller 200 issues a command to read from BBLK2 (step S74). Step S74 is similar to the corresponding operation in FIG. 22 and FIG. 23, described in the second embodiment.

If the limited block BBLK3 containing a selection gate line short-circuiting defect is to be accessed (step S75), the controller 200 reads BSG information (step S76). Subsequently, the controller 200 issues a command to read from BBLK3 (step S77). Step S77 is similar to the corresponding operation in FIG. 22 and FIG. 23, described in the second embodiment.

Figure 36:
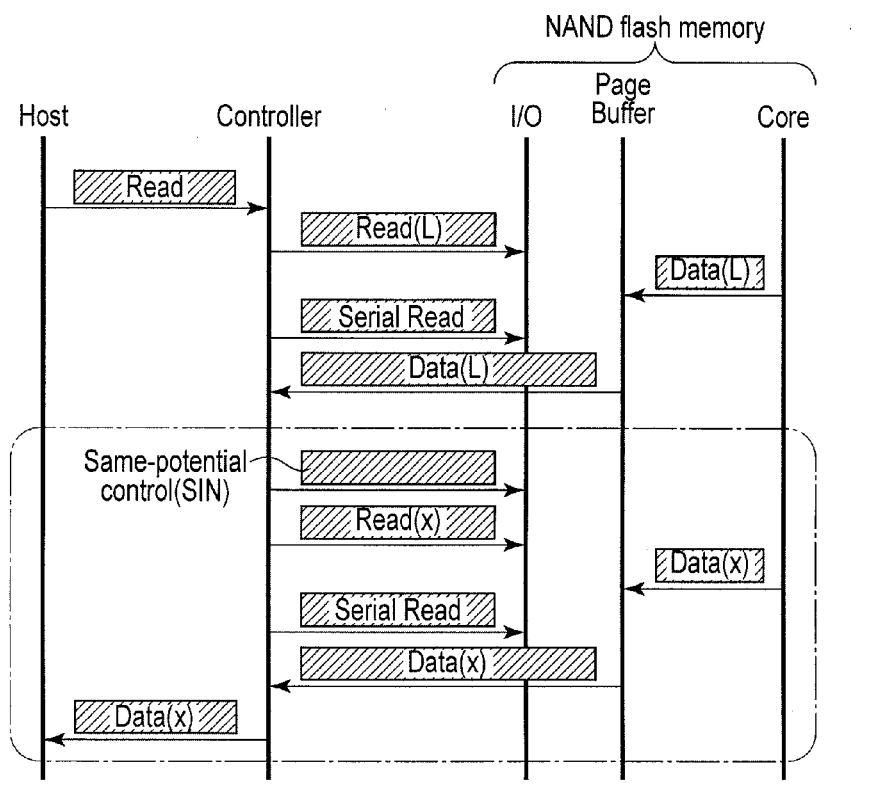
FIG. 36 is a sequence diagram showing processing carried out by a memory system according to the third embodiment.

FIG. 36 is a flowchart showing the flow of instructions between the host apparatus 300 and the controller 200 and the NAND flash memory (input/output unit 130, page buffer 120, and core unit 110) when data is read from a limited block.

FIG. 36 is different from FIG. 22 described in the second embodiment in that a process of reading management data is carried out before the controller 200 issues the command "Read(x)".

That is, upon receiving a read access from the host apparatus 300, the controller 200 issues a "Read(L)". In response, the NAND flash memory 100 reads management data (BWL and/or BSG) into the page buffer 120 in units of pages under the control of the sequencer 141.

Subsequently, the controller 200 serially reads the data in the page buffer 120. Thus, the controller 200 can determine where a word line or selection gate line short-circuiting defect is present in the limited block to be accessed.

The subsequent processing is similar to the corresponding processing in FIG. 22.

3.1.3 Writing Operation

Figure 37:
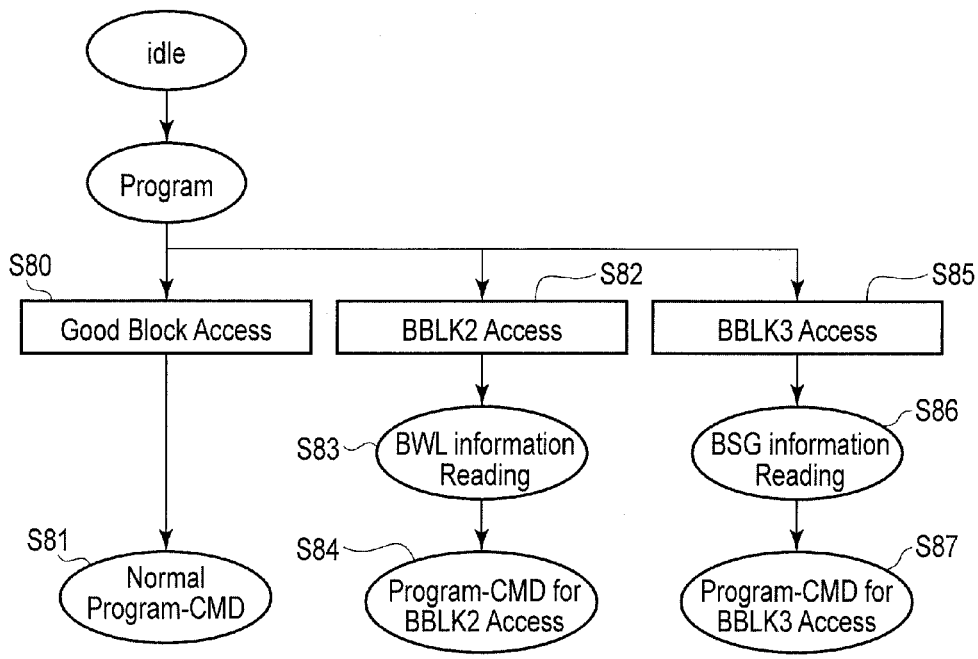
FIG. 37 is a flowchart of the operation of the controller according to the third embodiment.

Now, a writing operation performed on a limited block will be described with reference to FIG. 37. FIG. 37 is a flowchart showing an operation performed by the controller 200 in the idle state upon receiving a writing access from the host apparatus 300.

As shown in FIG. 37, if a good block is to be accessed (step S80), the controller 200 issues a normal write command. This operation is similar to the operation shown in FIG. 25 and FIG. 26, described in the second embodiment.

If the limited block BBLK2 containing a word line short-circuiting defect to be accessed (step S82), the controller 200 reads BWL information (step S83). Subsequently, the controller 200 issues a command to write to BBLK2 (step S84). Step S84 is similar to the corresponding operation in FIG. 27 and FIG. 28, described in the second embodiment.

If the limited block BBLK3 containing a selection gate line short-circuiting defect is to be accessed (step S85), the controller 200 reads BSG information (step S86). Subsequently, the controller 200 issues a command to write to BBLK3 (step S87). Step S87 is similar to the corresponding operation in FIG. 27 and FIG. 28, described in the second embodiment.

Figure 38:
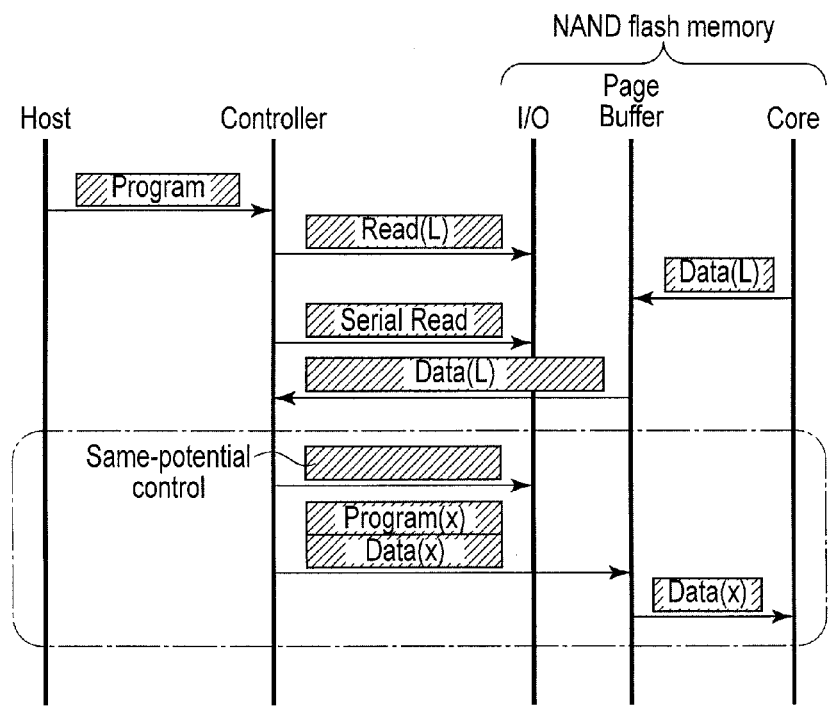
FIG. 38 is a sequence diagram showing processing carried out by the memory system according to the third embodiment.

FIG. 38 is a flowchart showing the flow of instructions between the host apparatus 300 and the controller 200 and the NAND flash memory (input/output unit 130, page buffer 120, and core unit 110) when data is written to a limited block.

FIG. 38 is different from FIG. 22 described in the second embodiment in that a process of reading management data is carried out before the controller 200 issues the command "Program(x)".

That is, upon receiving a writing access from the host apparatus, the controller 200 issues a "Read(L)". In response, the NAND flash memory 100 reads management data (BWL and/or BSG) into the page buffer 120 in units of pages under the control of the sequencer 141.

Subsequently, the controller 200 serially reads the data in the page buffer 120. Thus, the controller 200 can determine where a word line or selection gate line short-circuiting defect is present in the limited block to be accessed.

The subsequent processing is similar to the corresponding processing in FIG. 27.

3.1.4 Erasing Operation

Figure 39:
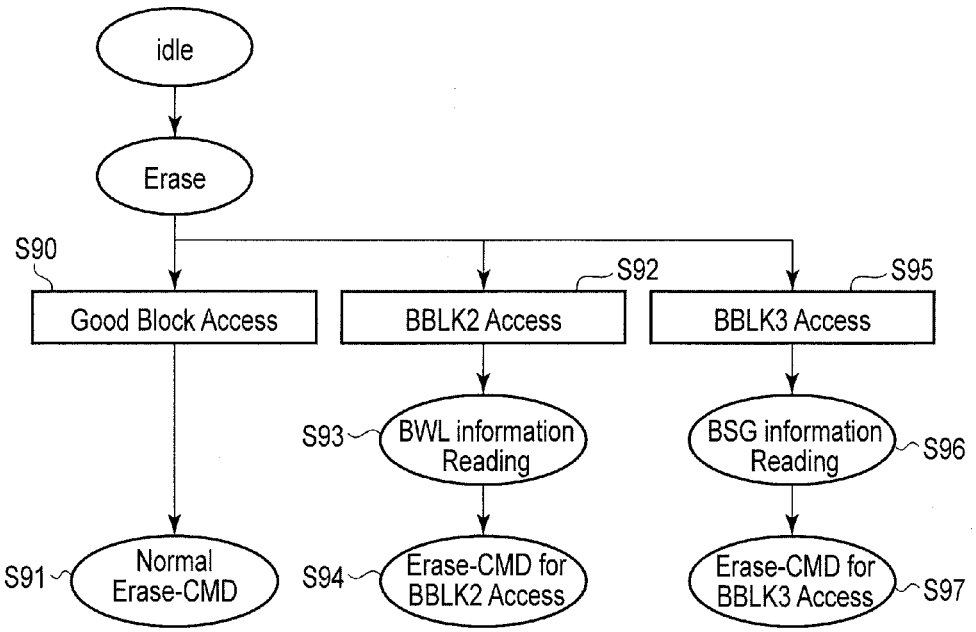
FIG. 39 is a flowchart of the operation of the controller according to the third embodiment.

Now, an erasing operation performed on a limited block according to the present embodiment will be described with reference to FIG. 39. FIG. 39 is a flowchart showing an operation performed by the controller 200 in the idle state upon receiving an erasing access from the host apparatus 300.

As shown in FIG. 39, if a good block is to be accessed (step S90), the controller 200 issues a normal write command. This operation is similar to the operation shown in FIG. 30 and FIG. 31, described in the second embodiment.

If the limited block BBLK2 containing a word line short-circuiting defect is to be accessed (step S92), the controller 200 reads BWL information (step S93). Subsequently, the controller 200 issues an erase command for BBLK2 (step S94). Step S94 is similar to the corresponding operation in FIG. 32 and FIG. 33, described in the second embodiment.

If the limited block BBLK3 containing a selection gate line short-circuiting defect is to be accessed (step S95), the controller 200 reads BSG information (step S96). Subsequently, the controller 200 issues an erase command for BBLK3 (step S97). Step S97 is similar to the corresponding operation in FIG. 32 and FIG. 33, described in the second embodiment.

Figure 40:
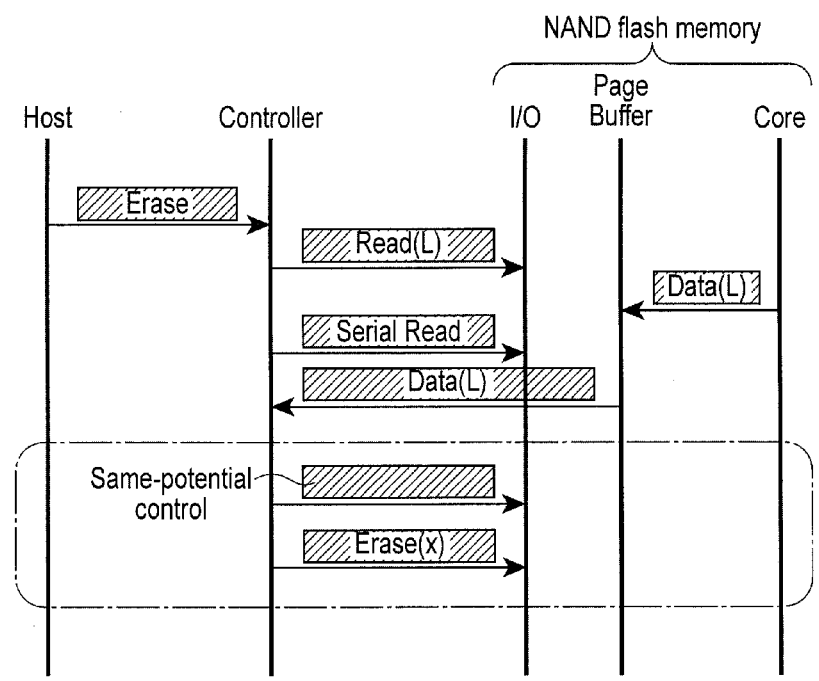
FIG. 40 is a sequence diagram showing processing carried out by the memory system according to the third embodiment.

FIG. 40 is a flowchart showing the flow of instructions between the host apparatus 300 and the controller 200 and the NAND flash memory (input/output unit 130, page buffer 120, and core unit 110) when data is erased from a limited block.

FIG. 40 is different from FIG. 32 described in the second embodiment in that a process of reading management data is carried out before the controller 200 issues the command "Erase(x)". The method for reading management data is similar to the method for reading management data in conjunction with reading and the method for reading management data in conjunction with writing.

3.2 Effects According to the Present Embodiment

The method according to the present embodiment eliminates the need to read the information BWL and BSG by POR when the NAND flash memory 100 is powered on. Thus, the NAND flash memory can be quickly activated.

Once the information BWL and BSG for a limited block is read and transferred to the controller 200, the information BWL and BSG no longer needs to be read during an access to the same limited block.

4. Fourth Embodiment

Now, a semiconductor memory device and a controller for the semiconductor memory device will be described. The present embodiment discloses an example of control designed to set short-circuited interconnects to the same potential in the first to third embodiments. Only differences from the first to third embodiments will be described.

4.1 SIN Code Register

The NAND flash memory 100 includes a SIN code register, for example, in the register 143. The SIN code is information on voltages to be applied to each word line WL for data reading, data writing, and data erasing. The SIN code register holds such information. The sequencer 141 and the driver 144 apply the desired voltages to each word lie WL based on the information in the SIN code register.

Figure 41:
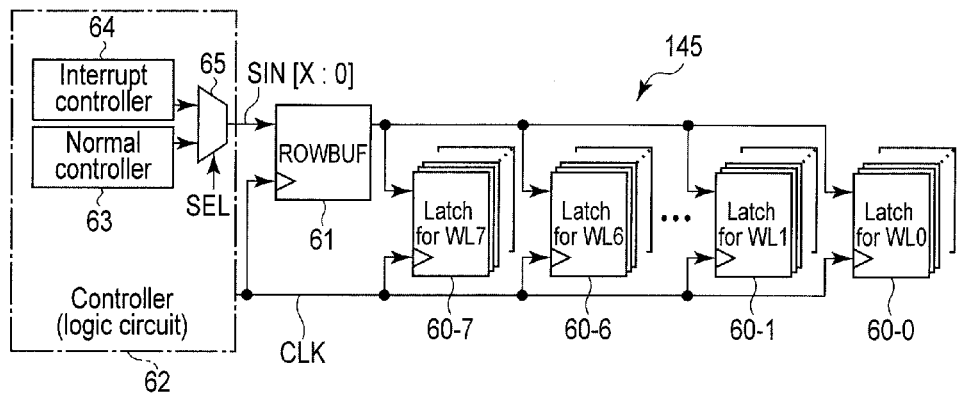
FIG. 41 is a block diagram of a register according to a fourth embodiment.

FIG. 41 is a circuit diagram of the SIN code register. As shown in FIG. 41, a SIN code register 145 includes a latch circuit 60 (60-0 to 60-7), a buffer circuit 61, and a controller (logic circuit) 62.

The latch circuits 60-0 to 60-7 are associated with the word lines WL0 to WL7, respectively, and hold information to be applied to the associated word lines WL. The buffer circuit 61 temporarily holds SIN codes provided by the controller 62 and transfers the SIN codes to the latch circuits 60.

The controller 62 includes a normal controller 63, an interrupt controller 64, and a selector 65. The normal controller 63 issues a SIN code for the case where a good block is to be accessed. The interrupt controller 64 holds a SIN code provided by the controller 200 if a limited block is to be accessed. Based on the selection signal SEL, the selector 65 selects either a SIN code provided by the normal controller 63 or a SIN code provided by the interrupt controller 64 to transfer the selected SIN code to the buffer circuit 61.

Furthermore, the controller 62 generates a clock CLK. The buffer circuit 61 and the latch circuit 60 retrieves signals in synchronism with the clock CLK.

4.2 Method for Setting a SIN Code

Figure 42:
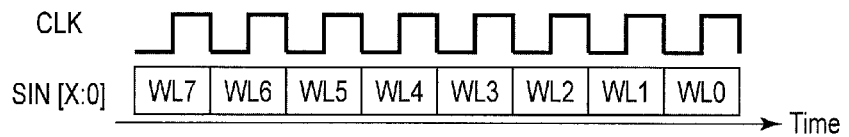
FIG. 42 is a timing chart of timings for a signal associated with storage of SIN codes according to the fourth embodiment.

Now, a method for setting SIN codes in the register 145 configured as described above will be described. FIG. 42 is a timing chart showing the clock CLK and the SIN codes set in the latch circuits 60.

As shown in FIG. 42, when SIN codes are transferred to the buffer circuit 61, information on voltages to be applied to the respective word lines WL is set in order in synchronism with the clock, starting with the latch circuit 60-0.

4.3 Operation of Rewriting SIN Codes

Now, an operation of rewriting SIN codes will be described. The present embodiment rewrites the SIN codes so as to set short-circuited interconnects to the same potential.

That is, if for example, the two word lines WL0 and WL1 are short-circuited, the SIN codes in the corresponding latch circuits 60-0 and 60-1 are rewritten so as to make both codes the same.

Figure 43:
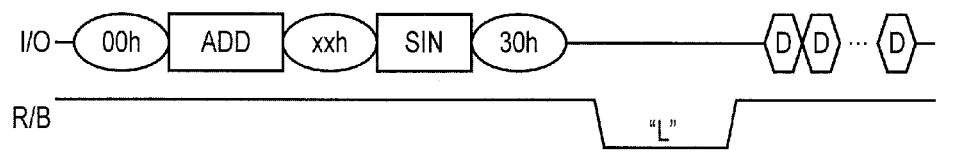
FIG. 43 and FIG. 44 are command sequence diagrams of a semiconductor memory device according to the fourth embodiment.

First, a rewriting operation during a reading operation will be described with reference to FIG. 43. FIG. 43 shows a command sequence during reading.

As shown in FIG. 43, after issuing the command "00h", the address ADD, and the command "xxh", the controller 200 issues SIN codes and finally issues the second read command "30h". The issuance of "xxh" allows the selector 65 to select from the SIN codes received from the controller 200 and provided by the interrupt controller 64. As a result, such codes as set the short-circuited word lines to the same potential are stored in the latch circuits 60-0 to 60-7.

Now, a rewriting operation during a writing operation will be described with reference to FIG. 44.

Figure 44:
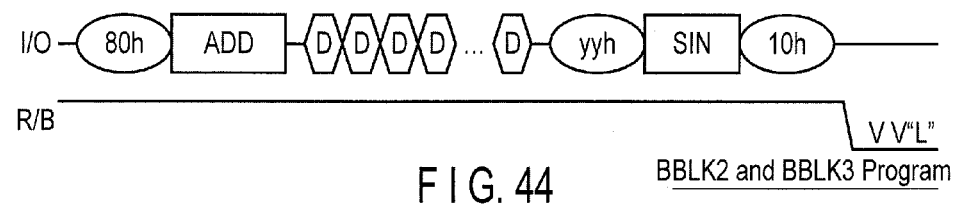

FIG. 44 shows a command sequence during writing. As shown in FIG. 44, after issuing the command "80h", the address ADD, and the command "yyh", the controller 200 issues SIN codes and finally issues the second write command "10h". The issuance of "yyh" allows the selector 65 to select from the SIN codes received from the controller 200 and provided by the interrupt controller 64. As a result, such codes as set the short-circuited word lines to the same potential are stored in the latch circuits 60-0 to 60-7.

4.4 Effects According to the Present Embodiment

The same-potential control described in the first to third embodiments can be implemented by, for example, a method according to the present embodiment.

5. Fifth Embodiment

Now, a semiconductor memory device and a controller for the semiconductor memory device will be described. The present embodiment takes measures against a short-circuiting defect occurring after shipment of the NAND flash memory 100, that is, measures against an acquired defect. Only differences from the first to fourth embodiments will be described below.

5.1 First Method

Figure 45:
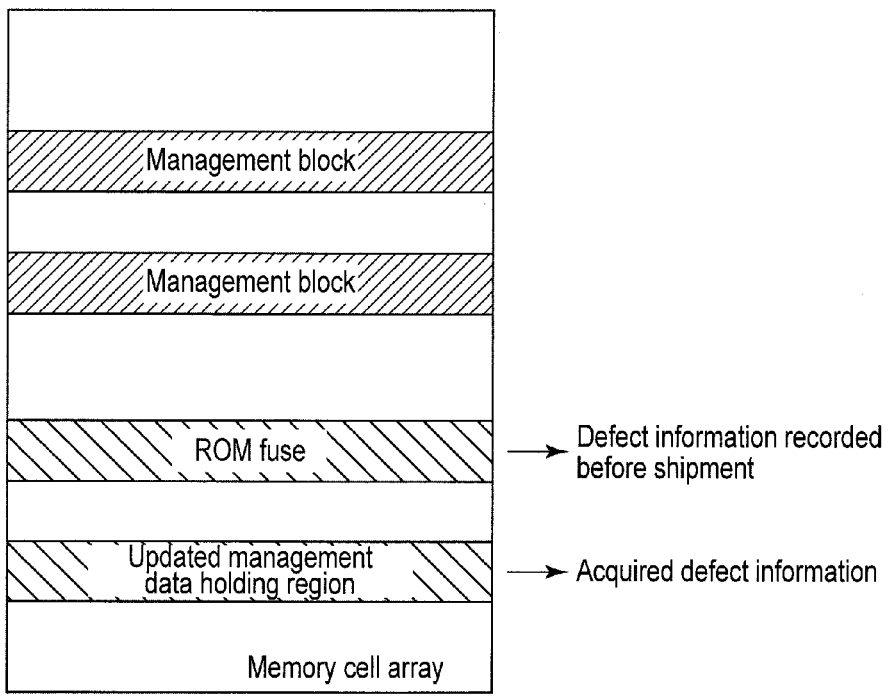
FIG. 45 is a conceptual drawing of a memory cell array according to a fifth embodiment.

FIG. 45 is a schematic diagram of the memory cell array according to the present embodiment. As shown in FIG. 45, the memory cell array 111 includes an updated management data holding region in addition to the ROM fuse. The updated management data holding region is an area in which acquired defect information (BBLK2, BBLK3, BWL, and BSG) is held. Thus, the controller 200 can make a reading access and a writing access to the updated management data holding region but is inhibited from making an erasing access to the updated management data holding region. Furthermore, the host apparatus 300 is also inhibited from accessing the updated management data holding region. The updated management data holding region may be set so that the information can be read from the updated management data holding region by POR.

Figure 46:
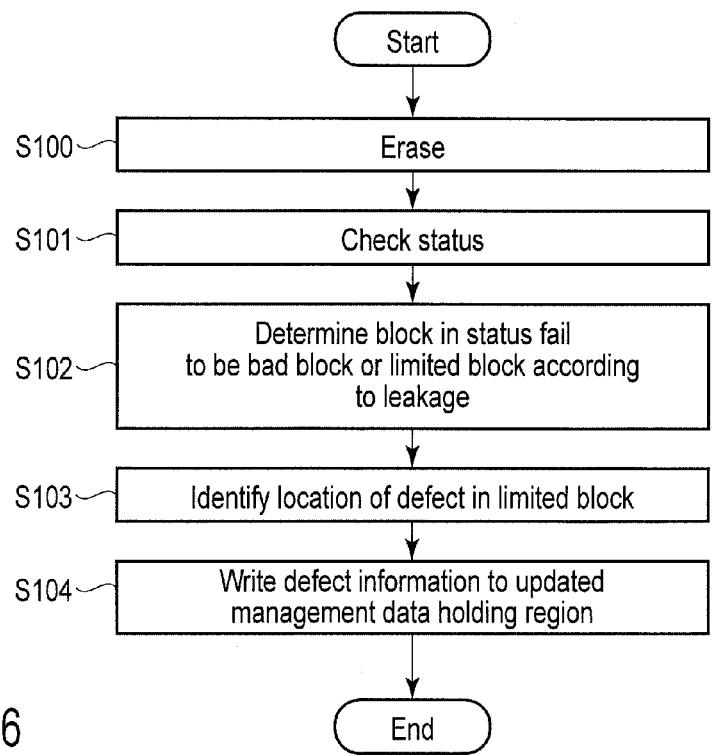
FIG. 46 is a flowchart of the operation of a controller according to the fifth embodiment.

FIG. 46 is a flowchart showing a method for checking for an acquired defect. As shown in FIG. 46, the controller 200 erases one of the blocks BLK (step S100). The controller 200 then checks the status (step S101). If any block is in a status-fail (if the data in any block fails to be erased), the controller 200 records the block BLK as a bad block or a limited block (step S102). This determination is similar to the determination in steps S11 to S17 described in the first embodiment.

If any block is recorded as a limited block, the controller 200 identifies a location of a defect of the limited block (step S103). After the identification, the controller 200 writes the identified defect information (BBLK2, BBLK3, BWL, and BSG) to the updated management data holding region.

The management data in the updated management data holding region may be transmitted voluntarily by the NAND flash memory 100 to the controller 200 at any timing or may be transmitted in response to a request from the controller 200.

Furthermore, the above-described check may also be carried out in response to a request from the controller 200 or voluntarily by the NAND flash memory 100 at any timing when the controller is not making any data access.

Additionally, the NAND interface specifies "Dfh" as an inter-word-line leakage check command. Thus, this command may be used.

5.2 Second Method

Now, a second method will be described. The controller 200 may perform, where appropriate, the operation shown in FIG. 9 described in the first embodiment, rather than at the timing for an erasing operation as in the case of the first method. Any defect found during this operation is written to the updated management data holding region described in FIG. 45.

5.3 Effects According to the Present Embodiment

With the method according to the present embodiment, even if a defect occurs during operation (after shipping), the corresponding block need not necessarily to be considered as a bad block but may be continuously used as a limited block. Thus, the user's convenience can be improved.

6. Sixth Embodiment

Now, a semiconductor memory device and a controller for the semiconductor memory device will be described. The present embodiment describes some defects which may occur in the three-dimensional stack NAND, including the defects described above in the first to fifth embodiments, as well as measures against the defects. Only differences from the first to fifth embodiments will be described.

Figure 48:
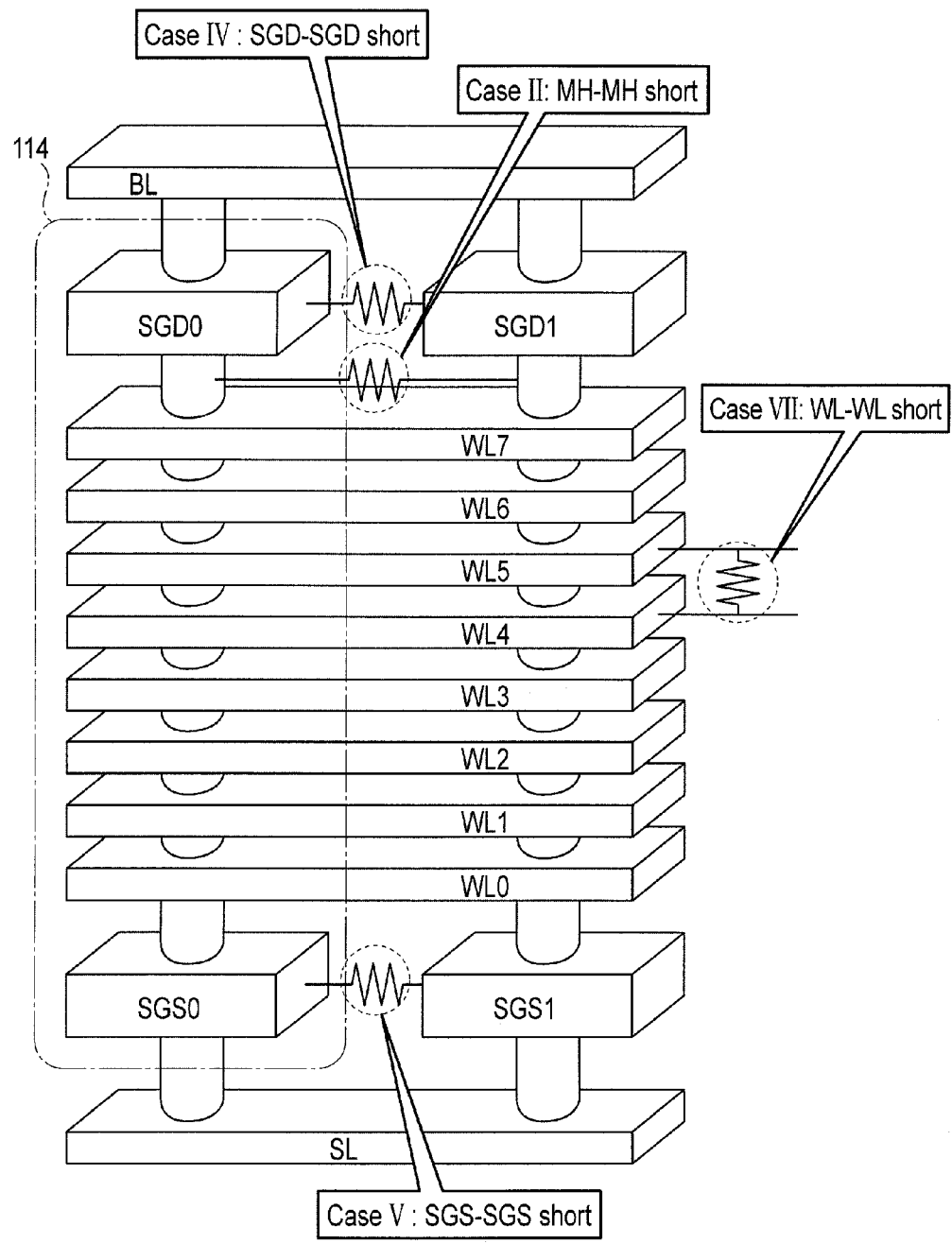
FIG. 48 and FIG. 49 are a perspective view and a cross-sectional view of a memory cell array according to the sixth embodiment.
Figure 49:
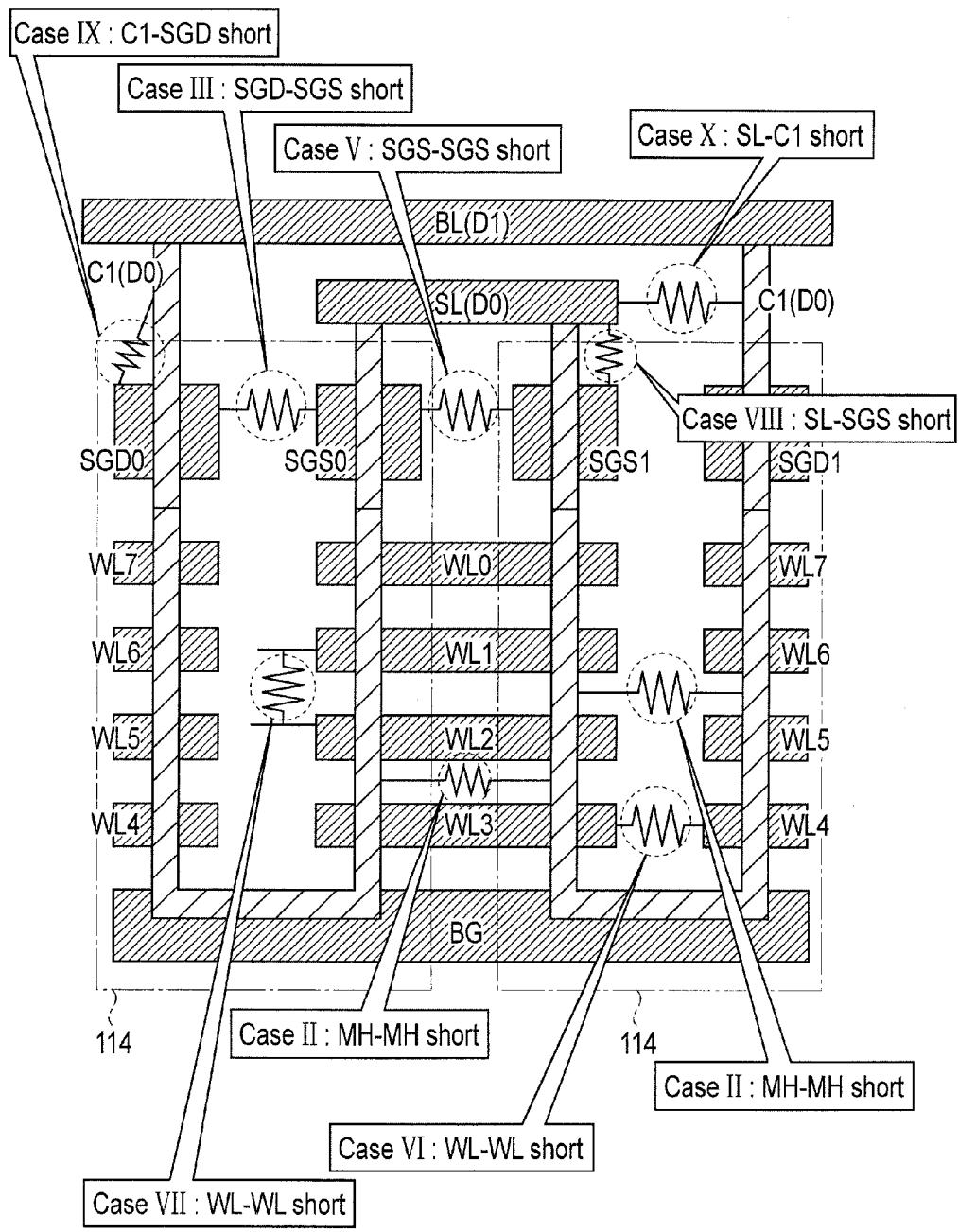

FIG. 47 is a diagram showing types of defects and remedial methods for the defects. FIG. 48 to FIG. 50 are a perspective view and a cross-sectional view of the memory cell array and a plan view of the word line, showing possible defects.

6.1 CASE I

First, a defect CASE I is short-circuiting between memory holes MH located adjacent to each other along the selection gate line SG (see FIG. 50). This defect is apparently observed as short-circuiting between the adjacent bit lines and considered to be a column failure. This defect is remedied by a column redundancy technique.

The column redundancy is a technique for replacing a bad column with a separately provided redundancy column to remedy the bad column. In CASE I, at least two bit lines are observed as short-circuiting failures. Thus, at least two columns (in other word, a column including two bit lines) are replaced with redundancy columns.

6.2 CASE II

CASE II is short-circuiting between memory holes MH located adjacent to each other along the bit line BL (see FIG. 48 to FIG. 50). This defect is apparently observed as a column failure. As in CASE I, this defect is remedied by the column redundancy technique.

Unlike in CASE I, in CASE II, the plurality of short-circuited memory holes MH are present within the same column. Thus, if a single column (column including one bit line) can be subjected to redundancy, only the single column may be replaced with another column.

6.3 CASE III

CASE III corresponds to short-circuiting between the selection gate line SGD and the selection gate line SGS in the same NAND string 114 (see FIG. 49). This defect is apparently observed as a block failure. However, a defect is actually present in only one memory group GP. According to the conventional art, such a block is recorded as a bad block, and none of the memory cells in the block can be used.

However, the defect in CASE III can be remedied by the method described in the first to fifth embodiments. That is, the controller 200 can recognize that the selection gate lines SGD and SGS are short-circuited, based on the management data. Thus, to allow this block to be accessed, the short-circuited selection gate lines SGD and SGS are controllably set to the same potential. This enables the block including the defect in CASE III to be remedied.

6.4 CASE IV

CASE IV is short-circuiting between the selection gate lines SGD across the NAND strings 114 (see FIG. 48). This defect is apparently observed as a block failure. However, a defect is actually present in only two memory group GP. The conventional art also considers such a block to be bad block.

However, the defect in CASE IV is also remedied by the method described in the first to fifth embodiments. That is, the controller 200 controllably sets the two short-circuited selection gate lines SGD to the same potential based on the management data. This enables the block including the defect in CASE IV to be remedied.

When the selection gate lines are short-circuited between different strings, a plurality of strings including the short-circuited selection gate lines cannot be used. That is, these strings are constantly unselected. The controller 200 does not access the unselected strings. However, in an operation such as block batch data writing such as Flash Write, all the strings including defective strings perform the same operation, and this avoids posing a particular problem. This also applies to CASE V.

6.5 CASE V

CASE V is short-circuiting between the selection gate lines SGS across the NAND strings 114 (see FIG. 49). This defect can be handled as is the case with CASE IV. That is, the controller 200 sets at least two short-circuited selection gate lines SGS to the same potential based on management data.

6.6 CASE VI

CASE VI is short-circuiting between word lines WL located adjacent to each other along the bit line (see FIG. 49 and FIG. 50). This defect is apparently observed as a block failure. As described above, in the three-dimensional stack NAND flash memory, plurality of strings share the word lines WL. Thus, short-circuiting between the word lines WL makes the whole block defective. Therefore, the conventional art considers such a block to be bad.

However, the defect in CASE VI can be remedied by setting the short-circuited word lines WL to the same potential as described in the first to fifth embodiments.

6.7 CASE VII

CASE VII is short-circuiting between word lines WL located adjacent to each other along the memory hole MH (the vertical direction with respect to the surface of the semiconductor substrate) (see FIG. 49 and FIG. 50). This defect can be remedied as in CASE VI.

6.8 CASE VIII

CASE VIII is short-circuiting between the source line (D0) and the selection gate line SGS (see FIG. 49). The reference numeral "D0" in the drawings means a metal interconnect layer provided at the level of the lowermost layer above a NAND string. The reference numeral "D1" means a metal interconnect layer provided at a level above "D0".

Different source lines SL may be provided in the respective blocks or the same source line SL may be shared by the blocks. The defect in CASE VIII is a block failure in the former case and is a failure in the memory cell array 111 as a whole in the latter case.

In such a case, the controller 200 sets the short-circuited source line SL and selection gate line SGS to the same potential. In the present example, the management data includes defective-source-line information, which is written to the page PG1 or PG2 in FIG. 11.

6.9 CASE IX

CASE IX is short-circuiting between a contact plug C1 (D0) and the selection gate line SGD (see FIG. 49). The contact plug C1 is formed at the level D0 to connect a drain of the selection transistor ST1 to the bit line BL. As in CASE I and CASE II, this defect is remedied by the column redundancy technique.

6.10 CASE X

CASE X is short-circuiting between the contact plug C1 (D0) and the source line SL (see FIG. 49). This defect can be handled as in CASE IX.

7. Seventh Embodiment

Now, a semiconductor memory device and a controller for the semiconductor memory device will be described. Only differences from the first to sixth embodiments will be described below.

7.1 General Configuration of the Semiconductor Memory Device

Figure 51:
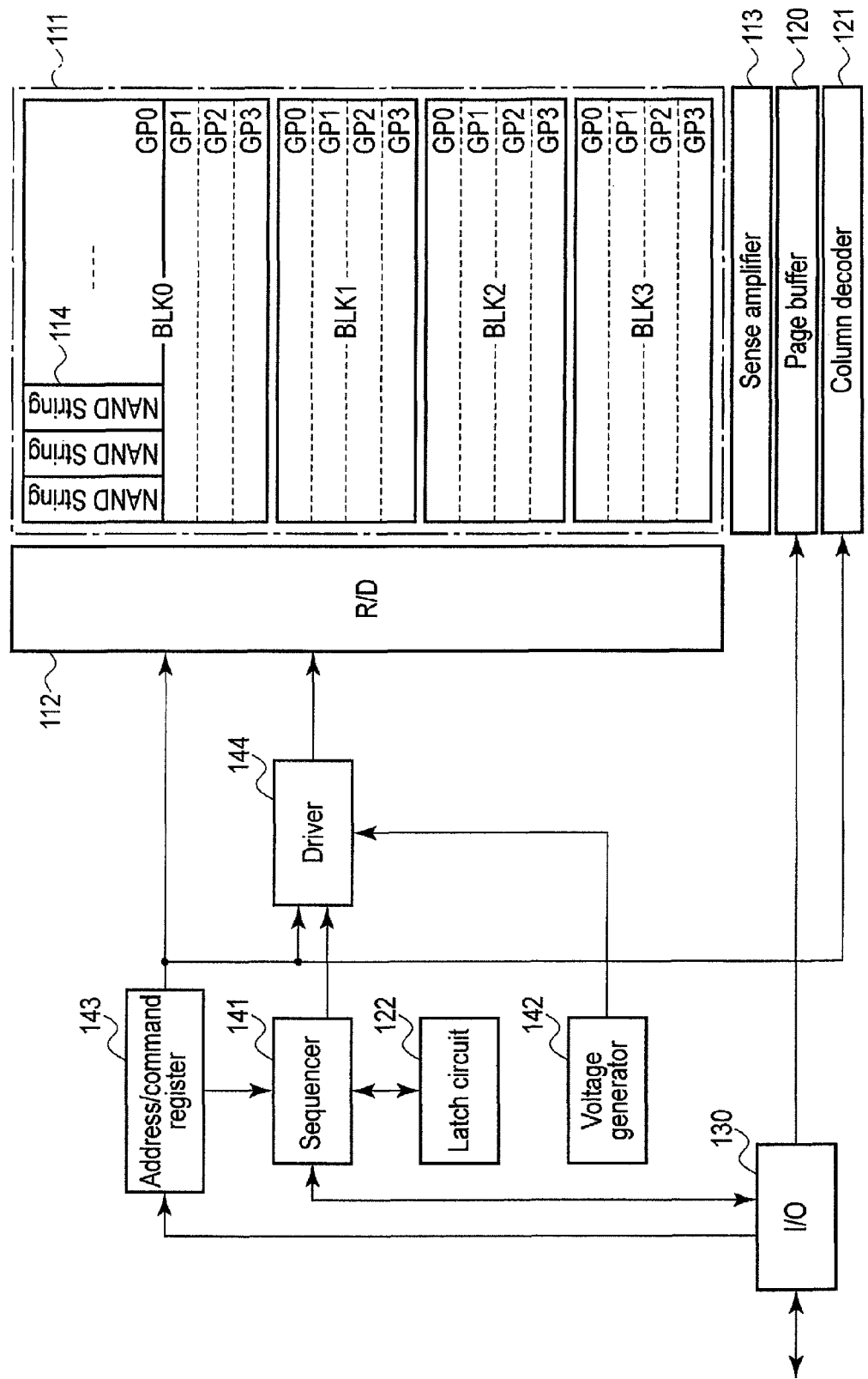
FIG. 51 is a block diagram of a semiconductor memory device according to a seventh embodiment.

FIG. 51 is a block diagram of a NAND flash memory 100 according to the present embodiment. As shown in FIG. 51, the NAND flash memory 100 includes a memory cell array 111, a row decoder (R/D) 112, a sense amplifier 113, a page buffer 120, a column decoder 121, a latch circuit 122, an input/output circuit 130, a control circuit (sequencer) 141, a voltage generator (charge pump) 142, an address/command register 143, and a driver 144.

The memory cell array 111 includes a plurality of (in the present example, four) blocks BLK (BLK0 to BLK3) which are a set of nonvolatile memory cells. The block BLK is a data erase unit, and the data in the same block BLK is erased at a time. Each of the blocks BLK includes a plurality of (in the present example, four) string groups GP (GP0 to GP3) each of which is a set of NAND strings 114 including memory cells connected together in series. Of course, the number of blocks in the memory cell array 111 and the number of string groups in one block BLK are optional. The configuration of the memory cell array 111 is as described in the first embodiment with reference to FIG. 3 to FIG. 7.

The row decoder 112 receives a block address signal from the address/command register 143 and receives a word line control signal and a selection gate control signal from the driver 144. The row decoder 112 selects a particular block or a particular word line WL based on the received block address signal, word line control signal, and selection gate control signal. The row decoder 112 may be provided on the opposite sides of the memory cell array 111. During data reading, the sense amplifier 113 senses and amplifiers data read from a memory cell.

During data writing, the sense amplifier transfers write data to a memory cell. Data is read from and written to the memory cell array 111 in units of a plurality of memory cells. This unit corresponds to a page. The definition of "page" will be particularly described later.

The page buffer 120 holds data in units of pages. During data reading, the page buffer 120 temporarily holds data transferred by the sense amplifier 113 in units of pages, and serially transfers the data to the input/output circuit 130. On the other hand, during data writing, the page buffer 120 temporarily holds data serially transferred by the input/output circuit 130, and transfers the data to the sense amplifier 113 in units of pages.

The input/output circuit 130 transmits and receives various commands and data to and from the controller 200 via a NAND bus. The address/command register 143 receives commands and addresses from the input/output circuit 130 and holds the commands and the addresses.

The driver 144 supplies voltages required for data writing, data reading, and data erasing to the row decoder 112, the sense amplifier 113, and a source line driver (not shown in the drawings). The voltages are applied to memory cells (word lines, selection gate lines, back gate lines, bit lines, and source lines described below) by the row decoder 112, the sense amplifier 113, and the source line driver.

The voltage generator 142 steps up an externally provided power supply voltage to supply the required voltage to the driver 144.

For example, during power-on, the latch circuit 122 temporarily holds management data read from a ROM fuse in the memory cell array 111. The management data includes information on defect regions in each block. The management data will be described below. The latch circuit 122 includes, for example, a SRAM.

The control circuit 141 controls the operation of the NAND flash memory 100 as a whole.

7.2 Writing Operation

Figure 52:
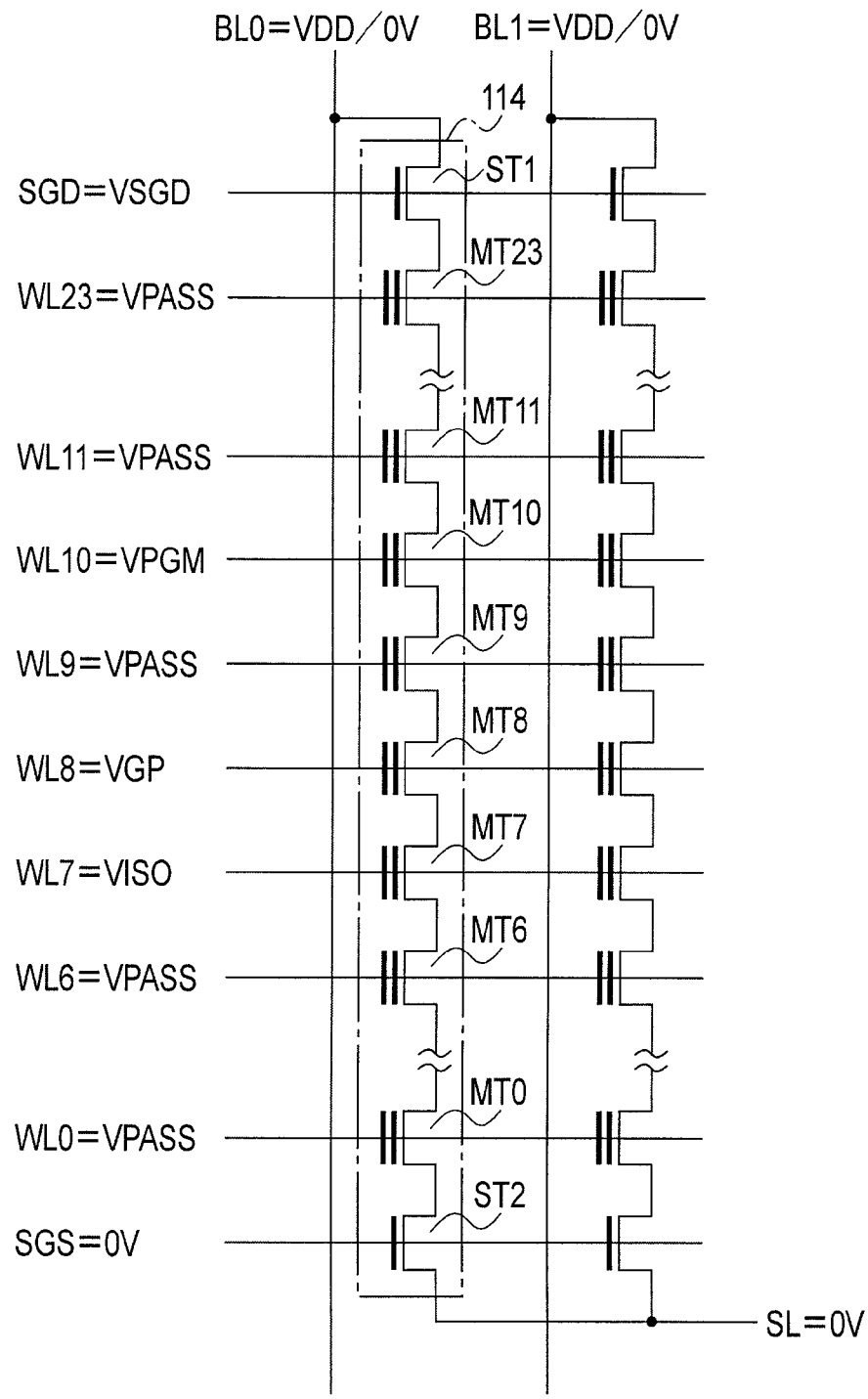
FIG. 52 is a diagram illustrating voltage relations in a writing operation according to the seventh embodiment.

Now, a writing operation will be described. FIG. 52 is a diagram illustrating voltage relations in a writing operation. In FIG. 52, the illustration of a back gate transistor BT is omitted. The back gate transistor BT is in an on state during writing. It is assumed that, for example, word lines WL0 to WL23 are disposed in a block and that data is written to the word line WL10.

Each bit line BL is provided with a power supply voltage VDD or a ground voltage VSS (0 V) depending on write data. Columns to which data is to be written (charge is injected into a charge accumulation layer to raise a threshold voltage) are provided with 0 V. Columns inhibited from undergoing writing (no charge is injected into the charge accumulation layer to maintain the threshold voltage) are provided with the power supply voltage. A program voltage VPGM (for example, 20 V) is applied to the selected word line WL10. The program voltage VPGM is a high voltage allowing charge to be injected into the charge accumulation layer.

A cut-off voltage VISO for separating (cutting off) a channel is applied to the unselected word line WL7. For example, VISO is set at 0 V. An intermediate voltage VGP is applied to the unselected word line WL8. A write pass voltage VPASS (for example, 10 V) is applied to the other unselected word lines WL0 to WL6, WL9, and WL11 to WL23. The write pass voltage VPASS is a high voltage that turns on a memory cell transistor regardless of the data held by the memory cell transistor. The intermediate voltage VGP de-escalates a rapidly increasing difference in potential between the cut-off voltage VISO and the write pass voltage VPASS. In this case, "VISO<VGP<VPASS".

Furthermore, a voltage VSGD is applied to a selection gate line SGD. The voltage VSGD turns on a selection transistor ST1 with 0 V applied to the corresponding bit line BL (that is, a drain). The voltage VSGD cuts off the selection transistor ST1 with the power supply voltage VDD applied thereto. In this case, 0 V is applied to a selection gate line SGS to turn off a selection transistor ST2, and 0 V is applied to a source line SL.

As a result, in the NAND string in the selected string group GP in which 0 V is applied to the corresponding bit line BL, the selection transistor ST1 is turned on. Thus, 0 V is transferred to the channel of a memory cell transistor MT10 to inject charge into the charge accumulation layer. On the other hand, in the NAND string in which the power supply voltage VDD is applied to the corresponding bit line BL, the selection transistor ST1 is cut off. Thus, the channel of the NAND string is placed into a floating state, and the channel voltage rises as a result of capacitive coupling with the word line WL. In particular, a memory cell transistor MT7 cuts off the channel thereof and thus the channel voltages of memory cell transistor MT8 to MT23 are efficiently boosted. As a result, no charge is injected into the charge accumulation layer in the memory cell transistor MT10, with no data written to the memory cell transistor MT10 (a write inhibition state is realized).

On the other hand, in the unselected string groups GP, the selection transistors ST1 and ST2 are turned off. Hence, no data is written to the unselected string groups GP.

Figure 53:
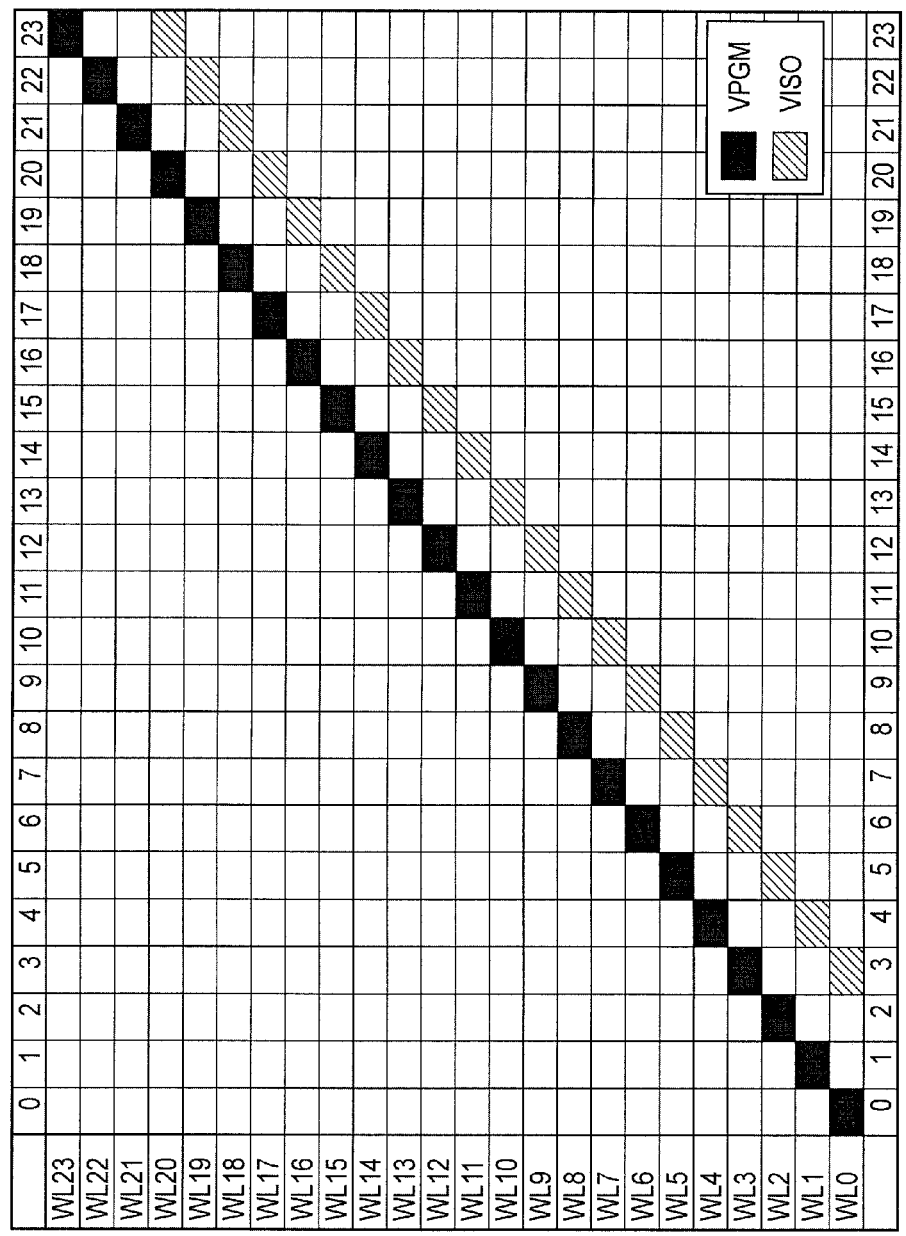
FIG. 53 is a diagram illustrating a channel boost scheme for write inhibition according to the seventh embodiment.

FIG. 53 is a diagram illustrating a channel boost scheme for write inhibition. In FIG. 53, the axis of abscissas represents the selected word line number, and the axis of ordinate represents the voltage applied to the word line.

It is assumed that a word line WLi is selected. The program voltage VPGM is applied to the selected word line WLi. The cut-off voltage VISO is applied to an unselected word line WL(i−3). When writing is carried out on the word lines in order of increasing word line number starting with the word line WL0, the range of the channels to be boosted decreases with increasing word line number. Hence, boost efficiency improves as the writing within the block progresses.

The channel boost scheme for implementing write inhibition is not limited to the above-described voltage relations. For example, the voltage VGP may be omitted, and WL10=VPGM, WL9=VPASS, and WL8=VISO may be set. That is, when the word line WLi is assumed to be selected, the cut-off voltage VISO may be applied to an unselected word line WL(i−2).

Figure 54:
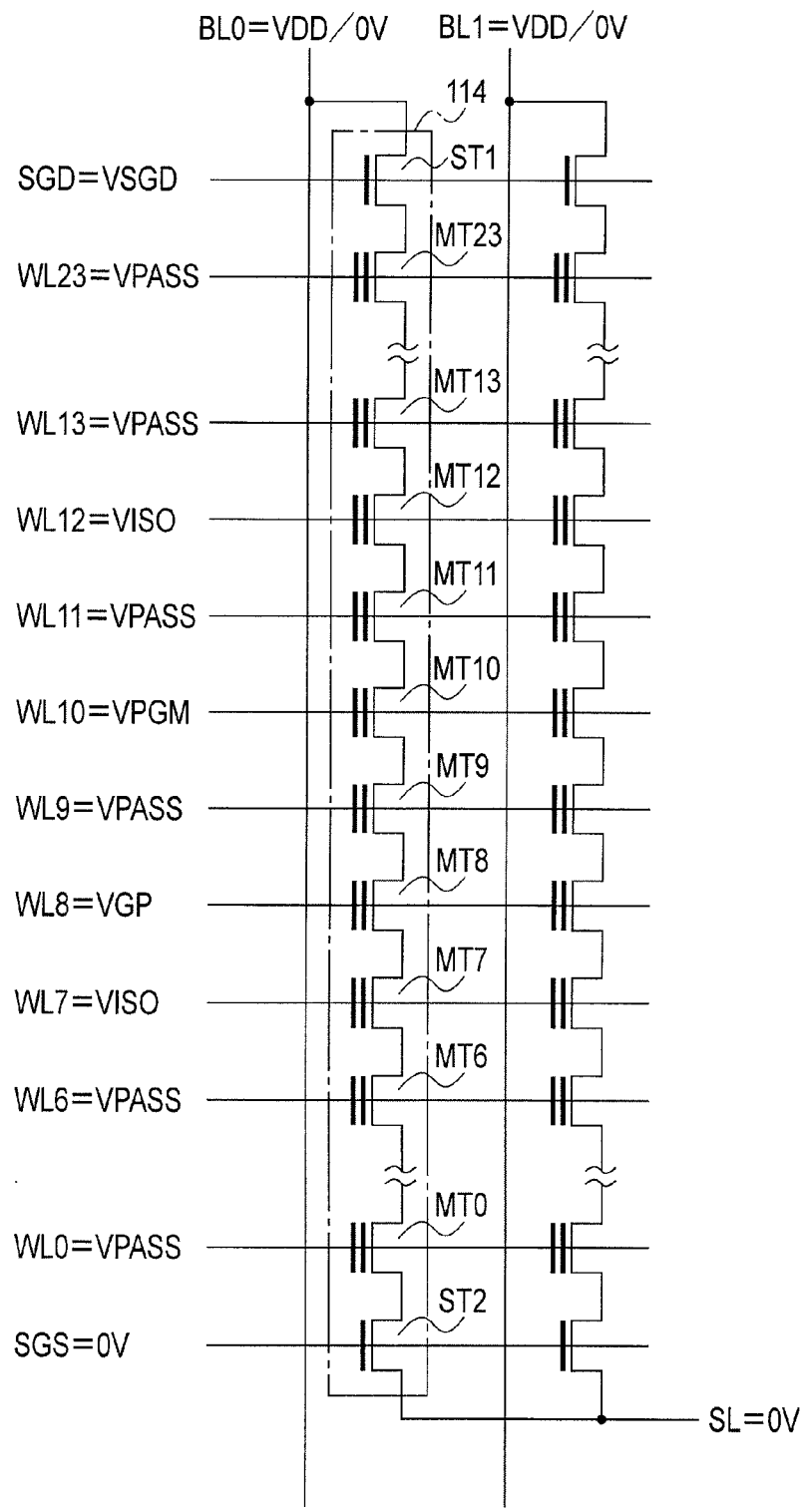
FIG. 54 is a diagram illustrating voltage relations for the channel boost scheme in another example according to the seventh embodiment.

FIG. 54 is a diagram illustrating voltage relations for a channel boost scheme in another example. The cut-off voltage is further applied to the unselected word line WL12, located closer to the bit line than the selected word line WL10. Thus, the channel can be cut off on the opposite sides of the selected word line WL10. In the example in FIG. 54, the range of the channels to be boosted further decreases, further improving the boost efficiency.

7.3 Reading Operation

Now, a reading operation will be described. FIG. 55 is a diagram illustrating voltage relations in a reading operation. In FIG. 55, the illustration of the back gate transistor BT is omitted. The back gate transistor BT is in the on state during reading. It is assumed that, for example, the word lines WL0 to WL23 are disposed in the block and that data is read from the word line WL9.

First, the sense amplifier 113 precharges the bit line BL to a voltage VPRE. A read voltage VCGR is applied to the selected word line WL9. The read voltage VCGR corresponds to the voltage level of a data signal to be read. Additionally, a voltage VREAD is applied to the unselected word lines WL0 to WL8 and WL10 to WL23. The voltage VREAD turns on the memory cell transistor MT regardless of the data held by the memory cell transistor MT.

Furthermore, a voltage VSG (for example, 5 V) is applied to the select gate lines SGD and SGS. The voltage VSG turns on the selection transistors ST1 and ST2. Further, 0 V is applied to the source line SL.

As a result, in the selected string group GP, the selection transistors ST1 and ST2 are turned on. Thus, when the memory cell transistor MT in a read target page are turned on, a current flows from the corresponding bit line BL to the source line SL. On the other hand, when the memory cell transistor is turned off, no current flows.

On the other hand, in the unselected string group GP, the selection transistors ST1 and ST2 are turned off. Hence, no data is read from the unselected string group GP.

FIG. 55 is only illustrative, and a positive voltage VSRC (for example, 2. 5 V) may be applied to the source line SL. In this case, the potentials of the bit line BL, the word line WL, the back gate line BG, and the select gate lines SGD and SGS are each equal to the above-described voltage plus the voltage VSRC.

7.4 Method for Testing the NAND Flash Memory 100

7.4.1. Word Line Short Test

Now, a method for testing the NAND flash memory 100 configured as described above will be described. The present embodiment manages the NAND flash memory by dividing one block into a plurality of regions in the vertical direction (in the direction in which the memory cells are stacked). FIG. 56 is a diagram illustrating an example of units for dividing a block into a plurality of regions. FIG. 56 only shows two NAND strings within one block.

In the example shown in FIG. 56, one block is managed by dividing the block into four regions AR0 to AR3. When, in a certain region AR, a short-circuiting defect occurs at one or more locations among the word lines, the region AR is managed as a defect region.

FIG. 57 is a diagram illustrating an example of units for dividing a block with columnar (I-shaped) semiconductor layers into a plurality of regions. In the example shown in FIG. 57, one block is managed by dividing the block into four regions AR0 to AR3. The number of regions AR is not limited to four, for example, the block is divided into other numbers of blocks such as eight and sixteen. When, in a certain region AR, a short-circuiting defect occurs at one or more locations among the word lines, the region AR is managed as a defect region.

FIG. 58 is a flowchart of the test method carried out on the NAND flash memory 100 before shipment. The test according to the present embodiment checks the word lines for short circuiting (short tests). The short test uses, for example, a tester to check whether or not short circuiting occurs between the target word lines.

The short test described below is sequentially carried out on each block. First, in a block to be tested, the short test is simultaneously carried out on all the word line layers (at a time) (step S200). Specifically, the word lines adjacent to each other in a horizontal direction are short-tested, and further the word lines adjacent to each other in a vertical direction are short-tested. If the results of the first short test in step S200 indicate that no short circuiting occurs among the word line layers, then no short-circuiting defect has occurred in the block. Thus, the tester records the block as a good block (step S201). The specific example if the short test will be described later.

If the results of the first short test indicate that word line short-circuiting has occurred, the short-test is carried out individually on the four regions AR0 to AR3 in the block (step S202, second short test). The results of the second short test in step S202 identify the region AR in which the word line short-circuiting has occurred.

Subsequently, the third short test is carried out simultaneously on two adjacent regions AR (step S203). The third short test in step S203 allows determination of whether a short-circuiting defect has occurred between the word lines arranged across the boundary between the two adjacent regions AR and adjacent to each other in the vertical direction. The third short test in step S203 includes three steps, that is, a step of carrying out the short test simultaneously on regions AR0 and AR1, a step of carrying out the short test simultaneously on the region AR1 and an region AR2, and a step of carrying out the short test simultaneously on the region AR2 and an region AR3. The third short test in step S203 can detect short circuiting between two adjacent regions AR, This type of short-circuiting defect may pass the second short test, but can be detected by the third short test. When the short-circuiting defect occurs between two adjacent regions AR, the two regions AR are determined to be defect regions.

Subsequently, based on the results of the second and third short tests, the locations of the defect regions and unusable regions in the block are identified (step S204). The locations of the defect regions and the unusable regions are recorded in the tester. The defect regions correspond to region AR in which a word line short-circuiting defect is detected as a result of the second short test and two adjacent regions AR in which a word line short-circuiting detected as a result of the third short test. The defect regions are not used as data storage regions.

The unusable regions are buffer regions for boost voltage control during writing and correspond to the regions AR on the opposite sides of a defect region. That is, no short-circuiting defect has occurred in an unusable region, but since the unusable region is adjacent to a defect region, boost voltage control cannot be performed on the unusable region. Like the defect regions, the unusable regions are not used as data storage regions. The defect regions and the unusable regions are collectively referred to as sub-bad block regions.

FIG. 59 is a cross-sectional view showing an example of a short-circuiting defect. In FIG. 59, a word line short-circuiting has occurred in the region AR2. Thus, the region AR2 is a defect region. Furthermore, the regions AR1 and AR3, located on the respective opposite sides of the region AR2, are unusable regions. For example, when the data is to be written to the word line WL9, a voltage for channel boost control cannot be applied to the word lines WL6 to WL8, thereby the region AR3 is set as the unusable region. Similarly, when the data is to be written to the word line WL18, a voltage for channel boost control cannot be applied to the word lines WL15 to WL17, thereby the region AR1 is set as the unusable region. Usable regions used as data storage regions correspond to all the regions in the block except the defect region in which a short-circuiting defect has occurred and the unusable regions included in the good regions corresponding to all the regions except the defect region.

FIG. 60 is a diagram illustrating the relation between usable regions and defect regions in which a short-circuiting defect has occurred. Crosses ("x" marks) in FIG. 60 represent defect regions. Circles in FIG. 60 represent good regions which is the regions except the defect regions.

As seen in FIG. 60, the usable regions correspond to all the regions except the defect region and the unusable regions located adjacent to and on the opposite sides of each of the defect regions. For example, when the region AR4 is the defect region, the region AR3 is set to the unusable region, therefore, the usable region is the regions AR1 and AR2. Furthermore, blocks with defect regions in patterns other than the patterns shown in FIG. 60 are determined to be bad blocks. For example, the block in which the regions AR0 and AR2 are defect regions is determined to be a bad block because the regions AR1 and AR3 adjacent to the regions AR0 and AR2, respectively, are unusable regions.

FIG. 61 is a cross-sectional view showing an example of a short-circuiting defect in a block with I-shaped semiconductor layers. In FIG. 61, a word line short-circuiting has occurred in the region AR2. Hence, the region AR2 is a defect region. In the example shown in FIG. 61, writing progresses upward from the lowermost word line layer (WL0). In this case, the region located immediately above and adjacent to the defect region is an unusable region on which the boot voltage control cannot be performed. In FIG. 61, the region AR1 above and adjacent to the defect region AR2 is set as the unusable region. Further, the regions AR0 and AR3, which are the regions except for the short-circuited region AR2 (i.e. defect region) and the unusable region AR1 from all regions in the block, are set as the usable regions for storing data.

FIG. 62 is diagram illustrating the relation between defect regions and usable regions in a block with I-shaped semiconductor layers. As seen in FIG. 62, the regions except for the defect region and the unusable region from the all regions in the block are set as the usable region. The unusable region is located immediately above and adjacent to the defect region. Furthermore, blocks with defect regions in patterns other than the patterns shown in FIG. 62 are determined to be bad blocks. When the channel boost scheme shown in FIG. 54 is used, the regions located on the opposite sides of a defect region are set to be buffer regions (unusable regions).

Referring back to FIG. 58, the tester writes management data to the memory cell array 111 (step S205). The management data referred to herein includes information on good blocks, bad blocks, and sub-bad block regions (defect regions and unusable regions) which are obtained as a result of the short tests. Note that the "good block" is not synonymy with the "good region". As described above, the "good block" indicates the block including no short-circuiting defect (See FIG. 58). In contrast, the "good region" indicates the region which is partial region in the block and includes no short-circuiting defect (See FIGS. 60 and 62). The management data is written to the ROM fuse in the memory cell array 111.

For example, it is assumed that a block BLKm in the memory cell array 111 is specified to have a ROM fuse region. FIG. 63 is a schematic diagram of the block BLKm with the ROM fuse region. As shown in FIG. 63, two pages PG1 and PG2 in the block BLKm are used as the ROM fuse region. Both of the two pages PG1 and PG2 stores the same management data. The above-described management data is written to the ROM fuse region.

7.4.2 Registering Method of Test Status

Now, a registering method of the test status will be described. FIG. 64 is a flow chart showing the word line short circuiting and the other tests.

First, the tests other than the word line short circuiting are carried out (step S300). The tests in step S300 include tests of the bit lines and the sense amplifier, and tests of the short circuiting other than the word lines. The tests in step S300 are executed for all the blocks.

Subsequently, the word line short test shown in FIG. 58 is carried out for the block to be tested (step S301).

Subsequently, registration of the test status is carried out. An example of status [2:0] is as follows:
[000]: good block
[001]: partial good block (usable region AR0)
[010]: partial good block (usable region AR3)
[011]: partial good block (usable regions AR0 and AR1)
[100]: partial good block (usable regions AR2 and AR3)
[111]: genuine bad block If the block to be tested is not the good block (step S302), a bad block flag is registered in the tester (step S303). Subsequently, if the block to be tested is not the genuine bad block (i.e., includes a usable region) (step S304), the status of the partial good block is registered in the tester (step S305).

Subsequently, when the word line short test and the status registration for all the blocks are completed (step S306), the tests proceed to a test process other than steps S300 and S301 (step S307).

7.4.3 Specific Example of Short Test

Figure 65:
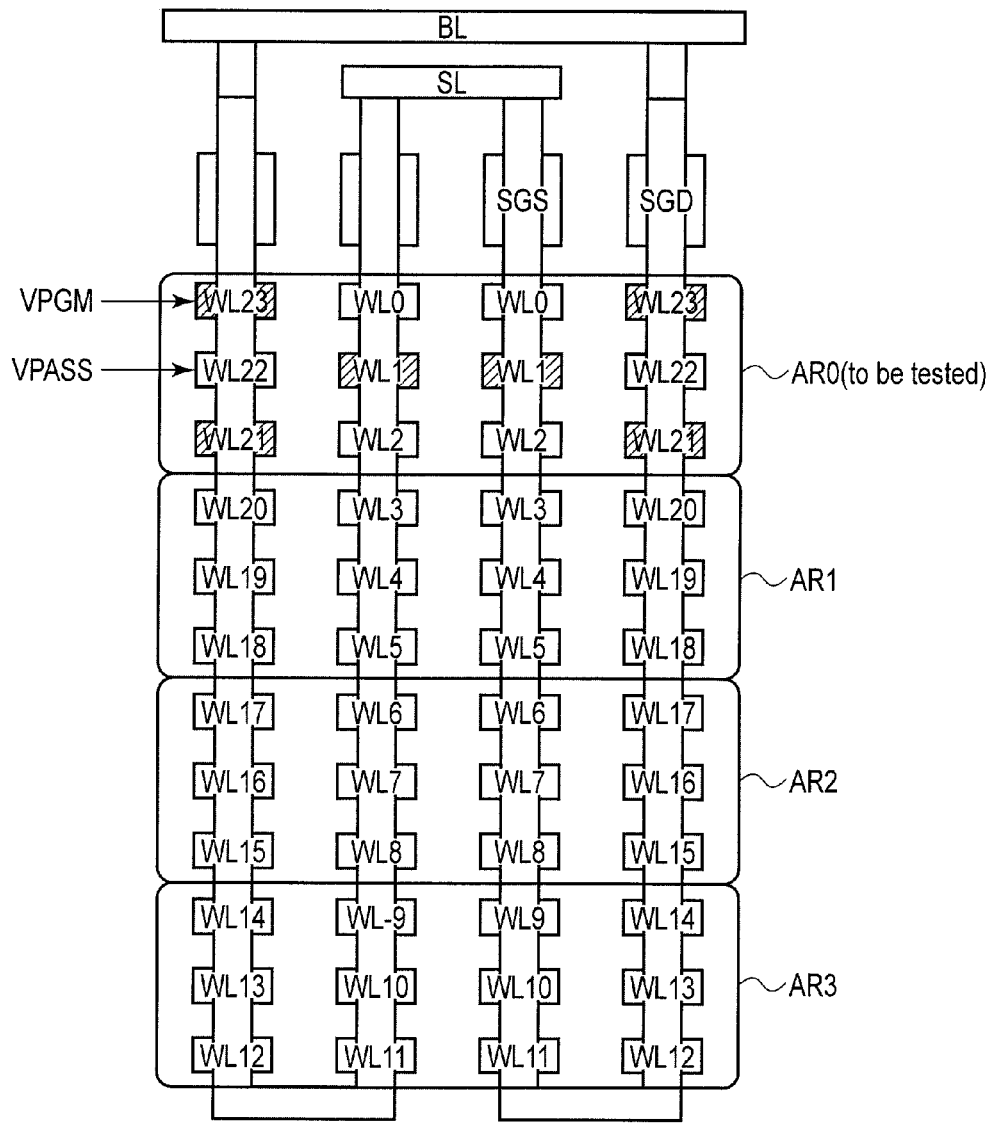
FIG. 65 is a diagram illustrating applied voltages for the short test.

Now, the specific example of the short test will be described. In the short test, two word lines adjacent to each other in a horizontal direction are charged with different voltages, and two word lines adjacent to each other in a vertical direction are charged with different voltages. FIG. 65 is a diagram illustrating applied voltages for the short test.

It is assumed that, for example, the short test of region AR0 is carried out and voltage VPGM and voltage VPASS are used as the two types of voltages. For example, word lines WL1, WL21 and WL23 are charged with program voltage VPGM and word lines WL0, WL2, and WL22 are charged with program pass voltage VPASS. The adjacent word lines are charged with the different voltages in the respective horizontal and vertical and directions. It is detected whether a leak current occurs in a plurality of selected word lines charged with either of the voltages or not.

FIG. 66 is a circuit diagram illustrating an operation for detecting a leak current. The driver 144 includes N-channel MOS transistors DR1-DR4. An end of a current path of MOS transistor DR1 is connected to terminal 73 and the other end is connected to node VCGSEL. The voltage VPGM is applied to an end of a current path of MOS transistor DR2 and the other end is connected to node VCGSEL. The read voltage VCGR is applied to an end of a current path of MOS transistor DR3 and the other end is connected to the node VCGSEL. An unselect-voltage VUSEL (VPASS or VREAD) is applied to an end of a current path of MOS transistor DR4 and the other end is connected to an unselected word line. The node VCGSEL is connected to the selected word line. Change of the selected word line and the unselected word line is carried out with, for example, a command from the tester.

A leak detecting circuit 70 is connected to the terminal 73. The leak detecting circuit 70 includes a voltage generating circuit 71 and an ammeter 72. The leak detecting circuit 70 may be included in the tester or may be incorporated into the NAND flash memory 100. The leak current caused by the word line short circuiting is a small current. In order to detect the small current, it is realistic to incorporate the leak detecting circuit 70 into the NAND flash memory 100. In the leak current detecting operation, first, the selected word lines (WL0, WL2 and WL4 in the example of FIG. 66) are charged with the voltage VPGM via the MOS transistor DR2, and the unselected word lines (WL1 and WL3 in the example of FIG. 66) are charged with the voltage USEL (=VPASS) via the MOS transistor DR4.

Subsequently, as shown in FIG. 67, the MOS transistor DR1 is turned on after the MOS transistors DR2 and DR4 are turned off. In this state, when the short-circuiting defect does not occur in the word lines, the leak current does not flow via the MOS transistor DR1 and the leak current is not therefore detected by the leak detecting circuit 70. In contrast, when the short-circuiting defect occurs in the word lines, the leak current Ileak flows via the MOS transistor DR1. The leak current Ileak is detected by the leak detecting circuit 70.

As described above, detection of the leak current, i.e., the short test can be implemented. When the short test regions are increased, the embodiment can also be carried out similarly to the case of the region AR0.

7.5 Operation of the NAND Flash Memory 100

Now, the operation of the NAND flash memory 100 will be described. First, the controller 200 supplies power to the NAND flash memory 100. Then, the control circuit 141 reads the management data from the ROM fuse in the memory cell array 111, and stores the read management data in the latch circuit 122. Subsequently, based on the management data in the latch circuit 122, the control circuit 141 manages the defect regions and the unusable regions as unselected regions (non-writable regions).

Figure 68:
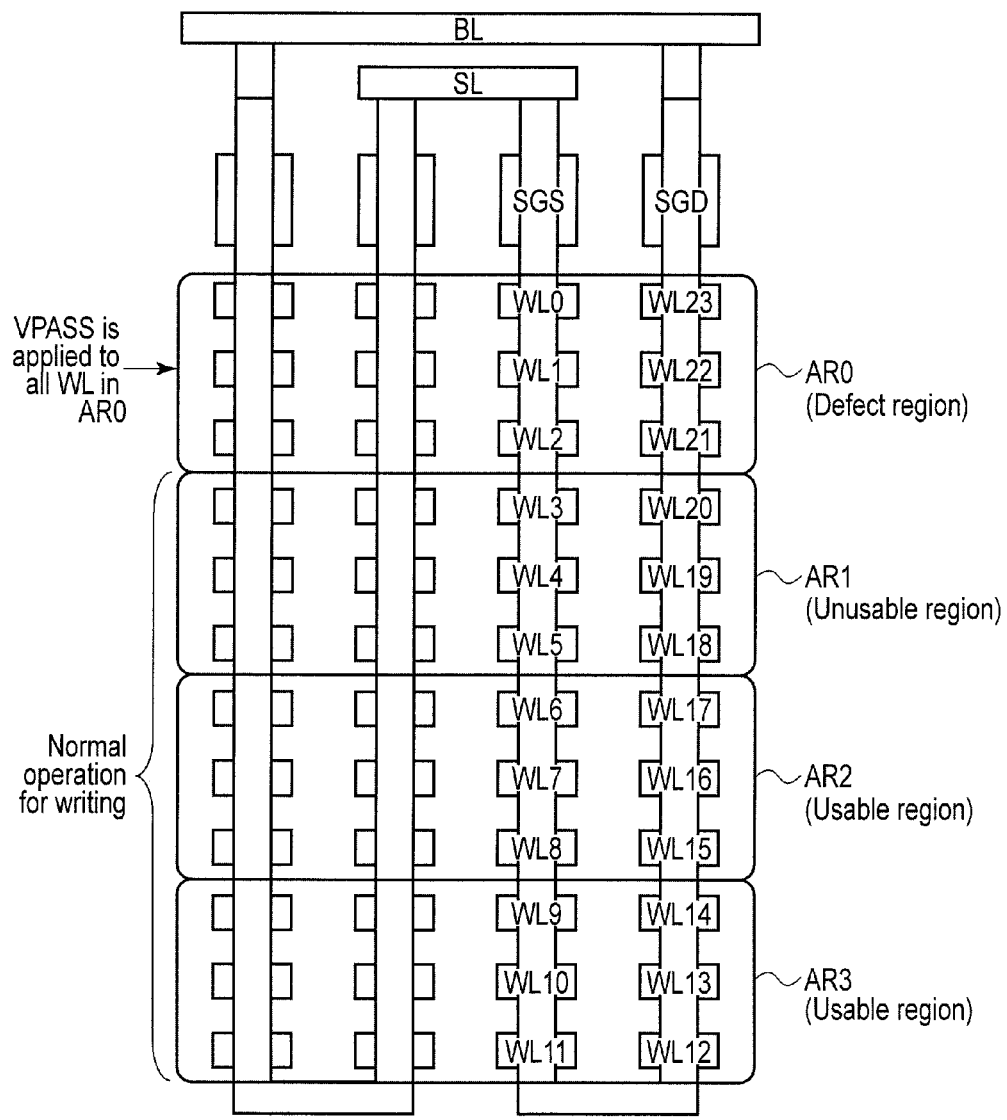
FIG. 68 is a diagram illustrating a write operation.

In a writing operation performed on a block with a defect region, the control circuit 141 controls so that the data is written only to the usable regions in the block. That is, the control circuit 141 avoids writing data to the defect regions and the unusable regions. At this time, the write pass voltage VPASS is applied to all the word lines in the defect region. The remaining part of the voltage control is the same as the corresponding part of the voltage control in the writing operation described with reference to FIG. 52. For example, when the region AR0 is defect region, the region AR1 is unusable region, and the regions AR2 and AR3 are usable region as shown in FIG. 68, then the pass voltage VPASS is applied to all the word lines in the region AR0, and the regions AR1 to AR3 are normally controlled for data writing.

Furthermore, in a reading operation performed on a block with a defect region, the control circuit 141 controls so that the data is read only from the usable regions in the block. That is, the control circuit 141 avoids reading data from the defect regions and the unusable regions. At this time, the voltage VREAD is applied to all the word lines in the defect region. The remaining part of the voltage control is the same as the corresponding part of the voltage control in the reading operation described with reference to FIG. 55.

When the writing scheme is used in which the cut-off voltage VISO is not applied, that is the channel is cut off in the middle thereof, the control circuit 141 controls so that only the defect regions are unselected. In this scheme, the data can be written to all the good region (i.e. all the regions except for the defect region).

7.6 Effects

Stacking the memory cells enables an increase in storage capacity. On the other hand, if peripheral circuits such as the row decoder remain to have planar structures, the peripheral circuits are large in size compared to the memory cell arrays. Then, chip size cannot be reduced however many memory cells are stacked. Sharing the word line among a plurality of NAND strings enables a reduction in chip size. However, the sharing of the word line leads to increased block size. The increased block size increases an erase unit, thus degrading performance, and also increases a defect replacement unit, thus reducing yield. For example, when a short-circuiting defect occurs between word lines in a block, the block is conventionally determined to be defective, that is, determined to be a bad block.

In contrast, the present embodiment manages a block by dividing the word lines in a block into a plurality of regions in the vertical direction. Then, the regions in which a word line short-circuiting defect has occurred are managed as defect regions, and the other regions are managed as good regions. Thus, the present embodiment can avoid treating this block as a whole to be defective, enabling a decrease in the size of storage regions available for the user to be minimized. As a result, the storage regions can be more efficiently used.

Furthermore, the regions on which the voltage control required for the channel boost scheme cannot be performed are managed as unusable regions to which no data is written. Thus, even if various writing schemes are applied to a block in which a word line short-circuiting has occurred, data can be accurately written to the block.

When the short defect of the word lines is occurred after the shipping, the data writing to the block including the short defect is to be a write-error. However, if the write-error can be repaired by the error correction (ECC: error checking and correcting), the block can be used. In contrast, if the number of error bits exceeds the ECC-correctable number of bits, the block is set to the bad block.

Regarding the data erasing, when the erasing error is caused by the word line short defect, the block including the short defect is set to the bad block. In contrast, when the erasing error is not caused even if the word line short defect is exist, the block can be used.

8. Eighth Embodiment

According to the seventh embodiment, the control circuit 141 in the NAND flash memory 100 controls access to blocks with defect regions in which word line short-circuiting defects have occurred. According to the eighth embodiment, the controller 200 that controls the NAND flash memory 100 controls the access to the blocks with defect regions.

FIG. 69 is a flowchart showing a control operation performed by the controller 200.

First, the controller 200 powers on the NAND flash memory 100 (step S400). The controller 200 subsequently reads information (management data) stored in the ROM fuse from the NAND flash memory 100 (step S401). In step S401, the controller 200 receives information that is the management data stored in the pages PG1 and PG2 in FIG. 63 and including information on good blocks, bad blocks, and sub-bad blocks (defect regions and unusable regions). Step S401 may be carried out in accordance with a request from the controller 200 or may be voluntarily performed by the NAND flash memory 100 without receiving a request from the controller 200 (POR: Power on Read).

The controller 200 stores the management data received from the NAND flash memory 100, for example, in the RAM 220. Then, in accordance with a request from the host apparatus 300, the controller 200 accesses the NAND flash memory 100 (step S402). At this time, based on the management data in the RAM 220, the controller 200 accesses only any of the good blocks and the usable regions included in the blocks with the defect regions and avoids accessing any of the bad blocks and the sub-bad block regions.

As described above in detail, the controller 200 can be configured to avoid accessing any of the sub-bad block regions. This enables a reduction in processing load on the NAND flash memory 100 and further allows changes to the specification to be minimized.

In the above-described embodiments, one block is divided into a plurality of regions in along the direction of stacking memory cells. This is due to the tendency of the occurrence frequency of word line short-circuiting defects to vary along the direction of stacking. That is, in a stack memory, a plurality of interconnects is stacked in a trench, and thus the probability of a word line short-circuiting defect is higher in the lower part than in the upper part. However, the basis for the division of a block is not limited to the direction of stacking but may be set as appropriate according to the status of word line short-circuiting defects.

9. Modifications

As described above, the semiconductor memory device 1 according to the embodiments includes the memory cell array (111 in FIG. 2) which stores data in a non-volatile manner and the controller (140 in FIG. 2) which controls access to the memory cell array. The memory cell array includes the plurality of blocks. Each of the blocks includes: a first selection transistor, a second selection transistor, a plurality of memory cell transistors, a first selection gate line, a second selection gate line, and word lines. The memory cell transistors include a charge accumulation layer and a control gate and are stacked above a semiconductor substrate. The memory cell transistors are connected in series between the first selection transistor and the second selection transistor. The first selection gate line and a second selection gate line are connected to gates of the first selection transistor and the second selection transistor, respectively. The word lines are connected to gates of the respective memory cell transistors. One of the blocks holds information (BWL or BSG in FIG. 11) on a word line, a first selection gate line and/or a second selection gate line including a short-circuiting defect.

The present configuration can remedy the short-circuiting defect between interconnects and improve the efficiency in the use of the memory space in the semiconductor memory device. The embodiments are not limited to those which are described above but may be varied.

In the example described in the embodiments, only either short-circuited word lines or short-circuited selection gate lines are included in one block. However, a plurality of the defects described with reference to FIG. 47 may be included in the block (or string) to be accessed.

Furthermore, in the example described in the embodiments, the management data is written to the ROM fuse. However, in such a configuration as allows the controller 200 to hold management data obtained from tests, the management data need not be written to the ROM fuse. Such a method is suitable for semiconductor devices with the NAND flash memory 100 and the controller 200 integrated together (commercially available products with the NAND flash memory 100 and the controller 200 integrated together).

Furthermore, the page PG2 described in FIG. 11 need not necessarily be handled as a ROM fuse but may be an area secured as a management data-only area separated from the ROM fuse. That is, the information BWL and BSG is not read by POR. However, the area is inhibited from being accessed by the user (host apparatus 300), and only sequentially writing of information by the controller 200 is permitted (erasing is also inhibited). Of course, even in such a case, the information BWL and BSG may be set to be read by POR.

Additionally, in the description of the second embodiments, an access to the NAND flash memory 100 involves the transfer of the information BWL and BSG to the controller 200. According to the present embodiment, the following two methods are possible. A first method is to read BWL and BSG in response to an access instruction from the host apparatus 300 rather than by POR. This method is as described above. A second method is such that the NAND flash memory 100 reads BWL and BSG by POR and holds BWL and BSG in, for example, the register 143 instead of transferring the information to the controller 200. Then, when the controller 200 makes an access request, the NAND flash memory 100 transfers BWL and BSG in the register 143 to the controller 200. Of course, various other methods are available.

Moreover, in the description of the fourth embodiment, the SIN codes are rewritten in order to set the short-circuited interconnects to the same potential. However, the method for setting the short-circuited interconnects to the same potential is not limited to the case where the SIN codes are rewritten. The command sequence for the method is also not limited to the command sequences shown in FIG. 43 and FIG. 44. For example, a new command may be prepared which allows defect addresses to be input so that the controller 200 can input the command and the address indicating a location of short-circuiting to the NAND flash memory 100.

Furthermore, the threshold of the memory cell transistor MT may have a negative value immediately after data is erased from the memory cell transistor MT by drawing electrons out from the charge accumulation layer. In the three-dimensional stack NAND flash memory, the charge accumulation layers in the respective adjacent memory cell transistors are connected together. Thus, when transistor with a negative threshold and a transistor with a positive threshold value are arranged adjacent to each other, charges may be recoupled to corrupt data. Therefore, immediately after erasing, a program operation may be performed to shift the threshold to within a given range with positive values.

Additionally, two possible methods may be used when the host apparatus 300 accesses a bad word line. One of the methods is to inhibit the controller 200 from accessing the NAND flash memory 100. According to the other method, when translating a received logical address into a physical address, the controller 200 translates the logical address into the physical address of a good word line. The difference between these two methods is shown in FIG. 70. FIG. 70 is a diagram showing the word lines and the order of writing accesses to the word lines and illustrating a case of a planar NAND flash memory.

As shown in FIG. 70, without any bad word line, data is written in order from a word line WL(j−1) to a word line WL(j+3) (j is a natural number). If word lines WLj and WL(j+1) are short-circuited and if the controller 200 avoids issuing an instruction to access these word lines WL (the controller 200 is inhibited from issuing the corresponding command), then a word line WL(j+2) is accessed. In contrast, if address translation is carried out, the controller 200, upon receiving an instruction to access the bad word line WLj, translates a logical address corresponding to WLj into a physical address corresponding to WL(j+2). Thus, the word line WL(j+2) is considered to be the word line WLj, which is then accessed. FIG. 71 shows that each of the memory cell transistors holds 3-bit data. The data is written bit by bit. Before data is written to higher bits of a word line WLk (k is a natural number), data is written to lower bits of a word line WL(k−1).

Furthermore, in the three-dimensional stack NAND flash, each word line WL is shared by the plurality of strings within the same block. Thus, as shown in a cross-sectional view of the memory cell array in FIG. 72, the same-potential control is performed not only on the plurality of word lines WL in the selected string but also on the word lines in the unselected strings which are connected to the defective word lines in the selected string.

Figure 73:
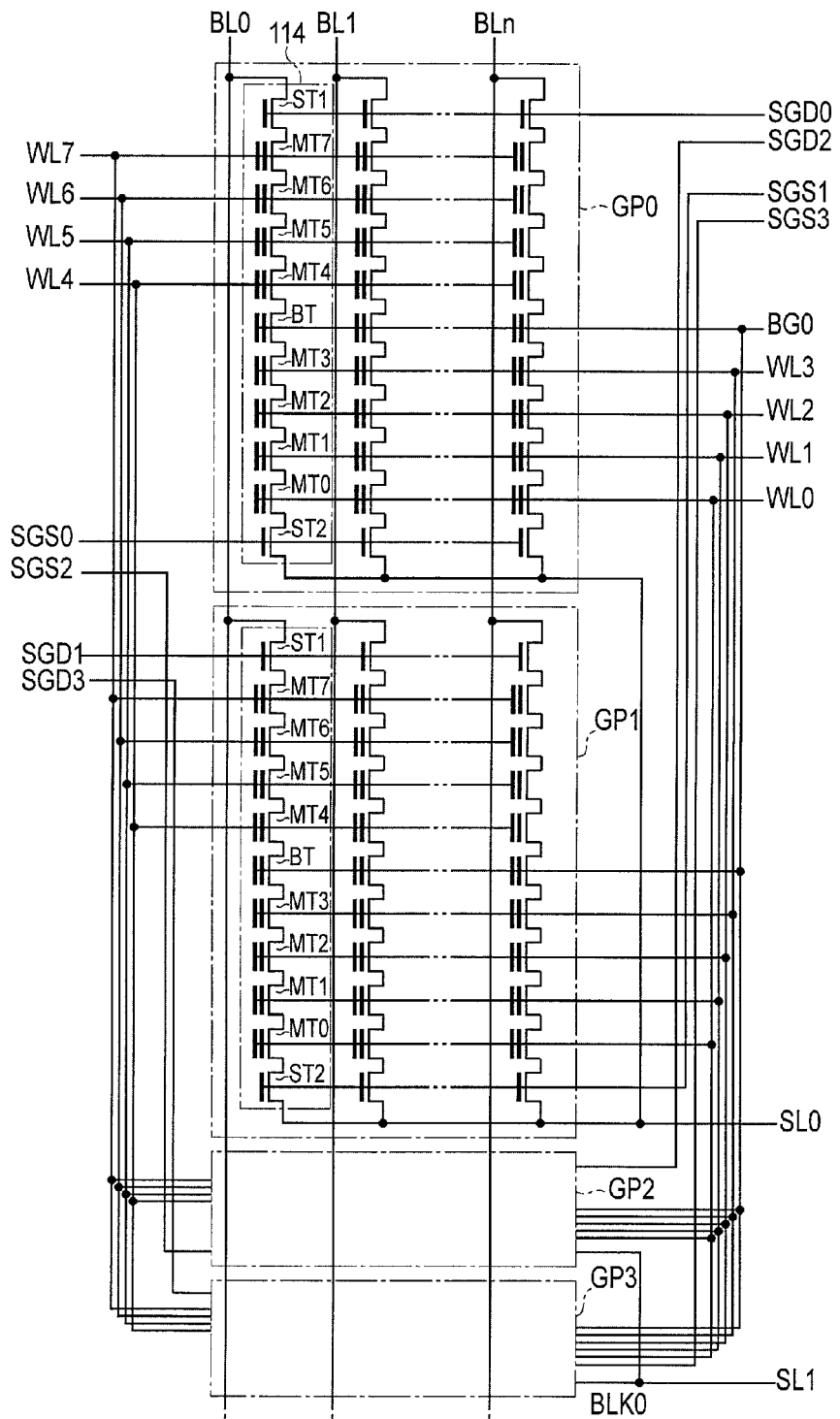
FIG. 73 is a circuit diagram of a memory cell array according to a modification of the first to eighth embodiments.

The memory cell array shown in FIG. 2 may also have an arrangement as shown in FIG. 73. FIG. 73 is a circuit diagram of the block BLK0, and the blocks BLK1 to BLK3 can have the same arrangement. As shown in FIG. 73, the word lines WL0 to WL3, backgate line BG, even-numbered selection gate lines SGD0 and SGD2, and odd-numbered selection gate lines SGS1 and SGS3 are extracted to one side of the memory cell array 111. On the other hand, the word lines WL4 to WL7, even-numbered selection gate lines SGS0 and SGS2, and odd-numbered selection gate lines SGD1 and SGD3 are extracted to the other side of the memory cell array 111, which is opposite to the above-mentioned one side. An arrangement like this is also possible.

In this arrangement, it is possible to divide the row decoder 112 into two row decoders, and arrange them such that they oppose each other with the memory cell array 111 being sandwiched between them. In this arrangement, one row decoder can select the selection gate lines SGD0, SGD2, SGS1, and SGS3, word lines WL0 to WL3, and backgate line BG, and the other row decoder can select the selection gate lines SGS0, SGS2, SGD1, and SGD3, and word lines WL4 to WL7. This arrangement can reduce the complexity of interconnections such as the selection gate lines and word lines in the region (including the row decoder 112) between the driver 144 and memory cell array 111.

Additionally, of course, the values used in connection with data writing, data reading, and data erasing in the above description are illustrative and changeable where appropriate. In addition, in the above-described embodiments, each memory cell transistor MT may hold 1-bit data (2-level data) or at least 2-bit data (4-level data). In addition, the above-described embodiments are applicable not only to the short-circuiting of the word lines, the selection gate line, and the source lines but also to short-circuiting defects in other interconnects if possible.

Moreover, the embodiments have been described taking the three-dimensional stack NAND flash memory as an example of a semiconductor memory device. However, the configuration of the three-dimensional stack NAND flash memory is not limited to the configuration shown in FIG. 3 to FIG. 7 but may be varied. Furthermore, the above-described embodiments are applicable not only to the NAND flash memory but also semiconductor memory devices in general if possible.

Additionally, the steps in the flowcharts described in the embodiments may be reordered if possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory system comprising:
   a memory device including a memory cell array which comprises a plurality of blocks; and
   a controller configured to output a first command and a second command, the controller being configured to output the first command when one of the blocks which includes a short-circuiting defect is accessed, and the controller being configured to output the second command when one of the blocks without a short-circuiting defect is accessed;
   wherein the memory device is configured to perform a read operation when a same voltage is applied to at least two lines including the short-circuiting defect when the memory device receives the first command and a read command.

2. The system according to claim 1, wherein each of the blocks comprises:
   a first selection transistor and a second selection transistor;
   a plurality of memory cell transistors each including a charge accumulation layer and a control gate and stacked above a semiconductor substrate, the memory cell transistors being connected in series between the first selection transistor and the second selection transistor;
   a first selection gate line and a second selection gate line connected to gates of the first selection transistor and the second selection transistor, respectively;
   word lines connected to gates of the respective memory cell transistors; and
   a source line to which one end of a conductive path of a first selection transistor is connected; and
   wherein when the one of the blocks including the short-circuiting defect is accessed, the controller outputs the first command to set interconnects including the short-circuiting defect to an identical potential.

3. The system according to claim 2, wherein the processor, upon accessing the block including the short-circuiting defect, outputs a third command to rewrite a register of the memory device, the third command relating to voltages to be applied to the word lines.

4. The system according to claim 2, wherein when the first selection gate line and the second selection gate line are short-circuited on the one of the blocks, the controller outputs the first command to set the first selection gate line and the second selection gate line to the identical potential.

5. The system according to claim 2, wherein when adjacent ones of the first selection gate lines are short-circuited on the one of the blocks, the controller outputs the first command to set the adjacent ones of the first selection gate lines to the identical potential.

6. The system according to claim 2, wherein when adjacent ones of the second selection gate lines are short-circuited on the one of the blocks, the controller outputs the first command to set the adjacent ones of the second selection gate lines to the identical potential.

7. The system according to claim 2, wherein when adjacent ones of the word lines are short-circuited on the one of the blocks, the controller outputs the first command to set the adjacent ones of the word lines to the identical potential.

8. The system according to claim 2, wherein when the source line and the first selection gate line are short-circuited on the one of the blocks, the controller outputs the first command to set the source line and the first selection gate line to the identical potential.

9. The system according to claim 1, wherein the controller comprises:
   a processor which outputs the read command to access the memory device; and
   a memory unit which holds data.

10. The system according to claim 9, wherein when the memory device is powered on, the controller receives information on the short-circuiting defect from the memory device and the processor outputs a third command to hold the information in the memory unit.

11. The system according to claim 10, wherein the controller determines whether or not any of the blocks includes a defect, and outputs the first command to write the information based on a result of the determination in an area of the memory device which is different from a ROM fuse.

12. The system according to claim 11, wherein the controller outputs a fourth command to erase data from one of the blocks and determines whether or not the defect is present in the one of the blocks based on a status observed when the data is erased.

13. The controller according to claim 11, wherein the memory device is a NAND flash memory, and the controller outputs an inter-word-line leakage check command specified by a NAND interface to determine whether or not the defect is present.

14. The system according to claim 9, wherein when the memory device is powered on, the controller receives information regarding a bad block from the memory device, and
   wherein the processor, upon receiving a request to access the block including the short-circuiting defect, reads information on the short-circuiting defect from the memory device and outputs a third command to hold the information on the short-circuiting defect in the memory unit.

15. A semiconductor memory system comprising:
a memory cell array including a plurality of blocks, each of the blocks including a plurality of memory cell transistors stacked above a semiconductor substrate and connected in series and a plurality of word lines connected to respective gates of the memory cell transistors; and
a controller which controls data access to the memory cell array,
wherein when a word line short-circuiting defect occurs in the block, the controller outputs a first command to divide the word lines in the block into a plurality of regions to manage the blocks.

16. The system according to claim 15, wherein:
the plurality of regions are arranged along a stacking direction of the memory cell transistors,
a region containing no word line with a short-circuiting defect is managed as a good region, and
a region containing a word line with the short-circuiting defect is managed as a defect region.

17. The system according to claim 16, wherein the controller outputs a second command to data-access the good region, and to avoid data-accessing the defect region.

18. The system according to claim 17, further comprising a ROM fuse which stores information on the defect region in a nonvolatile manner, wherein the controller outputs a third command to use the information stored in the ROM fuse to control voltages of the word lines so as to set the defect region to an unselected state.

19. The system according to claim 18, wherein the controller outputs the third command to use the information on the defect region read from the ROM fuse and to avoid accessing the defect region.

20. The system according to claim 19, further comprising a memory unit which stores the information on the defect region.

\* \* \* \* \*